United States Patent
LaRoche et al.

(10) Patent No.: US 10,224,285 B2
(45) Date of Patent: Mar. 5, 2019

(54) NITRIDE STRUCTURE HAVING GOLD-FREE CONTACT AND METHODS FOR FORMING SUCH STRUCTURES

(71) Applicant: Raytheon Company, Waltham, MA (US)

(72) Inventors: Jeffrey R. LaRoche, Austin, TX (US); Eduardo M. Chumbes, Andover, MA (US); Kelly P. Ip, Lowell, MA (US); Thomas E. Kazior, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/438,148

(22) Filed: Feb. 21, 2017

(65) Prior Publication Data

US 2018/0240753 A1    Aug. 23, 2018

(51) Int. Cl.
*H01L 29/20* (2006.01)
*H01L 29/45* (2006.01)
(Continued)

(52) U.S. Cl.
CPC .......... *H01L 23/535* (2013.01); *H01L 21/324* (2013.01); *H01L 21/76895* (2013.01);
(Continued)

(58) Field of Classification Search
CPC .. H01L 23/535; H01L 23/5226; H01L 23/528
See application file for complete search history.

(56) References Cited

U.S. PATENT DOCUMENTS

| 5,698,870 A | 12/1997 | Nakano et al. |
| 5,770,489 A | 6/1998 | Onda |

(Continued)

FOREIGN PATENT DOCUMENTS

| EP | 0 789 387 A1 | 8/1997 |
| EP | 2894679 A1 | 7/2015 |

(Continued)

OTHER PUBLICATIONS

Malmros et al., "Electrical properties, microstructure, and thermal stability of Ta-based ohmic contacts annealed at low temperature for GaN HEMTs", Mar. 31, 2011, IOP Publishing, pp. 1-7; 8 pages.
(Continued)

*Primary Examiner* — Amar Movva
(74) *Attorney, Agent, or Firm* — Daly, Crowley, Mofford & Durkee, LLP

(57) ABSTRACT

A semiconductor structure having a Group III-N semiconductor layer disposed on a substrate. A multi-layer, electrical contact structure in contact with the Group III-N semiconductor layer includes a gold-free contact layer in contact with the Group III-N semiconductor layer; and a gold-free electrically conductive etch stop layer electrically connected to the gold-free contact layer. An electrically conductive via passes through the substrate to the etch stop layer. The structure includes a plurality of electrode structures, each one providing a corresponding one of a source electrode structure, drain electrode structure and a gate electrode structure. The source electrode structure, drain electrode structure and gate electrode structure include: an electrical contact structure and an electrode contact. The electrode contacts have the same gold-free structure and have coplanar upper surfaces.

4 Claims, 44 Drawing Sheets

(51) Int. Cl.
| | |
|---|---|
| *H01L 21/324* | (2006.01) |
| *H01L 21/768* | (2006.01) |
| *H01L 23/522* | (2006.01) |
| *H01L 23/528* | (2006.01) |
| *H01L 23/532* | (2006.01) |
| *H01L 23/535* | (2006.01) |
| *H01L 29/417* | (2006.01) |

(52) U.S. Cl.
CPC ...... *H01L 21/76898* (2013.01); *H01L 23/528* (2013.01); *H01L 23/5226* (2013.01); *H01L 23/53214* (2013.01); *H01L 23/53271* (2013.01); *H01L 29/2003* (2013.01); *H01L 29/4175* (2013.01); *H01L 29/452* (2013.01)

(56) References Cited

U.S. PATENT DOCUMENTS

| | | |
|---|---|---|
| 5,869,364 A | 2/1999 | Nakano et al. |
| 5,940,694 A | 8/1999 | Bozada et al. |
| 6,225,211 B1 | 5/2001 | Tsui |
| 6,611,002 B2 | 8/2003 | Weeks et al. |
| 6,876,078 B2 | 4/2005 | Kim et al. |
| 6,919,639 B2 | 7/2005 | Ho et al. |
| 7,102,235 B2 | 9/2006 | Raaijmakers et al. |
| 7,196,005 B2 | 3/2007 | Ho |
| 7,233,028 B2 | 6/2007 | Weeks et al. |
| 7,244,645 B2 | 7/2007 | Kim et al. |
| 7,420,227 B2 | 9/2008 | Chang et al. |
| 7,528,493 B2 | 5/2009 | Yang et al. |
| 7,781,886 B2 | 8/2010 | Trezza et al. |
| 7,851,831 B2 | 12/2010 | Koyama et al. |
| 7,863,189 B2 | 1/2011 | Basker et al. |
| 8,089,093 B2 | 1/2012 | Matsumura et al. |
| 8,222,672 B2 | 7/2012 | Kanamura et al. |
| 8,253,170 B2 | 8/2012 | Lahreche |
| 8,404,508 B2 | 3/2013 | Lidow et al. |
| 8,466,555 B2 | 6/2013 | Chelakara et al. |
| 8,471,256 B2 | 6/2013 | Yamazaki et al. |
| 8,492,261 B2 | 7/2013 | Van Hove et al. |
| 8,507,920 B2 | 8/2013 | Chen et al. |
| 8,686,562 B2 | 4/2014 | Jordan |
| 8,748,303 B2 | 6/2014 | Mizuno |
| 8,841,703 B2 | 9/2014 | Wong et al. |
| 8,853,749 B2 | 10/2014 | Lidow et al. |
| 8,890,168 B2 | 11/2014 | Lidow et al. |
| 8,896,025 B2 | 11/2014 | Koyama |
| 8,912,570 B2 | 12/2014 | Chiang et al. |
| 9,040,398 B2 | 5/2015 | Saxler et al. |
| 9,048,305 B2 | 6/2015 | Shih et al. |
| 9,117,755 B2 | 8/2015 | Mizuno |
| 9,218,964 B2 | 12/2015 | Wang et al. |
| 9,236,464 B2 | 1/2016 | Chiang et al. |
| 9,269,784 B2 | 2/2016 | Yang et al. |
| 9,281,370 B2 | 3/2016 | Nishi |
| 9,478,508 B1 | 10/2016 | LaRoche et al. |
| 9,490,209 B2 | 11/2016 | Sung et al. |
| 2002/0142531 A1 | 10/2002 | Hsu et al. |
| 2008/0006846 A1 | 1/2008 | Ikeda et al. |
| 2010/0283083 A1 | 11/2010 | Niiyama et al. |
| 2010/0308380 A1 | 12/2010 | Rothwell et al. |
| 2011/0049720 A1 | 3/2011 | Jordan |
| 2011/0248283 A1 | 10/2011 | Cao et al. |
| 2011/0272742 A1 | 11/2011 | Akiyama et al. |
| 2012/0139084 A1 | 6/2012 | Hagleitner et al. |
| 2012/0217591 A1 | 8/2012 | Kamada |
| 2012/0305931 A1 | 12/2012 | Chelakara et al. |
| 2013/0181349 A1* | 7/2013 | Koyama ............... H01L 23/481 257/741 |
| 2013/0214364 A1 | 8/2013 | Jagannathan et al. |
| 2013/0248873 A1 | 9/2013 | Kuraguchi et al. |
| 2013/0252410 A1 | 9/2013 | Wenxu et al. |
| 2013/0288401 A1 | 10/2013 | Matsuura et al. |
| 2013/0299842 A1 | 11/2013 | Prechtl et al. |
| 2014/0089609 A1* | 3/2014 | Kegel ............... H01L 23/49827 711/154 |
| 2014/0183739 A1 | 7/2014 | Li et al. |
| 2015/0364330 A1 | 12/2015 | Chen et al. |
| 2016/0071791 A1 | 3/2016 | Huang et al. |
| 2016/0079066 A1 | 3/2016 | Takada et al. |
| 2016/0233325 A1 | 4/2016 | Bera et al. |
| 2016/0225857 A1 | 8/2016 | Saito et al. |
| 2016/0225875 A1 | 8/2016 | Nishi |
| 2016/0268194 A1 | 9/2016 | Yu et al. |
| 2016/0276161 A1 | 9/2016 | Chen et al. |
| 2016/0380090 A1 | 12/2016 | Roberts et al. |

FOREIGN PATENT DOCUMENTS

| | | |
|---|---|---|
| EP | 2 996 155 A1 | 3/2016 |
| WO | WO 2005/022639 A2 | 3/2005 |
| WO | WO 2005/093868 A1 | 10/2005 |
| WO | WO 2008/120094 A2 | 10/2008 |
| WO | WO 2010/118087 A1 | 10/2010 |
| WO | WO 2016/054545 A1 | 4/2016 |
| WO | WO 2016/170978 A1 | 10/2016 |

OTHER PUBLICATIONS

U.S. Appl. No. 15/438,196, filed Feb. 21, 2017, LaRoche et al.
Yao Jing-Neng et al: An Au-Free GaN High Electron Mobility Transistor with Ti/Al/W Ohmic Metal Structure, IEEE 22$^{nd}$ International Symposium on the Physical and Failure Analysis of Integrated Circuits, Jun. 29, 2015, pp. 419-422, 4 pages.
Smith R. Peter et al, AlGaN/GaN-on-SiC HEMT Technology Status, Compound Semiconductor Integrated Circuits Symposium, IEEE, Oct. 12, 2008, pp. 1-4, 4 pages.
Invitation to Pay Additional Fees, PCT/US2018/017896, Apr. 26, 2018, 15 pages.
Invitation to Pay Additional Fees, PCT/US2018/017895, Apr. 26, 2018, 16 pages.
Notification of Transmittal of the International Search Report and the Written Opinion of the International Searching Authority, PCT/US2018/017896, dated Jun. 18, 2018, 1 page.
International Search Report, PCT/US2018/017896, dated Jun. 18, 2018, 7 pages.
Written Opinion of the International Searching Authority, PCT/US2018/017896, dated Jun. 18, 2018, 11 pages.
Taiwan Office Action (with English Translation) dated Oct. 4, 2018, for Taiwan Application No. 107105217; 9 Pages.
PCT Notification of Transmittal of the International Search Report and Written Opinion of the International Searching Authority dated Jun. 18, 2018 for PCT/US2018/017895; 1 Page.
PCT International Search Report dated Jun. 18, 2018 for PCT/US2018/017895; 7 Pages.
PCT Written Opinion of the International Searching Authority dated Jun. 18, 2018 for PCT/US2018/017895; 15 Pages.

* cited by examiner

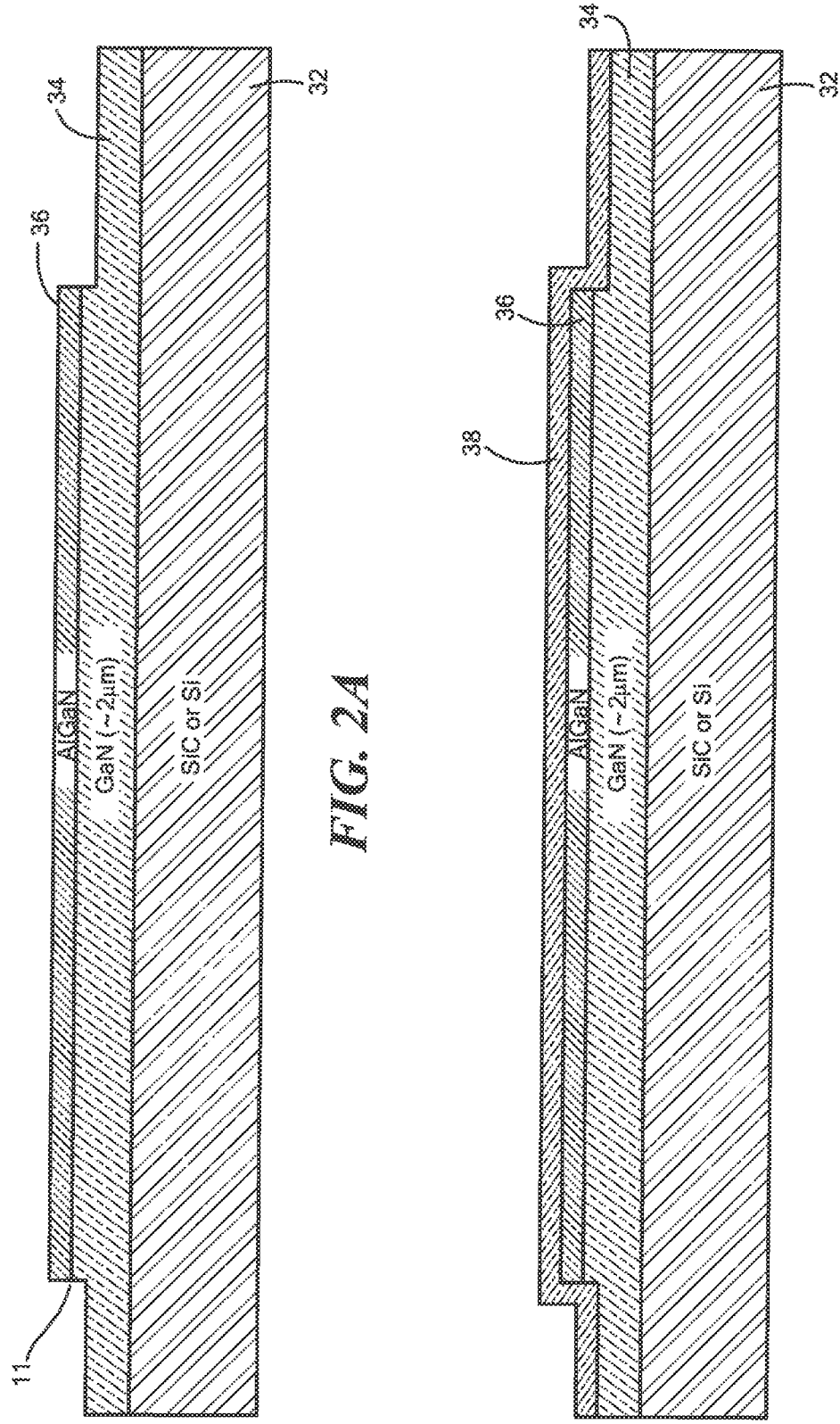

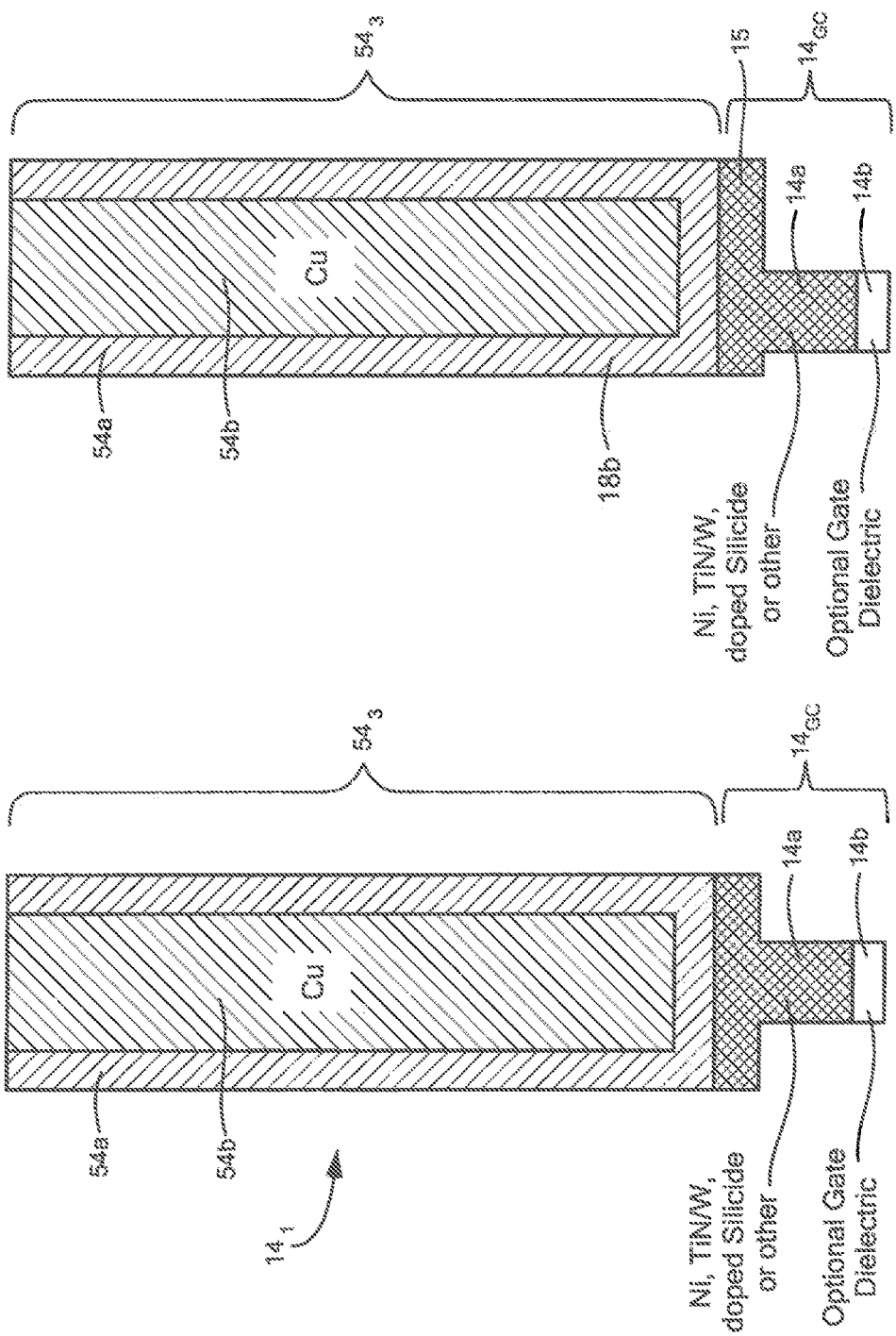

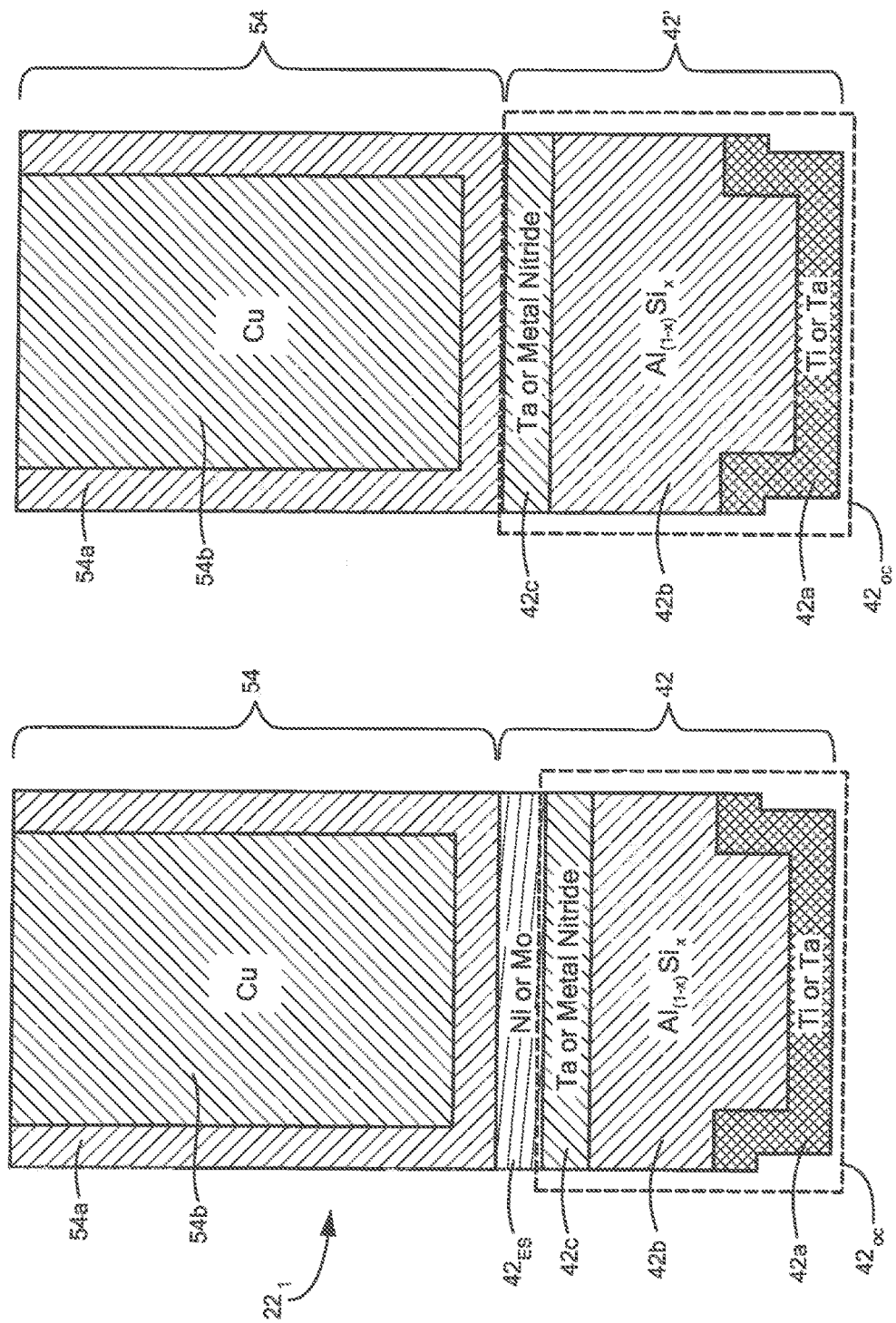

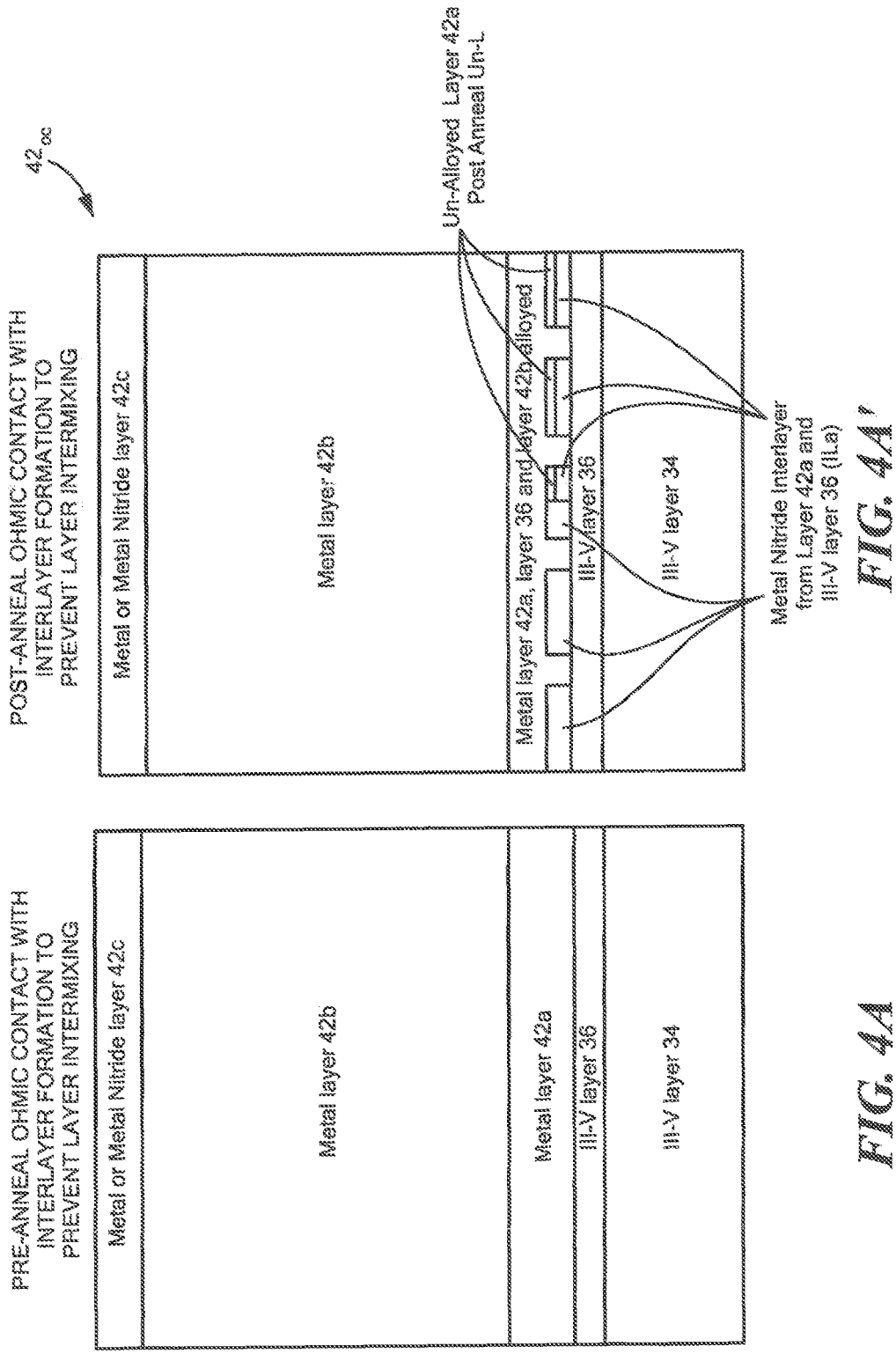

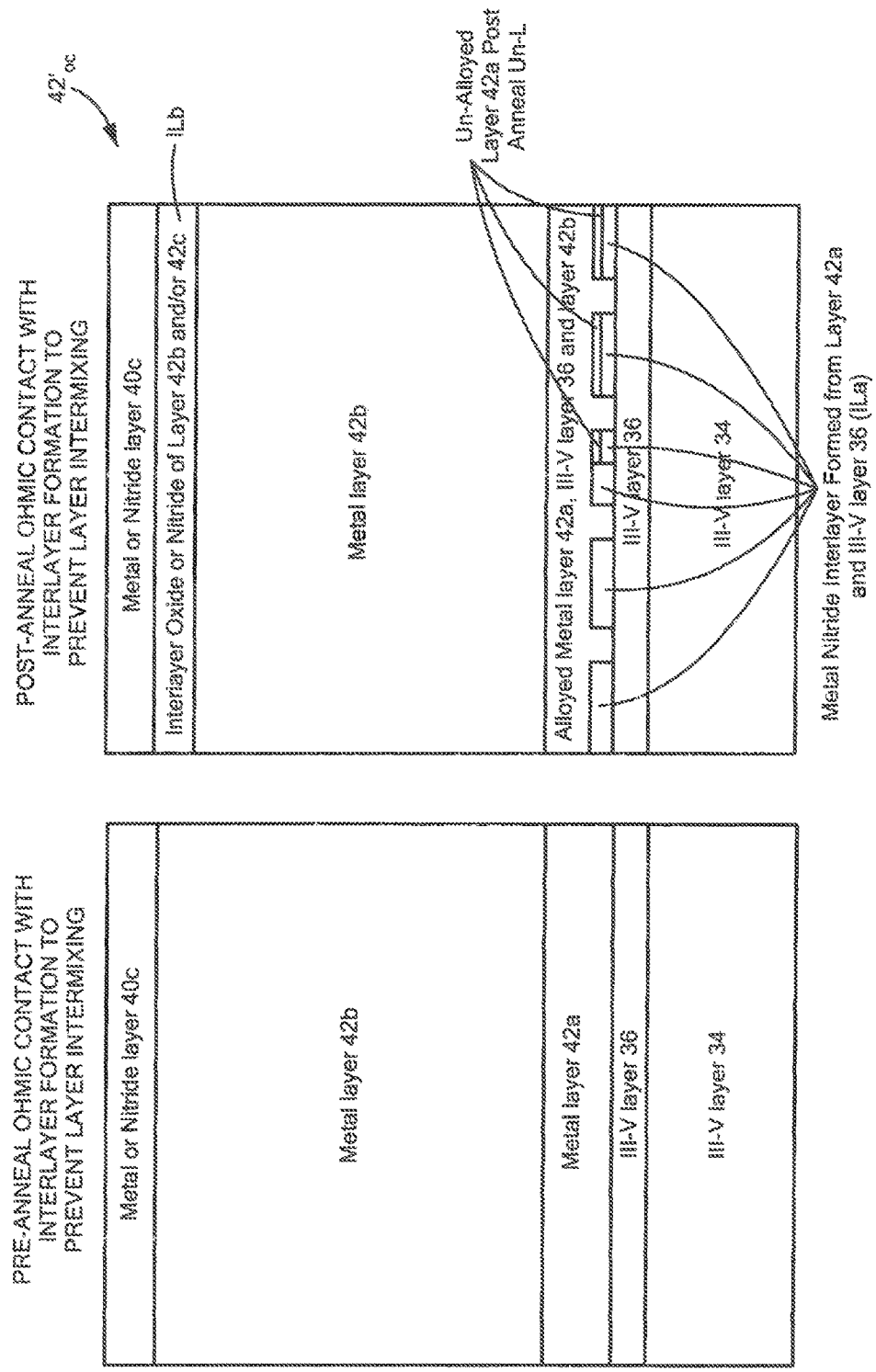

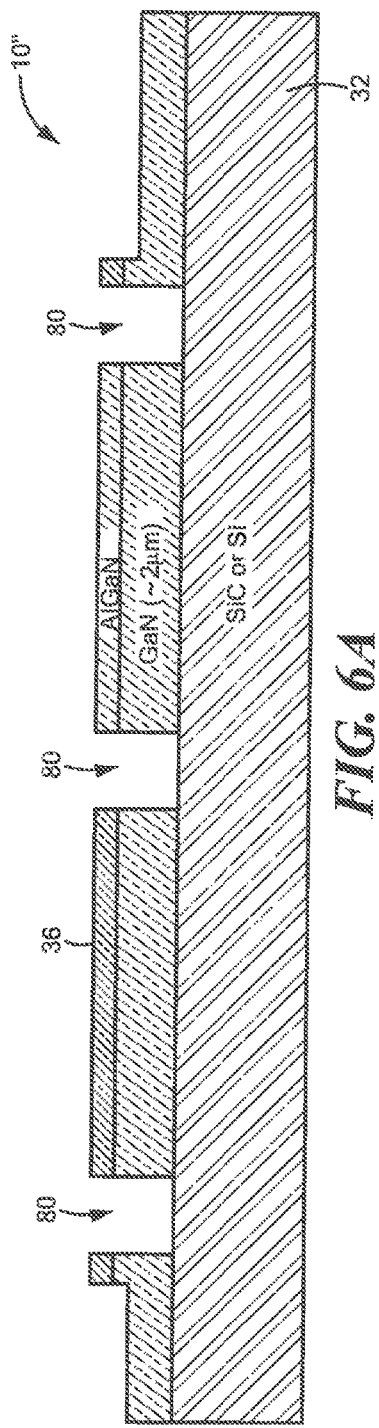
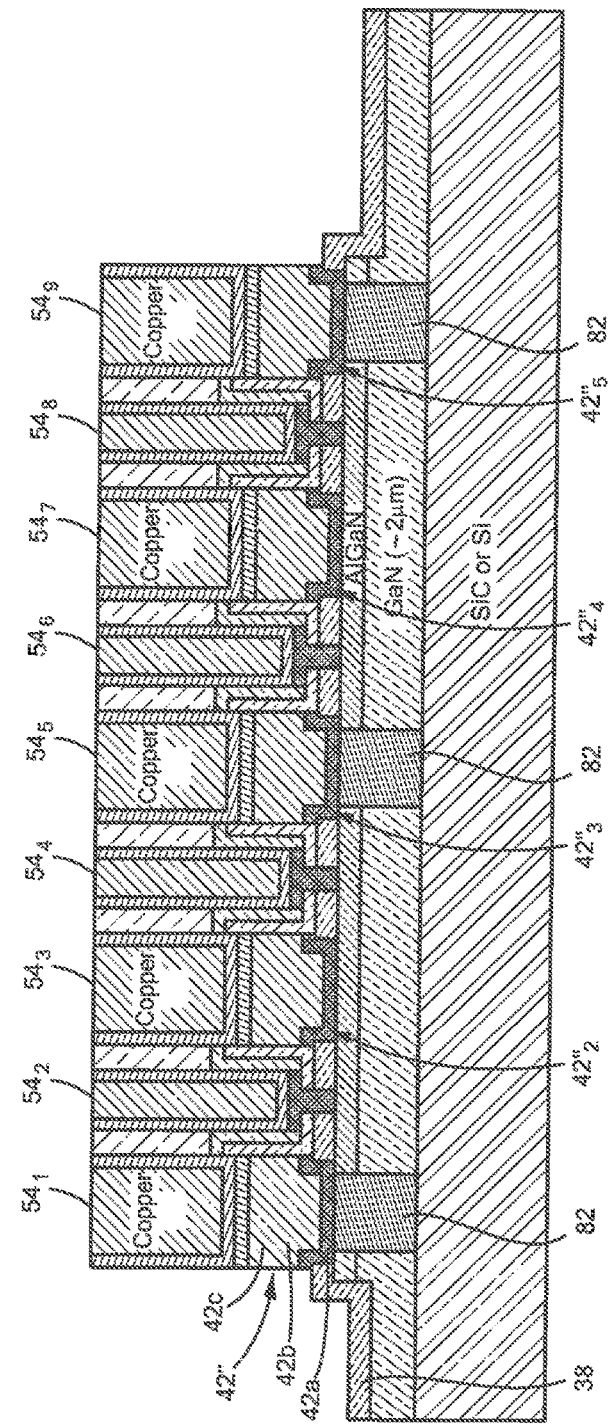
FIG. 6A
FIG. 6B

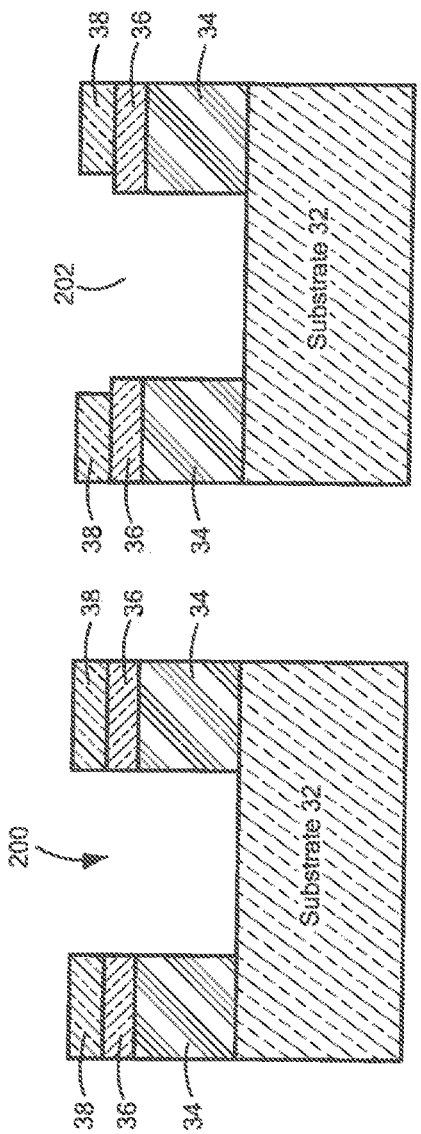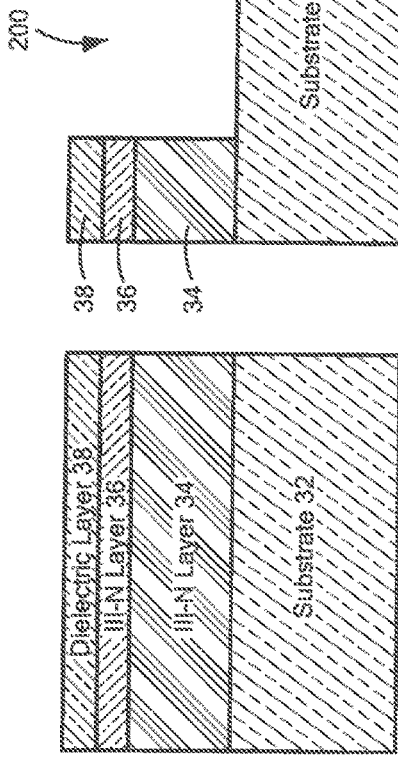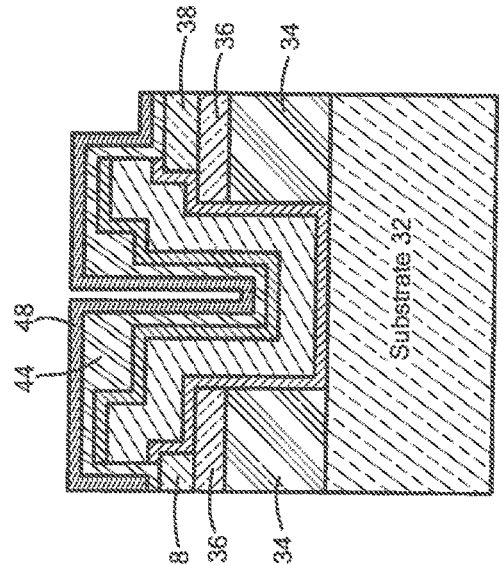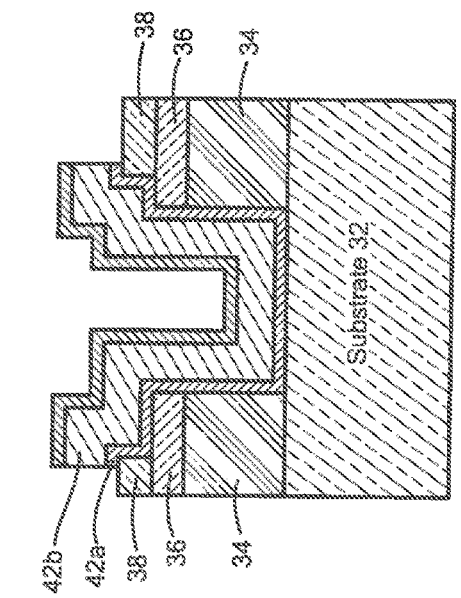
FIG. 9A  FIG. 9B  FIG. 9C  FIG. 9D  FIG. 9E

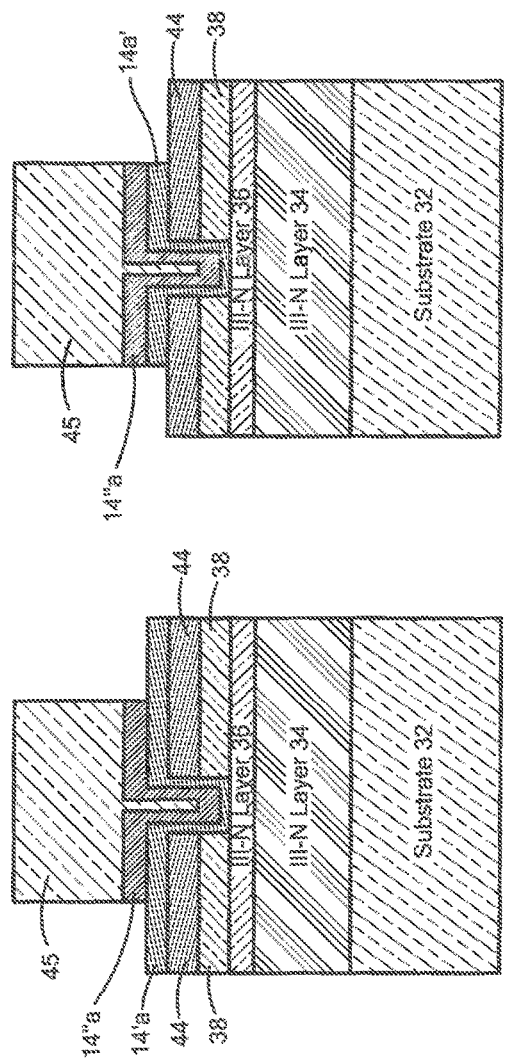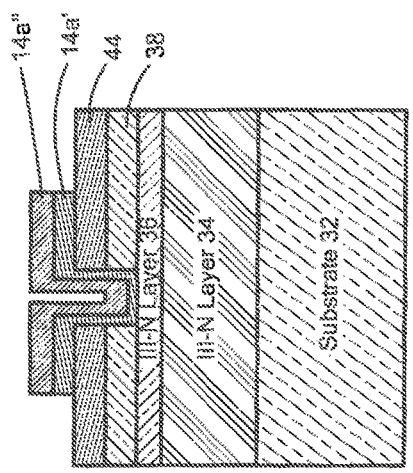

NITRIDE STRUCTURE HAVING GOLD-FREE CONTACT AND METHODS FOR FORMING SUCH STRUCTURES

TECHNICAL FIELD

This disclosure relates generally to a structure having a gold-free electrical contact structure in contact with an upper surface of a Nitride.

BACKGROUND

As is known in the art, many monolithic microwave integrated circuits (MMICs) having Group III-Nitride semiconductors, sometimes referred to as nitride semiconductors, such as for example, gallium nitride-based (AlGaN/GaN) high electron mobility transistors (HEMTs), are increasingly being used for high-frequency and high-power applications. Group III-Nitride are herein after sometimes also referred to as Group III-N which includes, for example, binaries InN, GaN, AlN, their ternary alloys such as $Al_xGa_{1-x}N$ (AlGaN) alloys and other nitrogen based alloys.

In order to realize the potential of these HEMT devices it is necessary to achieve low-resistance, good edge acuity and reliable metal to metal contacts, and metal to semiconductor Ohmic contacts. Most Group III-N foundry metal to metal and metal to semiconductor low resistance Ohmic contacts use gold (Au) to reduce sheet resistance (for transmission lines and Ohmic contacts) and to decrease oxidation during the high temperature anneal required to achieve the lowest metal to semiconductor Ohmic contact resistance to active devices.

As is also known, in many Monolithic Microwave Integrated Circuits (MMICs) and other integrated circuits (ICs), electrical connection is made to the bottom of the MMIC for both ground and electrical signals to mounted chips, these connections are made through electrically conductive vias passing through the substrate and/or a semiconductor epitaxial layer on at least a portion of the substrate to electrical contacts that connect the vias to a metallization on the wafer; sometimes referred to as a front-side metallization.

Traditionally, Group III-N HEMT MMICs and devices are fabricated by liftoff-based processing in III-V foundries. Recently, however, Group III-N HEMTs have begun to be fabricated using high yield silicon (Si) like, Au-free, subtractive processing techniques in Si CMOS foundry environments. More particularly, a "lift-off" process is where a mask has a window to expose a selected portion of a surface where a material is to be deposited. The material is deposited onto the mask with a portion of the material passing through the window onto the exposed selected portion of the surface. The mask is lifted off the surface with a solvent along with portion of the material on the mask (the unwanted portion of the deposited material) while leaving the desired portion of the material on the exposed selected portion of the surface. A "subtractive" process is where a material is first deposited over the entire surface. Then a mask is formed to cover only over a selected portion of the deposited material (the portion which is to remain after the processing); the unwanted portions of the deposited material being exposed. An etchant is then brought into contact with the mask thereby removing the exposed unwanted portion while the mask prevents the etchant from removing the covered desired portion of the material.

Relative to Si CMOS foundries, it is well known that the yield and cost of III-V compound semiconductor devices and circuits (processed in traditional III-V foundries) has long been limited by low wafer volumes, increased substrate handling during processing, the widespread use of liftoff-based processing techniques to define metal lines, and the use of time consuming electron beam lithography for sub 500 nm gate lithography. The Si CMOS foundry environment on the other hand has the benefit of high wafer volumes, large wafer diameters ($\geq$200 mm), highly automated cassette to cassette wafer fabrication or processing tools, subtractive processing techniques, advanced optical lithography cluster tools and techniques (capable of defining sub 100 nm features), and the Moore's law paradigm that drives both equipment development and technology node development.

However, as noted previously, to take advantage of the benefits of the Si foundry infrastructure and background Si CMOS wafer volumes, the developed Group III-N processes have to be Au-free. Gold is a deep level trap dopant in Si. Therefore, Au is not allowed in the front end or back end of Si CMOS foundry fabrication lines as it is a serious contamination concern that can cause catastrophic yield problems.

Gold free processing of GaN (or other III-V) device wafers in Si foundry environments therefore requires the use of Si foundry back end of line (BEOL) compatible metallizations such as aluminum (Al) or copper (Cu). Copper is the most attractive of these metals to use as it has superior electrical conductivity and electro-migration resistance. However, because of the lack of volatile copper dry etch byproducts, copper cannot readily be subtractively patterned by the techniques of photolithography wherein photoresist masking and plasma etching have been used with great success with aluminum. To process copper, the Damascene process (which is also subtractive), was developed. In the Cu Damascene process, a host insulator material for the copper, typically an underlying insulating layer (usually silicon dioxide), is patterned with open trenches where the copper is to be formed. A thick coating of copper that significantly overfills the trenches is deposited on the insulating layer, and chemical-mechanical planarization (CMP) is used to remove the excess copper that extends above the top of the insulating layer. Cu filled within the trenches of the insulating layer is not removed and becomes the patterned conductive interconnect.

As is also known in the art, while Cu is manageable, it also poses its own contamination risk for Si foundries. Barrier layers should completely surround all copper interconnections, since diffusion of copper into surrounding materials would degrade their properties. Typically, the trenches are lined with thin tantalum (Ta) and/or tantalum nitride (TaN) metal layers (as part of the Ta/TaN/Cu plating seed metal stack) to act as diffusion barriers along the bottom and sides of the Cu metal interconnects. At post Cu CMP the top of the interconnect metal is coated with $SiN_x$ to act as the top interface diffusion barrier, to prevent oxidation during interlayer oxide deposition, and to act as a stop etch layer (during the trench etch of the silicon dioxide) for additional interconnect formation. Additional process complications arise, however, when back to front side metal interconnects are facilitated by through-wafer or through-semiconductor layer vias that require a chlorine-(or other oxidizer) based etches to form these vias. The chloride-based etch by-products are nonvolatile and the etch process results in a degraded Cu interfacial surface.

SUMMARY

In accordance with the disclosure, a semiconductor structure is provided having: a substrate; a Group III-N semiconductor layer disposed on the substrate; and a multi-layer, electrical contact structure in contact with the Group III-N semiconductor layer. The electrical contact structure comprises: a gold-free contact layer in contact with the Group III-N semiconductor layer; and a gold-free electrically conductive etch stop layer electrically connected to the gold-free contact layer. An electrically conductive via passing through the substrate to the etch stop layer.

In one embodiment, the multi-layer, electrical contact structure comprises an aluminum-based layer disposed over the gold-free contact layer.

In one embodiment, the gold-free contact layer is in direct contact with the Group III-N semiconductor layer and wherein the gold-free contact layer and the aluminum-based layer have physical annealing properties enabling annealing with the Group III-N semiconductor layer at a temperature less than 660 degrees to form an Ohmic contact with the Group III-N semiconductor layer.

In one embodiment, an electrode contact is electrically connected to the multi-layer electrical contact structure and the multi-layer, electrical contact structure and the electrode contact provide a source, drain or gate electrode structure.

In one embodiment the electrode contact is a gold-free electrode contact.

In one embodiment, a method is provided for forming a semiconductor structure. The method includes: providing a substrate with a Group III-N semiconductor layer disposed on the substrate; forming a multi-layer, electrical contact structure in contact with the Group III-N semiconductor layer, the electrical contact structure, comprising: a gold-free contact layer in contact with the Group III-N semiconductor layer; and a gold-free electrically conductive etch stop layer electrically connected to the contact layer; and, forming an electrically conductive via passing through the substrate to the etch stop layer.

In one embodiment, the contact layer is formed in direct contact with the Group III-N semiconductor layer and wherein the contact layer and the aluminum-based layer are annealed at a temperature less than 660 degrees to form an Ohmic contact with the Group III-N semiconductor layer.

In one embodiment, a semiconductor structure is provided having: a Group III-N semiconductor layer; and an electrical contact structure comprises a metal silicide, the metal nitride being in Ohmic contact with the Group III-N semiconductor layer.

In one embodiment, a method is provided for forming an electrically conductive Ohmic contact in contact with a group III-N layer, comprising: forming an Ohmic contact between the electrical contact structure and a Group III-N semiconductor layer, comprising: forming a metal nitride between a first metal of the electrical contact structure and the Group III-N semiconductor layer and diffusing a second metal of the electrical contact structure into the first metal and to an upper surface of the Group III-N semiconductor layer including: preventing intermixing with a third metal or metal nitride of the electrical contact.

In one embodiment, the intermixing preventing comprises: forming and annealing the first and second metals of the electrical contact structure during Ohmic contact formation prior to deposition of the third metal or metal nitride of the Ohmic contact.

In one embodiment, the intermixing preventing comprises: forming a partially oxidized interlayer between the second metal and third metal or a metal nitride of the electrical contact structure during the electrical contact metal deposition process.

In one embodiment, the intermixing preventing comprises: forming the third metal as a metal nitride during the electrical contact structure metal deposition process.

In one embodiment, a semiconductor structure is provided, comprising: a substrate; a Group III-N layer on a upper surface of the substrate, the Group III-N layer having a window passing through the Group III-N layer to the upper surface of the substrate; and a contact structure disposed in the window, on the upper surface of the substrate and in Ohmic contact with the Group III-N layer.

In one embodiment, a semiconductor structure is provided, comprising: a substrate; a Group III-N layer on a upper surface of the substrate, the Group III-N layer having a window passing through the Group III-N layer to the upper surface of the substrate, such window exposing sidewall of the Group III-N layer; and a contact structure disposed in the window and in Ohmic contact with the exposed sidewalls of the Group III-N layer.

In one embodiment, the etch stop layer comprises aluminum, nickel, molybdenum, platinum, or aluminum.

In one embodiment, the electrical contact structure a two or more layer stack of Al with Ta, Ti, TiN, Pt, Ni, Si, AlSi, W, or Mo.

In one embodiment, the electrical contact structure comprises a metal silicide.

In one embodiment, the electrical contact structure comprises the metal silicide is $CoSi_2$ or NiSi.

In one embodiment, the metal silicide is recessed within the Group III-N semiconductor layer.

In one embodiment, a semiconductor structure is provided having, comprising: a Group III-N semiconductor layer; a source structure and a drain electrical contact electrode structure in Ohmic contact with the Group III-N semiconductor layer; a gate electrode structure, disposed between the source electrode structure and the drain electrode structure, in contact with the Group III-N semiconductor layer; and wherein each source electrode structure, drain electrical contact electrode structure and gate electrode structure comprising: an electrical contact structure and an electrode contact on the electrical contact structure, each electrode contact being of like-material.

In one embodiment, the electrode contact is a gold-free electrically conductive material.

In one embodiment, each one of the electrode contacts comprises: a liner and a gold-free electrically conductive material disposed on the liner.

In one embodiment, the electrode contacts have co-planar upper surfaces.

In one embodiment, a semiconductor structure is provided, comprising: a Group III-N semiconductor layer; a source electrode structure and a drain electrode structure in Ohmic contact with the Group III-N semiconductor layer; a gate electrode structure, disposed between the source electrode structure and the drain electrode structure, in contact with the Group III-N semiconductor layer; and wherein each source electrode structure, drain electrode structure and gate electrode structure comprising: an electrical contact structure and an electrode contact on the electrical contact structure, the electrode contacts having co-planar upper surfaces.

In one embodiment, each one of the electrode contacts comprises a gold-free electrically conductive material.

In one embodiment, a method is provided for forming a semiconductor structure, comprising: providing a Group III-N semiconductor layer having source and drain electrical contact structures in Ohmic contact with the Group III-N semiconductor layer and a gate electrical contact structure, disposed between source and drain electrical contact structures, in contact with the Group III-N semiconductor layer, and simultaneously forming a plurality of electrode contacts, each one of the plurality of electrode contacts being formed on, and electrically connected to, a corresponding one of the source and drain electrical contact structure and the gate electrical contact structure.

In one embodiment, a method is provided for forming a semiconductor structure, comprising: providing a Group III-N semiconductor layer; and forming a gate electrode on with the Group III-N semiconductor layer, the gate electrode comprising: a plurality of layer, such layers comprising a single material or plurality of materials, such material including: nickel (Ni), titanium nitride (TiN), nickel/tantalum nitride (Ni/TaN), nickel/tantalum (Ni/Ta), nickel/tantalum/tantalum nitride (Ni/Ta/TaN), nickel/molybdenum, (Ni/Mo), titanium nitride/tungsten (TiN/W), or a doped metal silicide; wherein the gate electrode forming comprises etching one of more of the plurality of layers comprising: titanium nitride (TiN), titanium nitride/tungsten (TiN/W), or a doped metal silicide with a dry etchant comprising: chlorine or fluorine-based etches or a combination thereof.

In one embodiment, the gate electrode forming comprises etching one of more of the plurality of layers comprising: nickel/tantalum nitride (Ni/TaN), nickel/tantalum (Ni/Ta), nickel/tantalum/tantalum nitride (Ni/Ta/TaN) with a wet etch.

With such arrangements, silicon foundry compatible, subtractively patterned through substrate via (TSV) etch stop metal layers are placed on the front side of the wafer between the front side gold-free metal interconnect contact structure and the back-side etched via. Metals such as nickel or molybdenum or platinum are used as the etch stop layer for chlorine-based back-side via etches, while aluminum can act as an etch stop for fluorine-based etches. These metal etch stop layers are as thin as possible in order to mitigate negative impact on the front to back-side resistance of the interconnect contact structure.

In one embodiment, the electrical contact structure includes the electrically conductive etch stop layer disposed above the third metal layer (the layer that prevents intermixing) of the electrical contact structure. In this embodiment, after front-side processing and back-side wafer thinning, back-side via holes are formed using chemical dry etching with a two-step etch process that terminates on the electrically conductive etch stop layer. In the first step of the via hole etch process, via holes are formed in the exposed portions of the bottom of the substrate using a dry fluorine-based etch. This fluorine-based etch stops selectively on Group III-N layers. In the second step, the bottom surface of the exposed Group III-N layer in the via hole is exposed to a dry chlorine-based etch. This chlorine-based back-side via hole dry etch continues the via hole etching through the Group III-N layers and the electrical contact structure and terminates on the conductive etch stop layer of the electrical contact structure metal.

In one embodiment one of the first three metals of the electrical contact structure is also the electrically conductive etch stop layer and the chemical etching comprises forming the via hole with a single fluorine-based etchant through the substrate and a dielectric layer. In this embodiment, prior to electrical contact structure deposition, the Group III-N material is etched selectively to the substrate to form openings (apertures) in the Group III-N material wherein the via holes are to be formed. The apertures are then filled with a dielectric material that can be etched in fluorine-based chemistries just as the substrate. The electrical contact structure, one of whose first three layers includes an etch stop layer to fluorine-based chemistries, is then deposited and the remainder of front-side processing continues. As a result, during back-side processing, a single fluorine-based dry etch can be used to etch via holes selectively through the substrate and aperture dielectric to the etch stop layer embedded within electrical contact structure.

In one embodiment one of the first three metals of the electrical contact structure is also the electrically conductive etch stop layer and the chemical etching comprises forming the via hole with a single fluorine-based etchant through the substrate layer. In this embodiment, prior to electrical contact structure deposition, the Group III-N material is etched selectively to the substrate to form openings (apertures) in the Group III-N material wherein the via holes are to be formed. The electrical contact structures are then deposited into the apertures (therefore directly contacting the substrate at the bottom of the apertures) and the remainder of front-side processing continues. As a result, during back-side processing, a single fluorine-based dry etch can be used to etch via holes selectively through the substrate to the etch stop layer embedded within electrical contact structure.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 3A is a diagrammatical, cross-sectional sketch of an exemplary one of a plurality of gate electrode structures used in the structure of FIGS. 2A through 2T according to the disclosure;

FIG. 3A' is a diagrammatical, cross-sectional sketch of another embodiment of an exemplary one of a plurality of gate electrode structures which may be used in the structure of FIGS. 2A through 2T;

FIG. 3B is a diagrammatical, cross-sectional sketch of an exemplary one of a plurality of electrodes used as source and drain electrode structures in the structure of FIGS. 2A through 2U according to the disclosure;

FIG. 3B' is a diagrammatical, cross-sectional sketch of an exemplary one of a plurality of electrode structures used as source and drain electrode structures in the structure of FIGS. 2A through 2U according to another embodiment of the disclosure;

FIGS. 4A and 4A' is a pair of diagrammatical cross sectional sketches useful in understanding a low temperature anneal process used in forming the semiconductor structure according to the disclosure;

FIGS. 4B and 4B' is a pair of diagrammatical cross sectional sketches useful in understanding a another low temperature anneal process used in forming the semiconductor structure according to the disclosure;

FIG. 5B' is a diagrammatical, cross-sectional sketch showing an enlarged portion of FIG. 5B, such portion being encircled by the arrow 5B'-5B' in FIG. 5B;

FIG. 5A' is a diagrammatical, cross-sectional sketch of a semiconductor structure according to another embodiment of the disclosure;

FIGS. 6A-6D are diagrammatical, cross-sectional sketches at various stages in the fabrication of a semiconductor structure according to another embodiment of the disclosure;

FIG. 6C' is a diagrammatical, cross-sectional sketch showing and enlarged portion of FIG. 6C, such portion being encircled by the arrow 6C'-6C' in FIG. 6C;

FIG. 6D' is a diagrammatical, cross-sectional sketch of an enlarged portion of the semiconductor structure according to another embodiment of the disclosure;

FIGS. 9A-9E are diagrammatical, cross-sectional sketches at various stages in the fabrication of a semiconductor structure according to another embodiment of the disclosure; and FIGS. 10A-10G are diagrammatical, cross-sectional sketches at various stages in the fabrication of a gate electrode structure used in the semiconductor structure of FIGS. 2A-2U at various stages in the fabrication thereof according to the disclosure.

Like reference symbols in the various drawings indicate like elements.

DETAILED DESCRIPTION

Figure 1A:
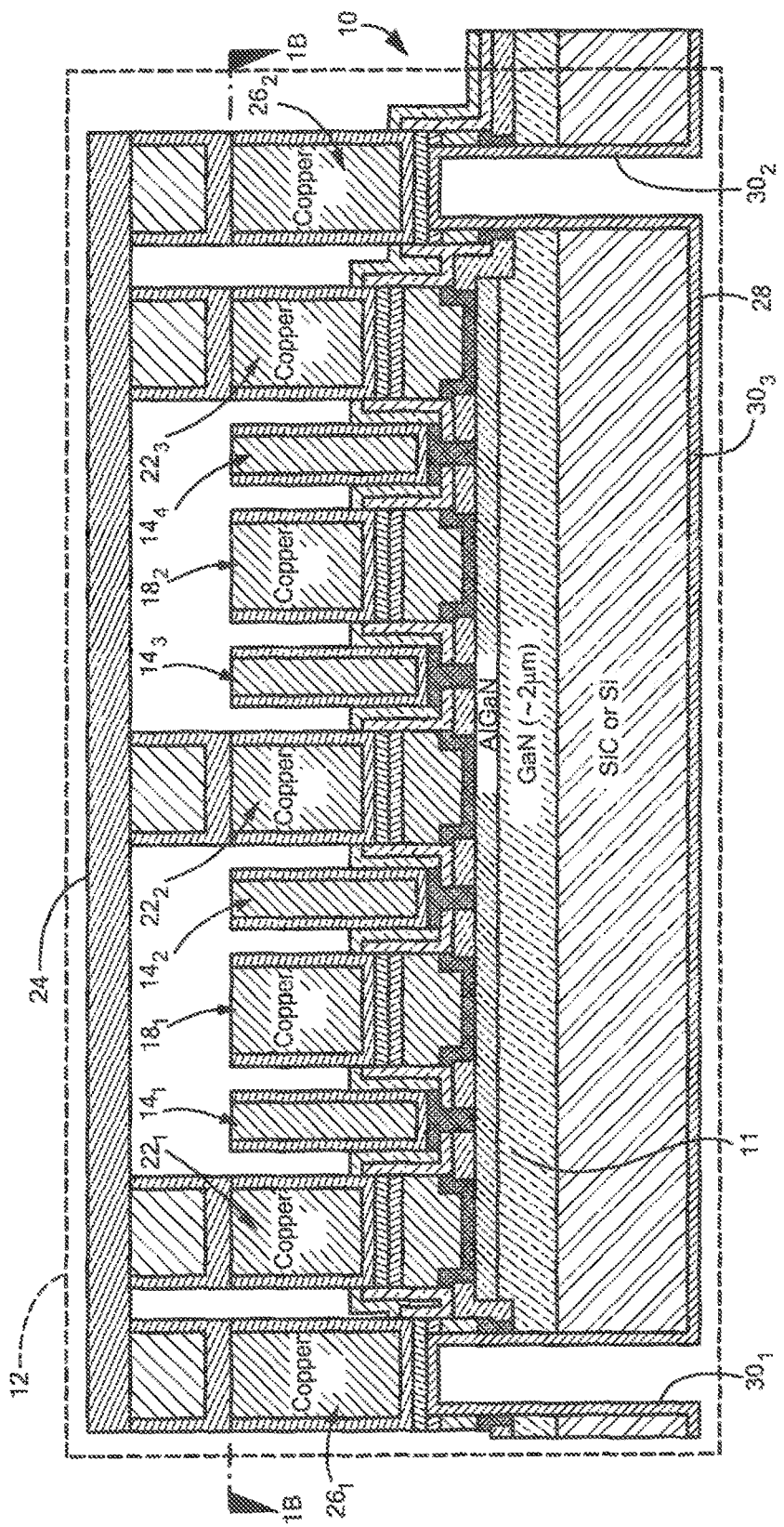
FIG. 1A is a simplified cross-sectional sketch of a Field Effect Transistor (FET), here a high electron mobility transistor (HEMT), according to the disclosure.
Figure 1B:
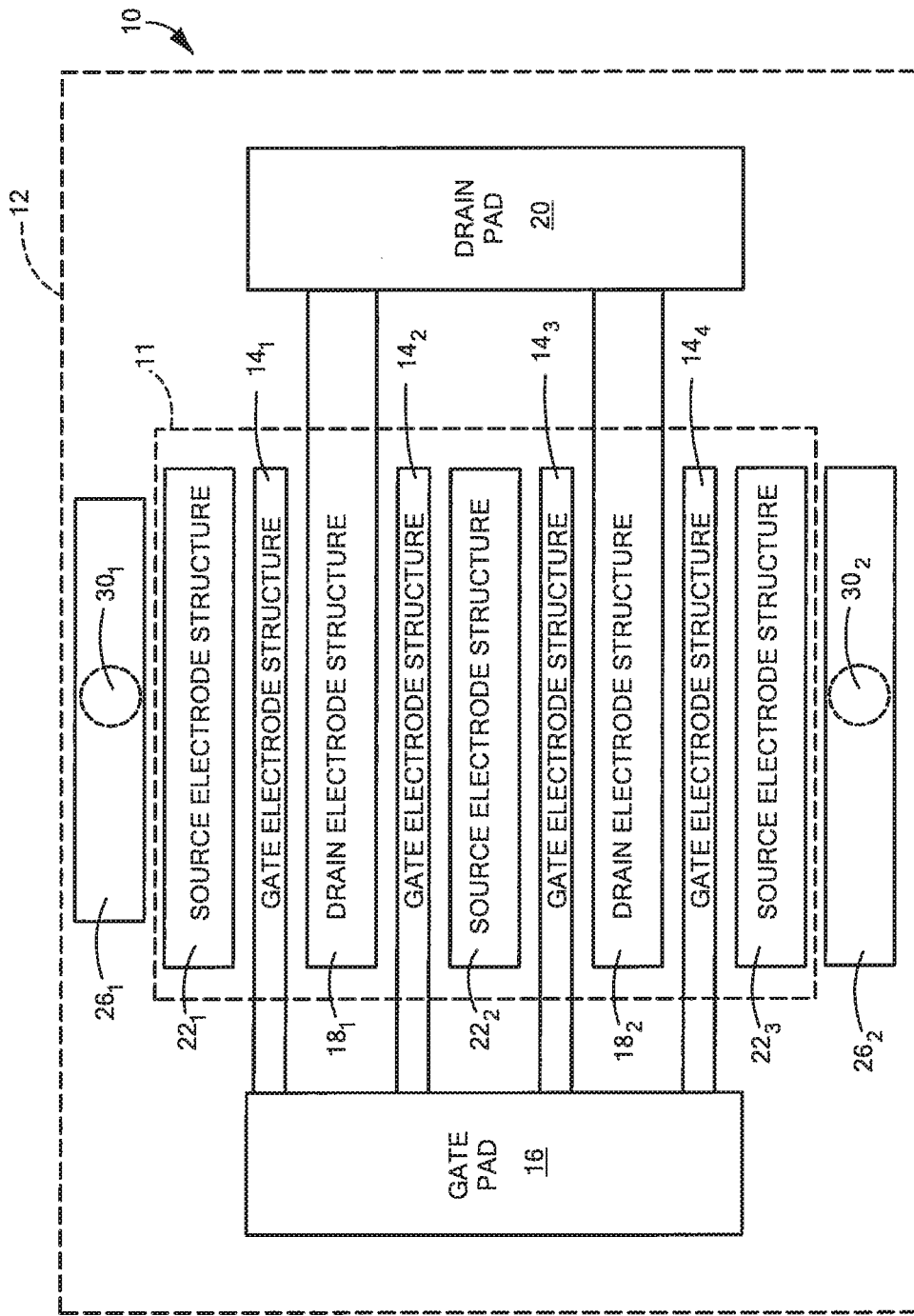
FIG. 1B is a simplified plan view of a portion of the FET of FIG. 1A, such plan view being taken along line 1B-1B of FIG. 1A.

Referring now to FIGS. 1A and 1B, a semiconductor structure 10 is shown having formed therein a multi-gate Field Effect Transistor (FET) 12, here a HEMT. The FET 12 includes a plurality of, here. For example four, gold-free, finger-like gate electrode contacts structures $14_1$-$14_4$ interconnected to a gold-free, gate pad 16; a plurality of, here for example, two, gold-free, finger-like drain electrode structures $18_1$-$18_2$ interconnected to a gold-free, drain pad 20; and a plurality of, here for example three, gold-free, source electrode structures $22_1$-$22_3$ interconnected by a gold-free, conductive interconnect structure 24, as shown in FIG. 1A. It should be understood that the number of gate electrode structures $14_1$-$14_4$, source electrode structures $22_1$-$22_3$ and drain electrode structures $18_1$-$18_2$ may be more (or less) than that shown. In any event, each one of the gate electrode structures $14_1$-$14_4$ is disposed between a corresponding one of the drain electrode structure $18_1$-$18_2$ and a corresponding one of the source electrode structures $22_1$-$22_3$ to control a flow of carriers in the semiconductor structure 10 between the corresponding one of the source electrode structures $22_1$-$22_3$ and the corresponding one of the drain electrode structures $18_1$-$18_2$. Further, two pads $26_1$, $26_2$ are provided and are connected to the ends of the conductive interconnect structure 24, as shown. These pads $26_1$, $26_2$ and connected to a conductive layer 28 formed over the bottom of semiconductor structure 10 by conductive vias $30_1$, $30_2$, respectively, passing through the semiconductor structure 10. As will be described in more detail in connection with FIGS. 2A-2T, the front or top side of the structure 10 is processed in a silicon foundry to form the multi-gate FET 12.

More particularly, referring to FIG. 2A, the semiconductor structure 10 is shown in more detail to include: a substrate 32 here for example, silicon (Si), silicon carbide (SiC), or silicon on insulator (SOI). A layer of a Group III-N semiconductor layer 34 on an upper portion of the substrate 32, here for example, having a thickness of approximately ~1-5 microns over the upper surface of the substrate 32 followed by a second Group III-N semiconductor layer 36, here aluminum gallium nitride ($Al_xGa_{1-x}N$, where x is $0<x\leq1$) for example having a thickness of approximately 5-30 nm, on the upper surface of the Group III-N layer 34. It should be understood that the layer 34 is here a GaN buffer structure, which also includes nucleation and strain relief layers, not shown; typically aluminum nitride (AlN) and aluminum gallium nitride ($Al_xGa_{1-x}N$, where x is $0<x\leq1$). Conventional silicon (Si) foundry compatible, subtractive patterning (lithography and etching) techniques is used to remove portions of the Group III-N semiconductor layer 34 and Group III-N semiconductor layer 36 to form the mesa structure shown in FIG. 1A. It is noted, however, that the electrical isolation provided by the etched mesa structure in FIG. 1A could also be provided by ion implantation (instead of etching), here for example nitrogen, of the same masked layer. This would result in a planar structure. As will be described below, the structure 10 will be processed to form a multi-gate FET 12 shown above in FIGS. 1A and 1B. It is noted that while the finger-like gate electrode structures $14_1$-$14_4$, the drain electrode structures $18_1$-$18_2$, and the source electrode structures $22_1$-$22_3$ are on the mesa 11, the gate pad 16, drain pad 20, and two pads $26_1$, $26_2$ are off of the mesa 11.

Figure 2C:
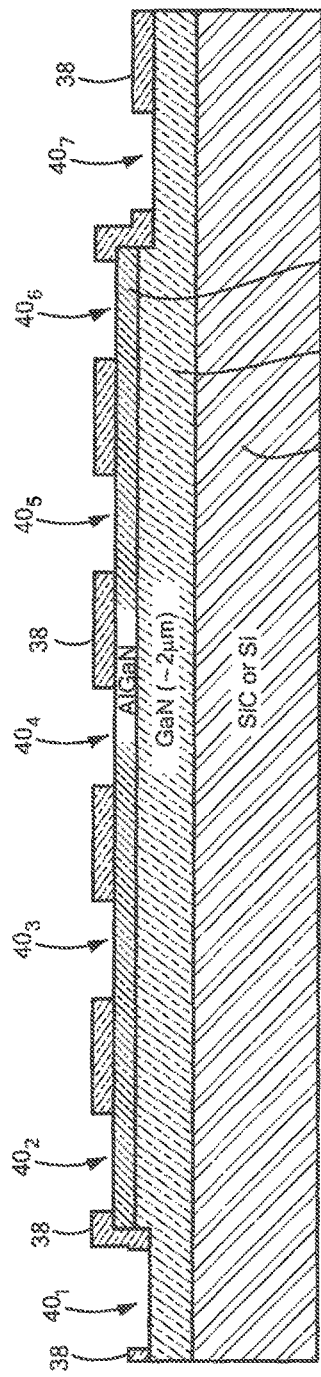
FIGS. 2A-2U are diagrammatical, cross-sectional sketches at various stages in the fabrication of a semiconductor structure at various stages in the fabrication thereof according to the disclosure, where FIG. 2U' is an exploded diagrammatical cross-sectional view of a portion of FIG. 2U indicated by the arrow 2U'-2U'.
FIG. 2D' is an enlarged portion of FIG. 2D, such enlarged portion being encircled by an arrow in FIG. 2D.

Referring now to FIG. 2B the front or top side of the structure shown in FIG. 2A is coated with a passivation layer 38, here for example, silicon nitride $SiN_x$. Layer 38 is processed using conventional silicon (Si) foundry compatible subtractive patterning (lithography and etching) techniques to form windows or openings $40_1$-$40_7$ through selected portions of layer 38 with windows $40_1$ and $40_7$ thereby exposing underlying surface portions of the GaN layer 34 wherein the pads $26_1$, $26_2$, gate pad 16 and drain pad 20 (FIGS. 1A and 1B) are to be formed and windows $40_2$-$40_6$ exposing underlying portions of the AlGaN layer 36 where the source electrode structures $22_1$-$22_3$ and drain electrode structures $18_1$-$18_2$ (FIGS. 1A and 1B) are to be formed, as shown in FIG. 2C.

Figure 2D:
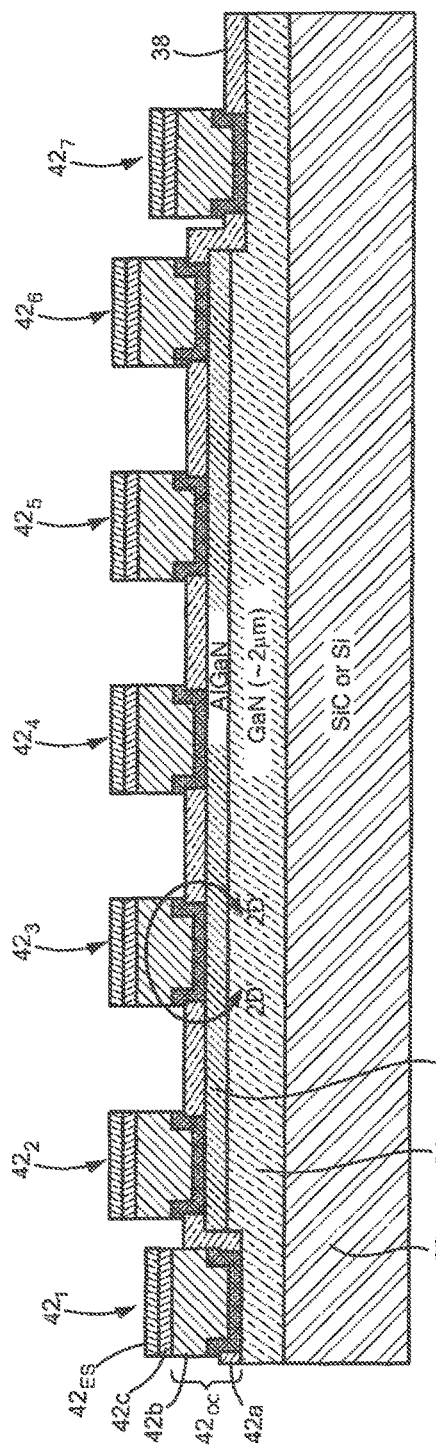
Figure 2D:
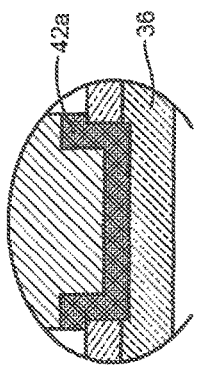

Referring now to FIG. 2D, electrical contact structures $42_1$ through $42_7$ are identical in construction, an exemplary one thereof, here electrical contact structures $42_1$, is shown in more detail in FIG. 3B to include: (A) a gold-free Ohmic contact structure $42_{OC}$ having: a bottom layer $42a$ of titanium (Ti) or tantalum (Ta); a layer $42b$ for example, aluminum or Si doped aluminum ($Al_{1-x}Si_x$), where the Si doping, x, is typically $\leq 0.05$) on the layer $42a$; and a layer $42c$, for example tantalum (Ta) or a metal nitride, here for example titanium nitride (TiN); (B) a gold-free, electrically conductive etch stop layer $42_{ES}$, here for example, nickel or molybdenum or platinum, disposed on the Ohmic contact structure $42_{OC}$; and, (C) a gold-free electrode contact, here a copper Damascene electrode contact, to be described in connection with FIG. 2K. It is noted that an etch stop layer etches at a rate at less than one half (≤½) the rate to a particular etchant than the rate such etchant etches through material being etched prior to reaching the etch stop layer. The layers 42a, 42b, 42c and 42$_{ES}$ are disposed over the surface of the structure shown in FIG. 2C and through the openings 40$_1$-40$_7$; it being noted that electrical contact structures 42$_1$ and 42$_7$ are disposed over, and are electrically connected to the two pads 26$_1$, 26$_2$ (FIG. 1B); electrical contact structures 42$_2$, 42$_4$, and 42$_6$ are disposed over, and are electrically connected to source electrode structures 22$_1$-22$_3$; electrical contact structures 42$_3$ and 42$_5$ are disposed over, and electronically connected to drain electrode structures 18$_1$ and 18$_2$, electrical contact structures 42$_1$ and 42$_7$ are being formed in contact with the GaN layer 34. After deposition the layers 42a, 42b, and 42c of the Ohmic contact structures 42$_{OC}$ are formed using conventional silicon (Si) foundry compatible subtractive patterning (lithography and etching) techniques (specifically the Ohmic contact structures 42$_{OC}$ are dry etched using a chlorine-based dry etch chemistry). The electrical contact structures 42$_2$ through 42$_6$ are then formed in Ohmic contact with the Group III-N semiconductor layer 36, here the AlGaN layer during an anneal process to be described. Here, for example, the electrical contact structures 42$_1$ through 42$_7$, is greater than 60 nm thick.

More particularly, each one of the Ohmic contact structures 42$_{OC}$ is a tri-metal stack and includes: (a) the bottom layer 42a of Ti or Ta (which may be recessed into the upper surface portions of the Group III-N semiconductor layer 36 for structures 42$_2$-42$_6$ (as shown in FIG. 2D') by chlorine plasma-based dry etching into layer 36 prior to depositing layer 42a); (b) the aluminum-based layer 42b, here for example, aluminum or Si doped aluminum Al$_{1-x}$Si$_x$ layer 42b (where x is less than 1; here, x is typically ≤0.05); and (c) the top metal layer 42c, for example tantalum or a metal nitride layer 42c, here for example titanium nitride (TiN) on the aluminum-based layer 42b layer. A typical thickness for layer 42a and layer 42c is 5-30 nm, while the layer 42b can range from 50-350 nm depending on the metal layers chosen for the Ohmic contact three-layer structure 42$_{OC}$ stack.

More particularly, in order to maintain optimum contact morphology and for contamination control, the anneal of the Ohmic contact structure 42$_{OC}$ to form a semiconductor Ohmic contact is kept below the melting point of aluminum (≤660° C.). Such low temperature anneals typically take longer than five (≥5) minutes in a nitrogen ambient at a steady state temperature. More particularly, a first metal element of the metal to semiconductor Ohmic contact structure 42$_{OC}$, here for example Ti or Ta layer 42a, is deposited directly on or disposed in contact with the Group III-N surface here for example Al$_x$Ga$_{1-x}$N layer 36 and forms a metal nitride by reacting with the Group V element nitrogen in the Group III-N material interface layer 36 during the temperature ramp from ambient temperature to a steady state anneal temperature during the Ohmic contact formation anneal (also herein referred to as Ohmic anneal) of the Ohmic contact structure 42$_{OC}$. It is noted that the temperature ramp is typically ≤15° C./sec when a linear temperature ramp is used, however stepped temperature ramp profiles, and mixed step and linear ramp profiles all may be used in order to optimize first metal layer 42a interaction with the Group III-N surface layer 36 in the formation of the metal nitride. Next, a second lower resistance metal, here for example aluminum layer 42b, diffuses into the first metal (here layer 42a), the formed metal nitride, and into the surface of the Group III-N material (here layer 36) during the steady state anneal process of ≤660° C. for ≥5 minutes to provide the lowest resistance Ohmic contact. Finally, in order to maximize the amount of interaction between the first and second metals, here layers 42a and 42b of the metal to semiconductor Ohmic contact structure 42$_{OC}$ that forms the Ohmic contact, and the Group III-N material layer 36 at ≤660° C. temperatures, it is necessary to prevent intermixing with any third metal layer (a metal nitride or metal, here layer 42c) disposed above the two layers (here layers 42a and 42b) and in contact with the upper layer of the two (here layer 42b).

The prevention of intermixing of the first two layers of the Ohmic contact structure 42$_{OC}$ (here layers 42a and 42b) with the third (here layer 42c) can be accomplished in several ways: First, it may be accomplished by depositing the Ohmic contact structure 42$_{OC}$ and annealing the Ohmic contact structure 42$_{OC}$ as a two-layer stack of the first and second metals (layers 42a and 42b) with a subsequent removal of any oxidized interface (by dry etching, wet etching, or in-situ dry sputter removal of the oxidized interface) prior to third metal deposition (here layer 42c); Second, when all three metals layers 42a, 42b and 42c of the Ohmic contact structure 42$_{OC}$ are deposited prior to Ohmic anneal of the Ohmic contact structure 42$_{OC}$, one of the following two methods may be used to form a low temperature (≤660° C.) Ohmic contact between the Ohmic contact structure 42$_{OC}$ and the Group III-N semiconductor layer 36: In the first method, and referring to FIG. 4A, a metal nitride layer (such as TiN, or TaN, here layer 42c) of the Ohmic contact structure 42$_{OC}$ is disposed in contact with the second aluminum layer (42b) and resists intermixing with layer 42b during the anneal at ≤660° C., and metal layer 42a is alloyed with Group III-N layer 36 and metal layer 42b with a metal nitride InterLayer a, ILa, being formed between layer 42a and Group III-N layer 36, as shown in FIG. 4A' (it is noted that there may be some Un-alloyed portions, Un-L of layer 42a after the anneal and that the metal nitride interlayer may be discontinuous) forming a post-anneal Ohmic contact structure 42$_{OC}$; In the second method, (and referring to FIG. 4B) a thin (~1-10 nm thick) partially oxidized second metal (here Aluminum layer 42b) or third metal (here Ta, TiN, or TaN layer 42c) or combination thereof, an InterLayer b, ILb, is formed by reaction with oxygen that is either present in the gases used in, or intentionally introduced into, the deposition and/or anneal apparatus during the Ohmic contact structure 42$_{OC}$ deposition process or Ohmic anneal of the Ohmic contact structure 42$_{OC}$. This partially oxidized metal interlayer ILb is formed between the second metal layer (here aluminum layer 42b) and the third metal or metal nitride layer (here Ta, TiN, or TaN layer 42c) or in contact with the second aluminum layer (42b) which resists intermixing during the anneal at ≤660° C. forming post anneal Ohmic contact structure 42$_{OC}$', as shown in FIG. 4B'. To put it another way, in the second method (FIGS. 4B and 4B'), the third metal layer 42c (a metal nitride or metal) is prevented from intermixing with layer 42b during annealing by the formation of an oxide interlayer ILb during the metal deposition and/or the anneal process, and the oxide interlayer layer ILb is formed between layer 42b and layer 42c, and metal layer 42a is alloyed with Group III-N Layer 36 and metal layer 42b, and metal nitride interlayer ILa is formed between layer 42a and Group III-N layer 36 (it is noted that there may be some un-alloyed portions Un-L of layer 42a after the anneal). Thus, in one embodiment (FIGS. 4B and 4B') the intermixing is prevented by forming a partially oxidized interlayer ILb between the second and third metals of the Ohmic contact structure 42$_{OC}$ during the electrical contact structure metal deposition and/or Ohmic anneal process. In the first method (FIGS. 4A and 4A'), the intermixing is prevented by forming a metal or metal nitride layer as layer 42c.

Further optimization of the metal to semiconductor Ohmic contact resistance may also be achieved by adding a small amount of Silicon dopant to the Ohmic contact structure as noted above. Silicon may be deposited by multiple methods such as electron beam deposition and sputtering. Silicon can be deposited as a separate layer within the Ohmic contact structure $42_{OC}$ (by sputtering of a Silicon sputtering target or by electron beam deposition) or by mixing Silicon into another layer by co-sputtering pure targets (here for example silicon and aluminum) or by sputtering a Si doped target (here for example Si doped aluminum $Al_{1-x}Si_x$ layer 42b where the Si doping, x, is typically ≤0.05).

Thus, the Ohmic contact formation anneal at the low temperature may be summarized as follows: forming a metal nitride with a first metal of the Ohmic contact structure $42_{OC}$, here layer 42a, during a temperature ramping phase of an anneal process from ambient temperature to a steady state temperature; wherein a second metal of the electrical contact structure here layer 42b diffuses into the first metal and to an upper surface of the Group III-N semiconductor layer here layer 36 to reduce resistance of the Ohmic contact formed at the interface of Group III-N layer 36 and Ohmic contact structure $42_{OC}$; and wherein the first metal, in contact with the Group III-N semiconductor layer 36, and the second metal of the Ohmic contact layer 42b are prevented from intermixing with a third metal (or metal nitride) of the Ohmic contact layer 42c during the Ohmic anneal process; and wherein the first metal and the second metal and third metal (metal nitride or metal) are maintained below their melting points during the Ohmic contact formation anneal process. The prevention of intermixing of the first two metals (layers 42a and 42b) with the third metal (layer 42c) indirectly enhances the interaction of the first two metals with the Group III-N interface at low temperatures, thereby facilitating lower contact resistance. After the anneal process described above the electrically conductive etch stop layer $42_{ES}$, here for example, nickel, molybdenum or platinum is disposed on layer 42c, as shown in FIG. 3B.

Figure 2E:
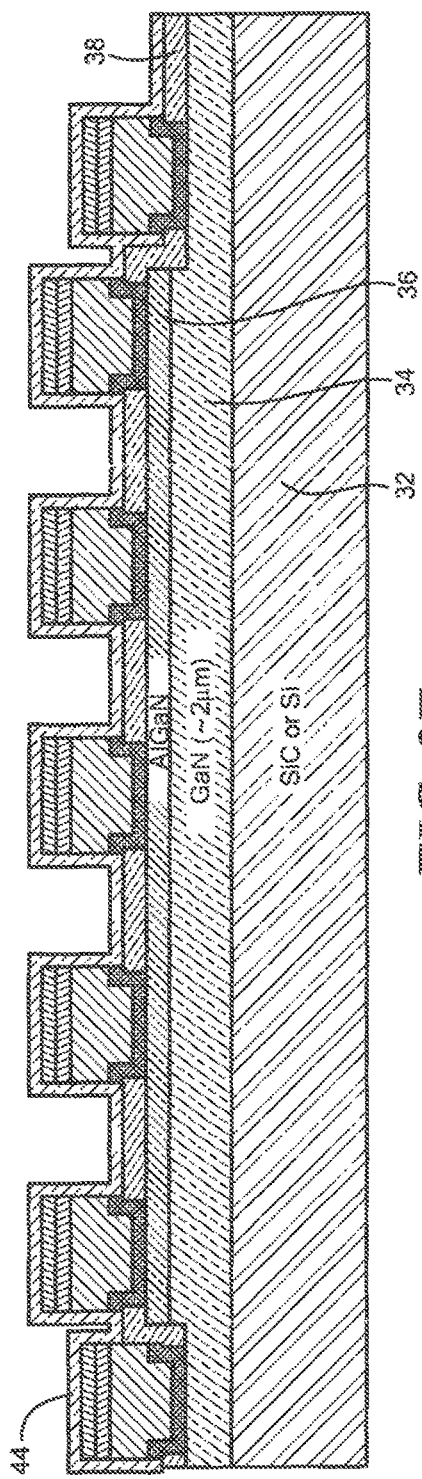

Referring now to FIG. 2E, the surface of the structure shown in FIG. 2D is coated with a dielectric layer 44, here also $SiN_x$, as shown.

Figure 2F:
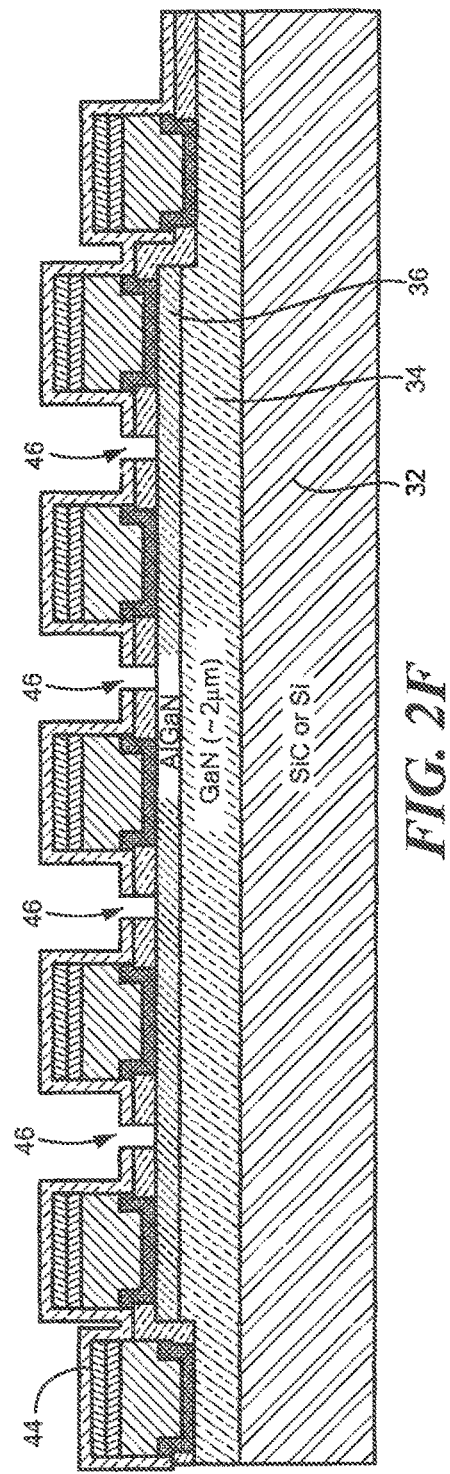

Referring now to FIG. 2F, openings or windows 46 are formed in layer 44, as shown using any conventional silicon (Si) foundry compatible lithography and etch processing techniques to expose portion of the Group III-N semiconductor layer 36 where the finger-like gate electrode structures $14_1$-$14_4$ (FIGS. 1A and 1B) are to be formed, here in this embodiment, in Schottky contact with the Group III-N semiconductor layer 36, here the AlGaN layer.

Figure 2G:
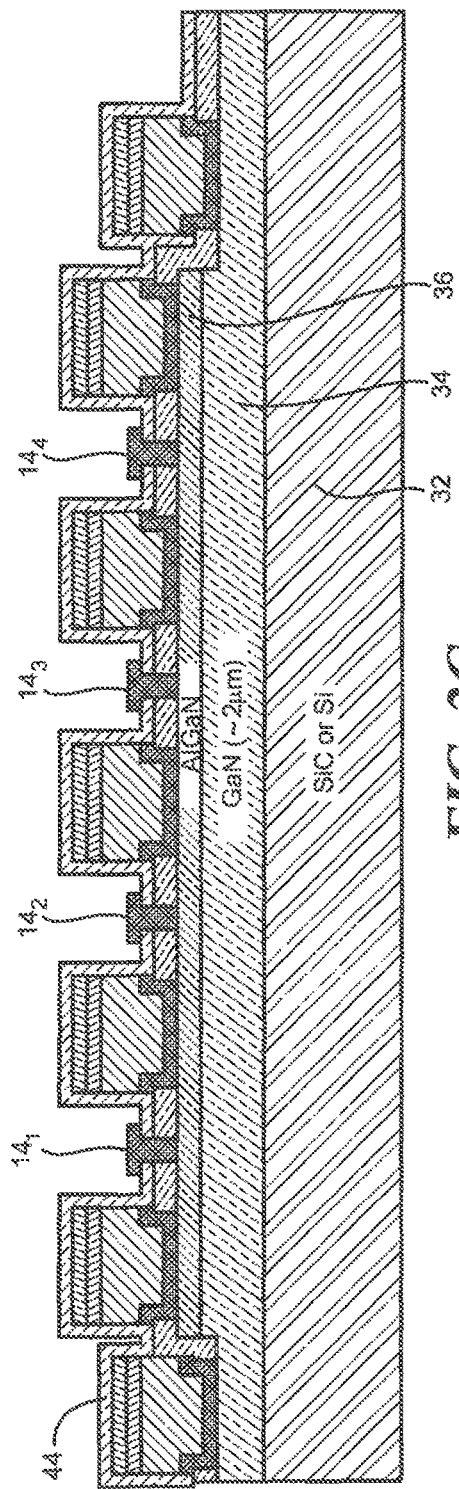

Referring now to FIG. 2G, the finger-like gate electrode structures $14_1$-$14_4$ (FIGS. 1A and 1B), to be described in more detail in FIG. 3A, are formed through the openings or windows 46 using silicon (Si) foundry compatible lithography and etch processes, as shown. More particularly, and each one of the gate electrode structures $14_1$-$14_4$ is identical in construction, an exemplary one thereof, here gate electrode structures $14_1$, is shown in detail in FIG. 3A to include: (A) gate electrical contact structure $14_{GC}$ having a gate metal layer 14a, here a single material or plurality of materials for example nickel (Ni), titanium nitride (TiN), nickel/tantalum nitride (Ni/TaN), nickel/tantalum (Ni/Ta), nickel/tantalum/tantalum nitride (Ni/Ta/TaN), nickel/molybdenum, (Ni/Mo), titanium nitride/tungsten (TiN/W), or doped silicide in Schottky contact with the AlGaN semiconductor layer 36; and (B) gold-free electrode contact, here a copper Damascene electrode contact, to be described in connection with FIG. 2K. The gate metal layer 14a, formed using conventional silicon (Si) foundry compatible, subtractive patterning techniques, here is a Schottky contact metal that forms the Schottky contact with the Group III-N semiconductor layer 36; it is noted that the gate electrical contact structure $14_{GC}$ may have a thin (typically ~2-10 nm) dielectric layer 14b, for example aluminum oxide ($Al_2O_3$), disposed between the gate metal layer 14a and the Group III-N semiconductor layer 36, as indicated in FIG. 3A to form an metal insulated gate HEMT (MISHEMT). It should be noted that the gate metal layer 14a may be T-shaped, as shown, or gamma-shaped (σ-shaped), as shown in FIG. 3A', to form a field plate structure having an overhang portion 15 pointing in the direction of the adjacent drain electrode structure.

It is noted that the dry etches for the metals or metal nitrides comprising Schottky gate metal layer 14a will typically be chlorine-based (to etch, for example, Ni and TiN) or fluorine-based (to etch, for example, Mo, TiN, W, Ta, and TaN) or a combination thereof (to etch for example for TiN, W, Ta, and TaN). However, when Ni is used in Schottky gate metal layer 14a it can be quite difficult to dry etch due to lack of volatile etch byproducts. Therefore, nickel dry etches, here for example chlorine ($Cl_2$) and argon (Ar) gas mixtures, are primarily physical etches (sputtering) and not chemical-based etches. Since, predominately physical dry etches have poor etch selectivity to underlying layers, dry etching a Ni including Schottky layer 14a may result in unacceptable over etch into passivation layer 38 in some circumstances here for example when the thickness of the Ni in Schottky gate metal layer 14a and the dielectric in passivation layer 38 are about the same. In such cases a sacrificial dielectric layer (not shown) here for example silicon dioxide ($SiO_2$) may need to be deposited between passivation layer 38 and the overhang portion 15 of the Schottky gate metal layer 14a.

An alternative method of etching a Schottky gate metal layer 14a comprised of Ni is to employ a dry etch for a top metal (here for example TaN, Ta, Mo or a combination thereof), if present, and a wet etch (here for example HF, $H_3PO_4$, $HNO_3$, or $H_2SO_4$-based or a combination thereof) for the Ni layer. It is important to choose the Ni wet etchant of Schottky metal layer 14a such that it is highly selective to the top metal layer (if used the bottom Schottky metal layer becomes 14a' and the top Schottky layer becomes 14a" as in the description of FIGS. 10C-10G below). Additionally, the unintended removal of the nickel underneath the masked Schottky gate metal layer 14a features (herein also referred to as undercut) should be minimized so that the gate dimensions resulting from the process are repeatable and that the gate functions as intended. As a result, as the total width of the feature size masked by Schottky metal layer 14a shrinks, the thickness of the nickel layer in Schottky gate metal layer 14a will shrink as well to minimize undercut. For feature sizes less than one micron (≤1 μm) as defined by Schottky gate metal 14a the thickness of the deposited Ni of Schottky contact gate metal layer 14a is here for example likely to be ≤100 nm.

Figure 10B:
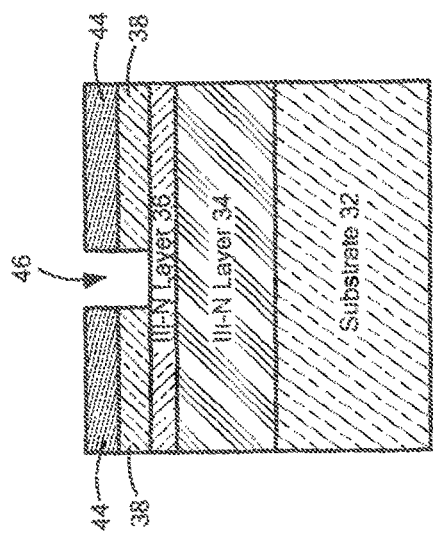
Figure 10D:
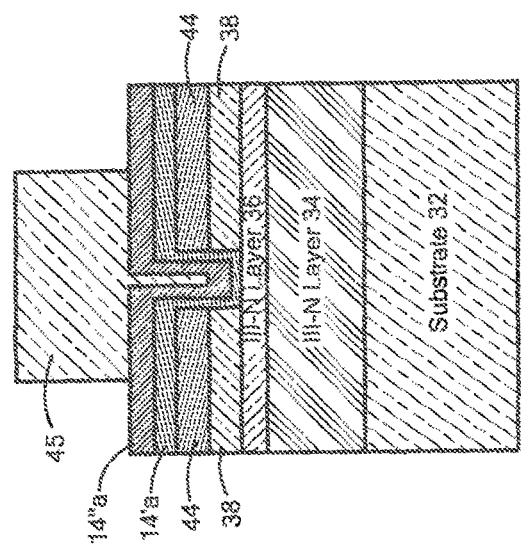
Figure 10A:
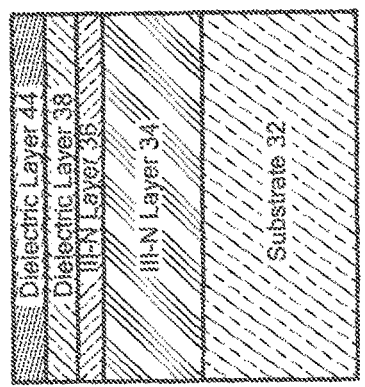
Figure 10C:
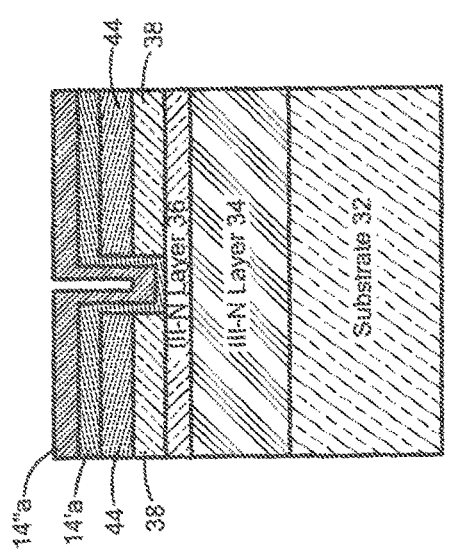

The formation of the gate electrode structures $14_1$-$14_4$ is shown in more detail in connection with FIGS. 10A-10G. Thus, after forming dielectric layer 44, here also $SiN_x$, as shown in FIG. 10A and the openings or windows 46 in layer 44, as shown in FIG. 10B, as described above in connection with FIGS. 2E and 2F, a first gate metal or Schottky contact metal layer 14'a, here for example Ni or TiN is deposited over the dielectric layer 44 and through the window 46 onto the exposed portion of the AlGaN layer 36 as shown in FIG. 10C. Next, a second gate metal layer 14"a is deposited over the first gate metal or Schottky contact layer, here TaN, Ta, Mo, or W, for example, as shown in FIG. 10C.

Next, either a photoresist or hard mask 45 is formed over a portion of the surface of the second gate contact metal 14"a in registration with the window 46, as shown in FIG. 10D. The portion of the second gate contact metal 14"a exposed by the mask is removed using a dry etch, as shown in FIG. 10E. Next, using the same mask 45, a dry or wet etch is used to remove the exposed portions of the first gate contact or Schottky contact metal 14'a, as shown in FIG. 10F. The mask 45 is then removed as shown in FIG. 10G.

Figure 2H:
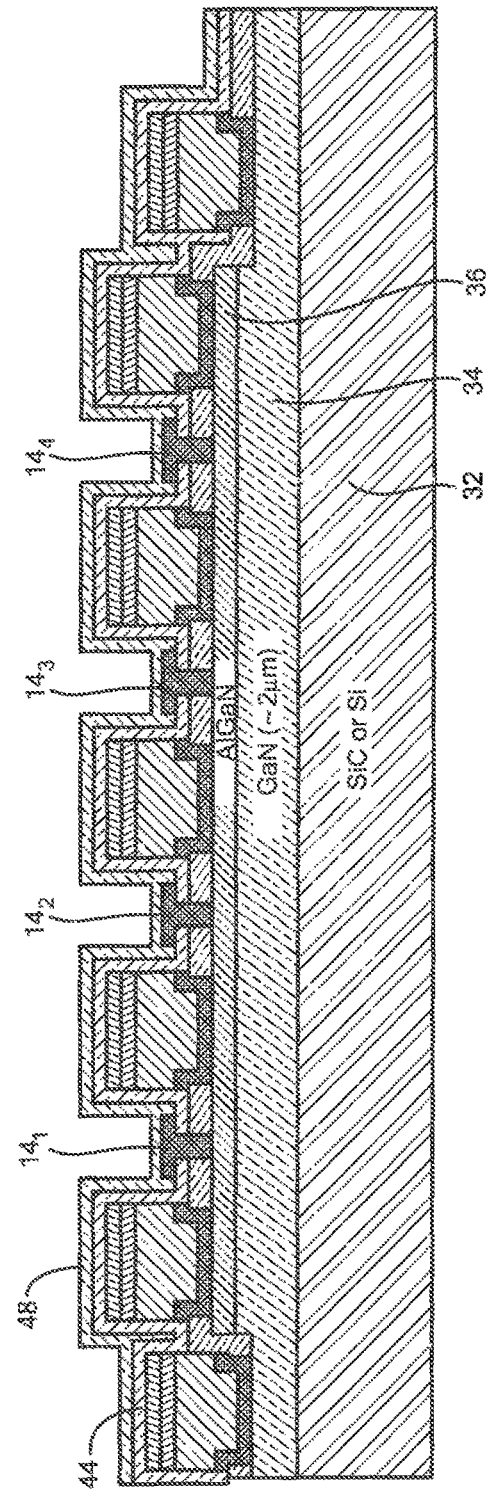
Figure 2I:
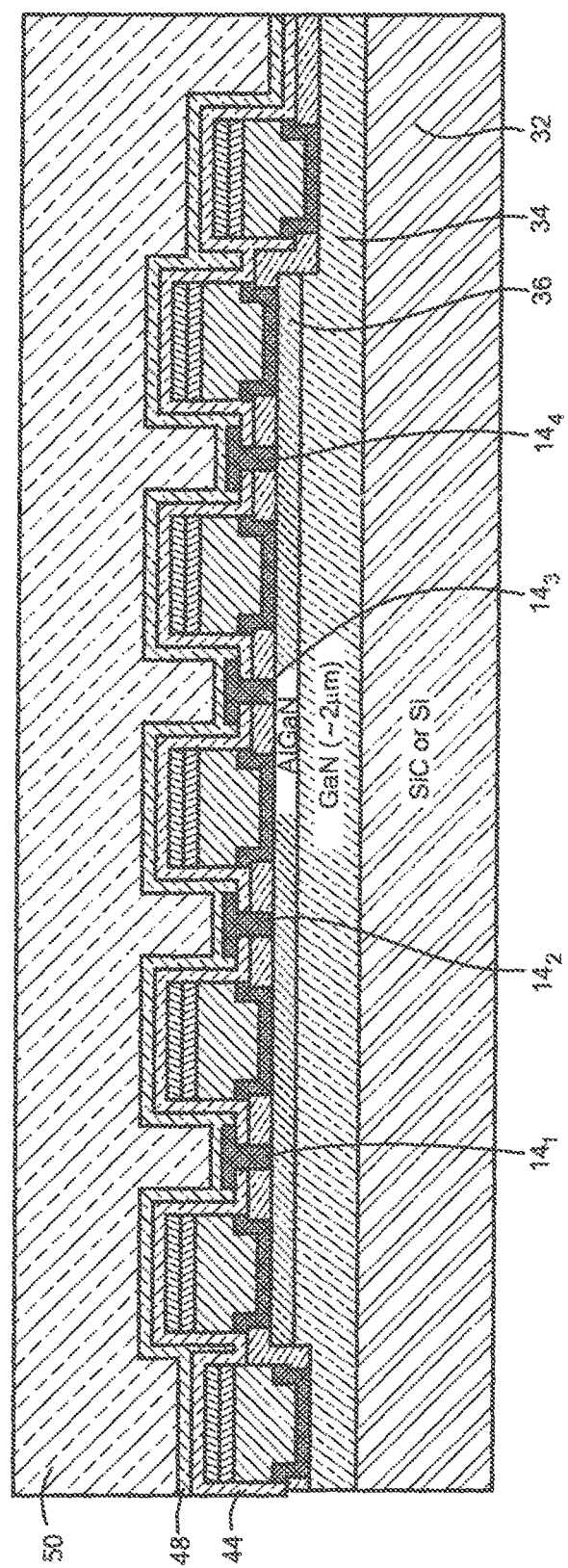
Figure 2J:
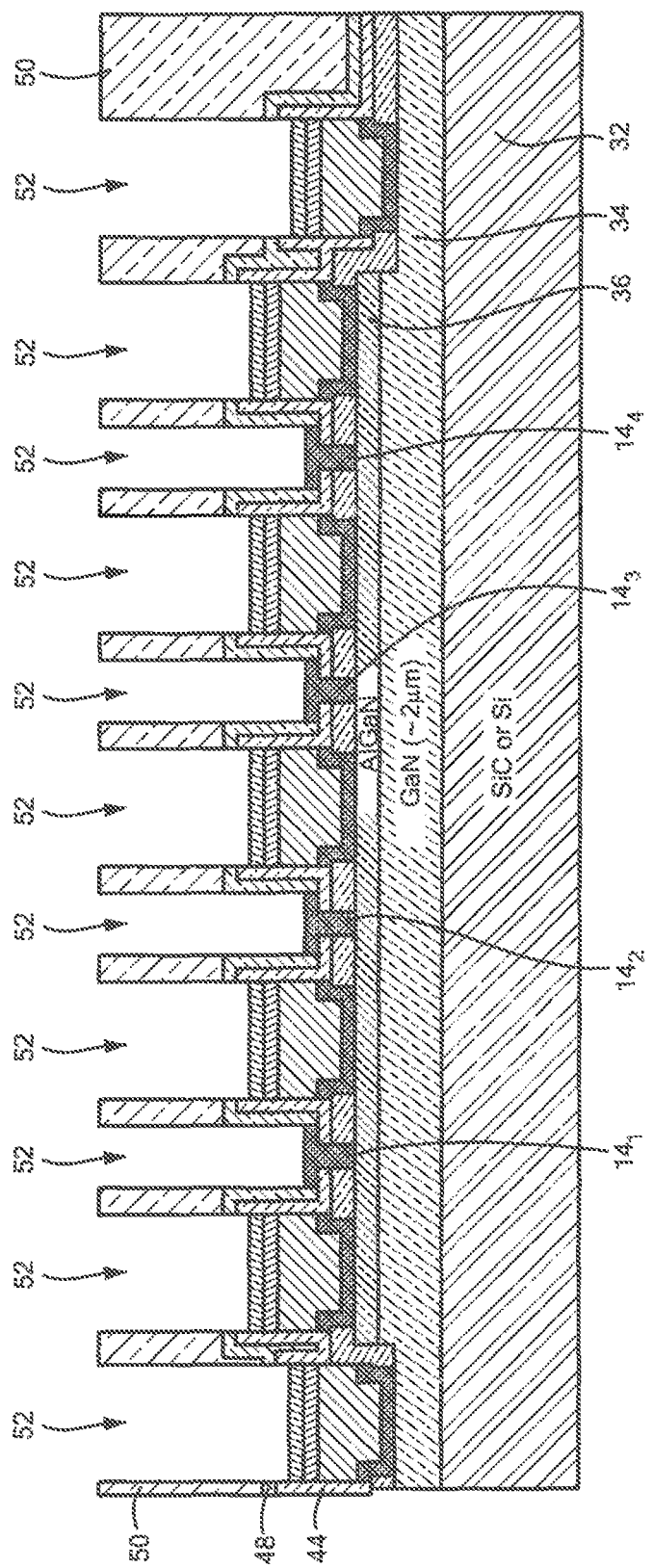
Figure 2K:
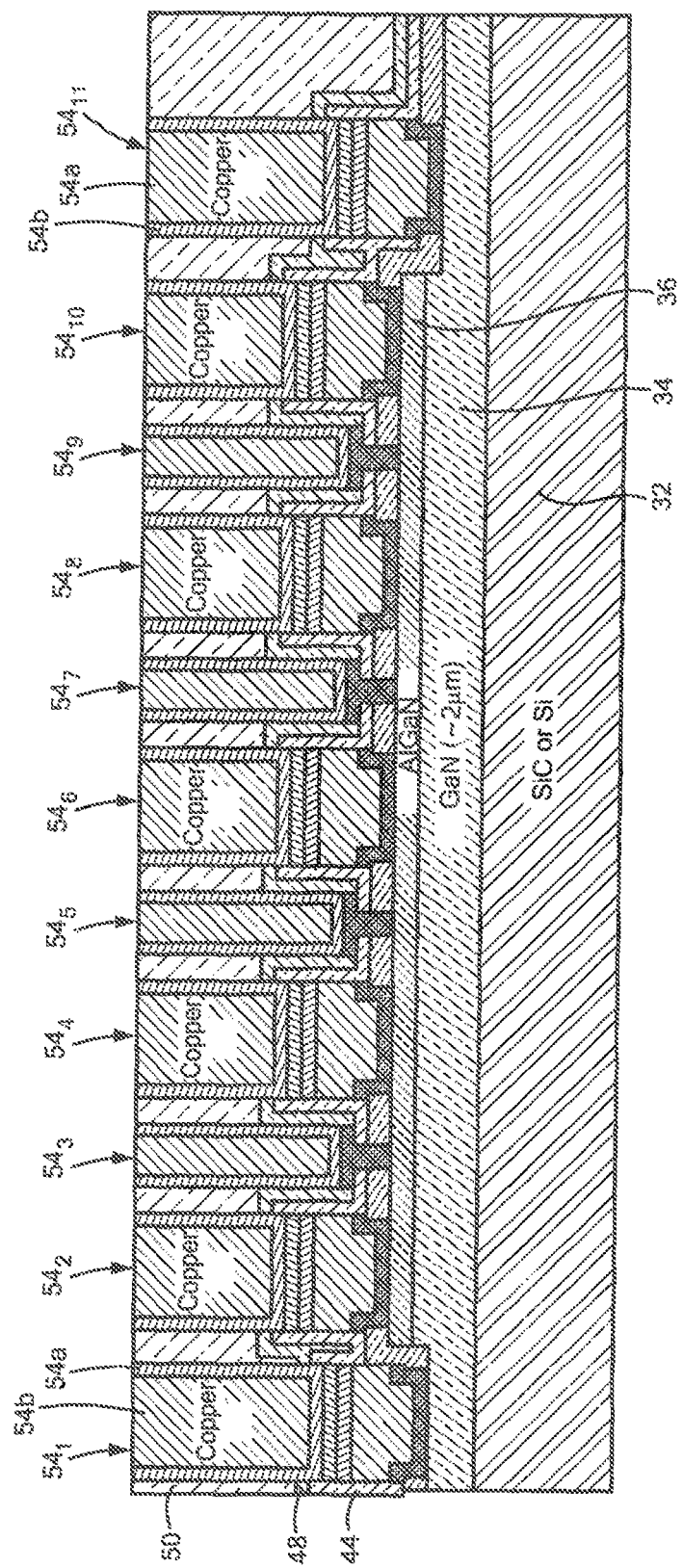

After Schottky gate metal layer 14a formation, processing continues with the formation of the aforementioned electrode contacts, here copper Damascene electrode contacts $54_1$-$54_{11}$, as shown in FIG. 2K; an exemplary one thereof, here electrodes $54_2$ being shown in detail in FIG. 3A. It is noted that the formation of each copper Damascene electrode contacts $54_1$-$54_{11}$ occurs with the deposition of two dielectric layers (here $SiN_x$ layer 48 and $SiO_2$ layer 50) as shown in FIG. 2I. The first layer 48, here $SiN_x$, functions as a diffusion barrier (when copper is disposed beneath it) and an etch stop. The second layer, here $SiO_2$ layer 50, is etched selectively to the first layer 48, here $SiN_x$, which is then etched to reveal gate metal layer 14a thereby forming the trenches into which a gold-free material, here copper, is subsequently deposited.

Typically, copper Damascene electrode contacts $54_1$-$54_{11}$, are formed by first sputtering a thin metal seed layer (typically Ta/Cu, Ta/TaN, or TaN/Cu and ≤100 nm) to facilitate copper plating into trenches formed in the second dielectric layer. It is noted that the seed layer also functions as a copper diffusion barrier and as an adhesion layer to the dielectric. The excess copper overfill of the trenches is then removed with chemical mechanical polishing (CMP), which defines the metal interconnects by leaving only metal disposed in the trenches behind. As other copper Damascene layers are added, this process repeats as will be discussed below. Thus, the Damascene electrode contacts $54_1$-$54_{11}$, have co-planar upper surfaces.

Beginning the Damascene process described in the previous paragraph and referring now to FIG. 2H, the dielectric layer 48, here for example, SiNx, is deposited over the surface of the structure shown in FIG. 2G. Referring now to FIG. 2I, the second dielectric layer 50, here for example $SiO_2$ is deposited over layer 48 and patterned using conventional silicon (Si) foundry compatible lithography and etching techniques to form windows 52 through selected portions of layer 50 and layer 48 and thereby expose the top surfaces of the electrical contact structures $42_1$ through $42_7$ and the finger-like gate electrode structures $14_1$-$14_4$, as shown in FIG. 2J for simultaneous formation of source, drain and gate electrodes $54_1$-$54_{11}$ thereby completing the gate electrode structures $14_1$-$14_4$, drain electrode structures $18_1$-$18_2$, and drain electrode structures $22_1$-$22_3$, described above in connection with FIG. 1A.

Referring now to FIG. 2K, after the excess metal, here Cu, has been removed by CMP in the Damascene process as described above, the electrode contacts $54_1$-$54_{11}$ are formed on the exposed top surfaces of the electrical contact structures $42_1$ through $42_7$ and the finger-like gate electrode structures $14_1$-$14_4$, as shown. Each one of the electrode contacts $54_1$-$54_{11}$ is identical in construction; an exemplary one of the electrode contacts $54_1$-$54_{11}$, here an electrode contact $54_2$ for an exemplary one of the source or drain electrode structures $18_1$-$18_2$, $22_1$-$22_3$, respectively, here source electrode structure $22_1$ being shown in FIG. 3B and an exemplary one of the gate electrode contacts, here gate electrode structure $14_1$ being shown in FIG. 3A. Thus, as shown more clearly in FIGS. 3A and 3B, each electrode contacts $54_1$-$54_{11}$ includes in this example an upper layer 54b of copper having the bottom and sides lined with an adhesion and copper diffusion barrier layer 54a, here for example, tantalum or tantalum nitride or a combination thereof.

Thus, each one of the drain electrode structures $18_1$-$18_2$ and each one of the source electrode structures $22_1$-$22_3$ is a multi-layer, electrical contact structure in contact with the Group III-N semiconductor layer 26 and includes: a gold-free contact layer $42_{OC}$ in Ohmic contact with the Group III-N semiconductor layer 26; a gold-free electrically conductive etch stop layer $42_{ES}$ electrically connected to the gold-free contact layer $42_{OC}$; and, one of the gold-free Damascene electrode contacts $54_2$, $54_4$, $54_6$, $54_8$ and $54_{10}$. Further, each one of the gate electrode structures $14_1$-$14_4$ includes a gold-free gate electrical contact and one of the gold-free Damascene electrode contacts $54_3$, $54_5$, and $54_7$. Further, each one of the Damascene electrode contacts $54_2$-$54_{10}$ are identical in construction and all eight Damascene electrode contacts $54_2$-$54_{10}$ are formed simultaneously.

Figure 2L:
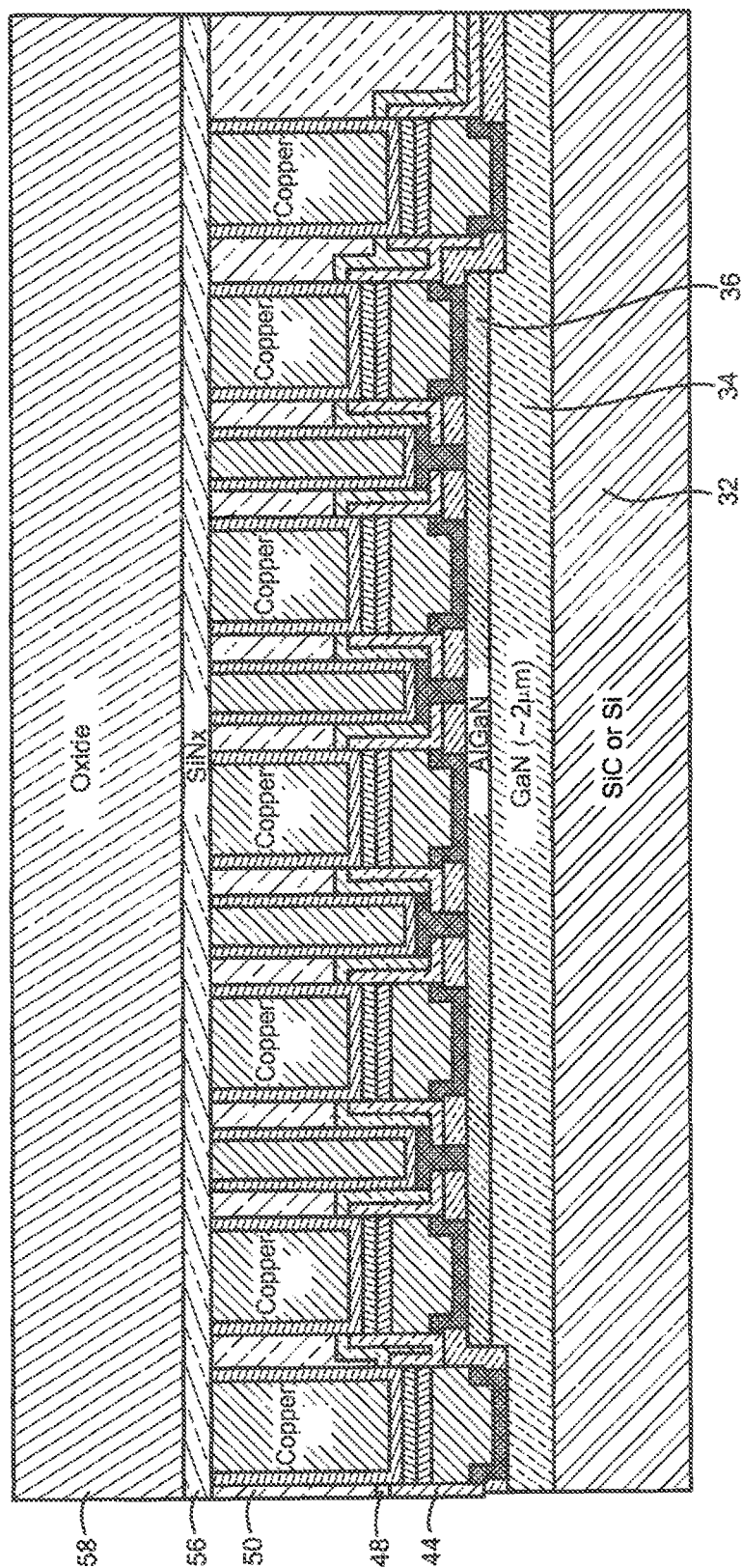

Referring now to FIG. 2L, after CMP, a dielectric layer 56, here silicon nitride (SiNx) deposited over the surface and then layer 56 is covered with a second dielectric layer 58, here an oxide layer 58, here for example silicon dioxide.

Figure 2M:
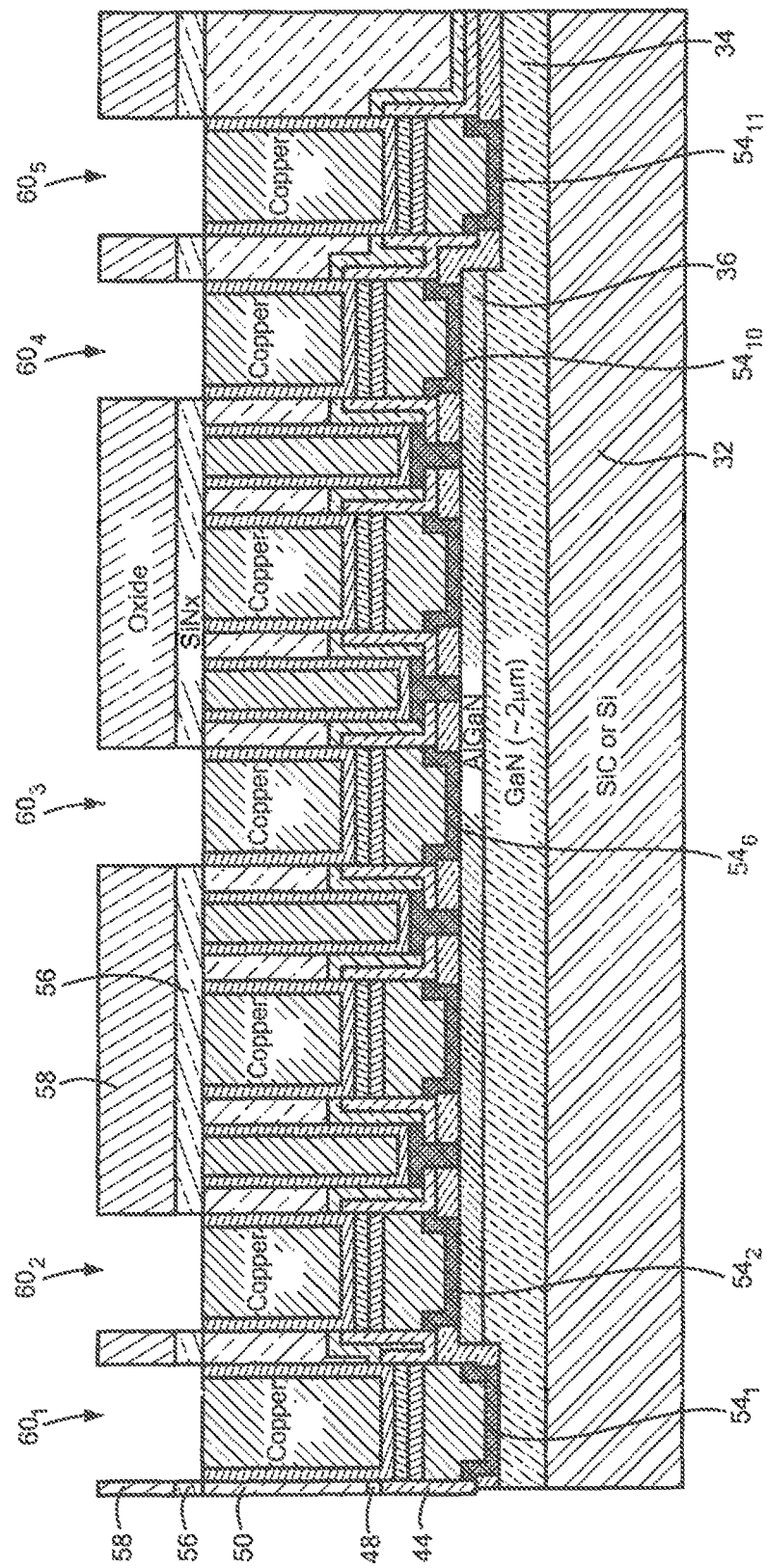

Referring now to FIG. 2M, the layers 56 and 58 are patterned using conventional silicon foundry compatible lithography and etch processing techniques to have openings or windows $60_1$-$60_5$ formed there-through over the source electrode structures $22_1$-$22_3$ (FIG. 1B) and pads $26_1$ and $26_2$ (FIG. 1B) and thereby expose the tops of the electrode contacts e $54_1$, $54_2$, $54_6$, $54_{10}$ and $54_{11}$, as shown.

Figure 2N:
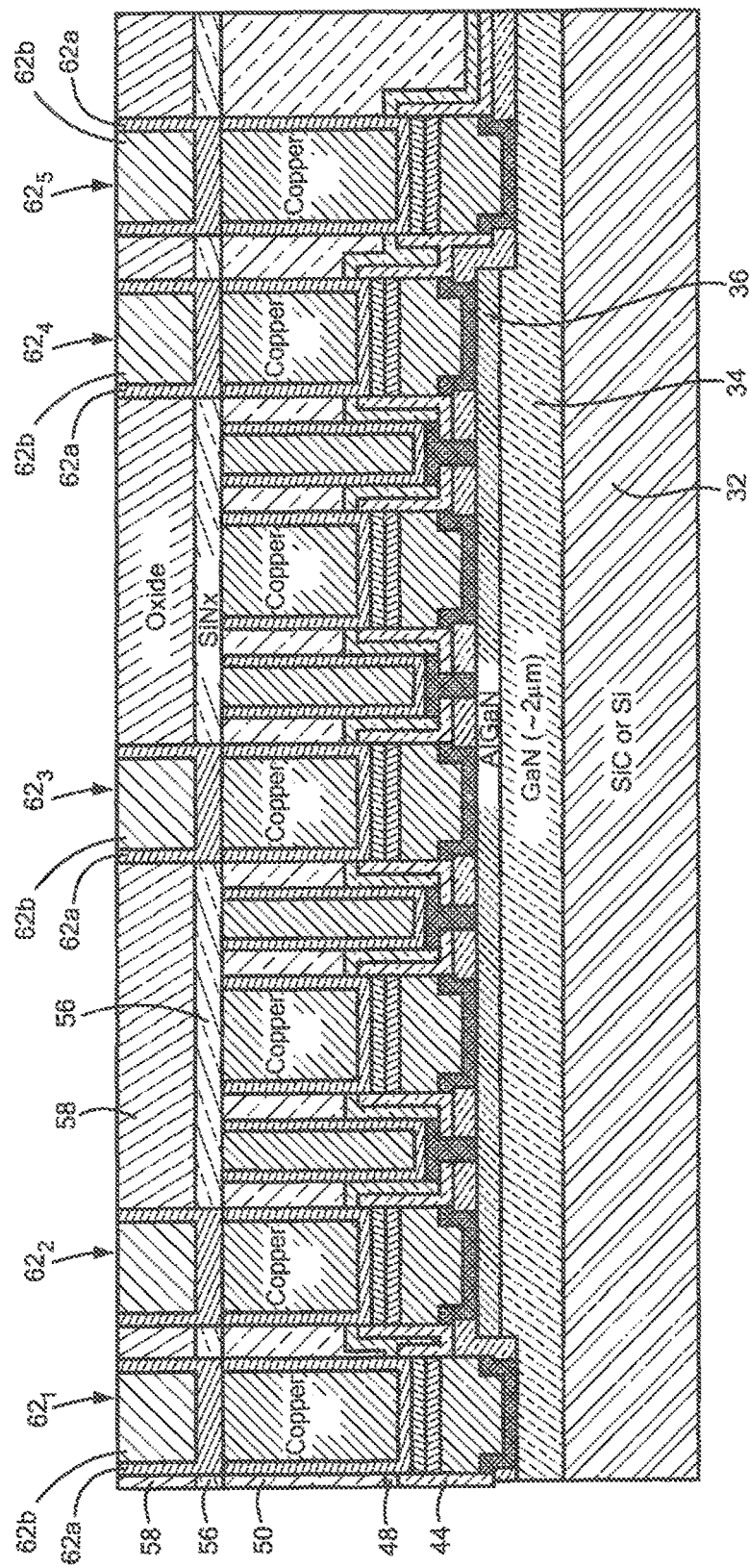
Figure 20:
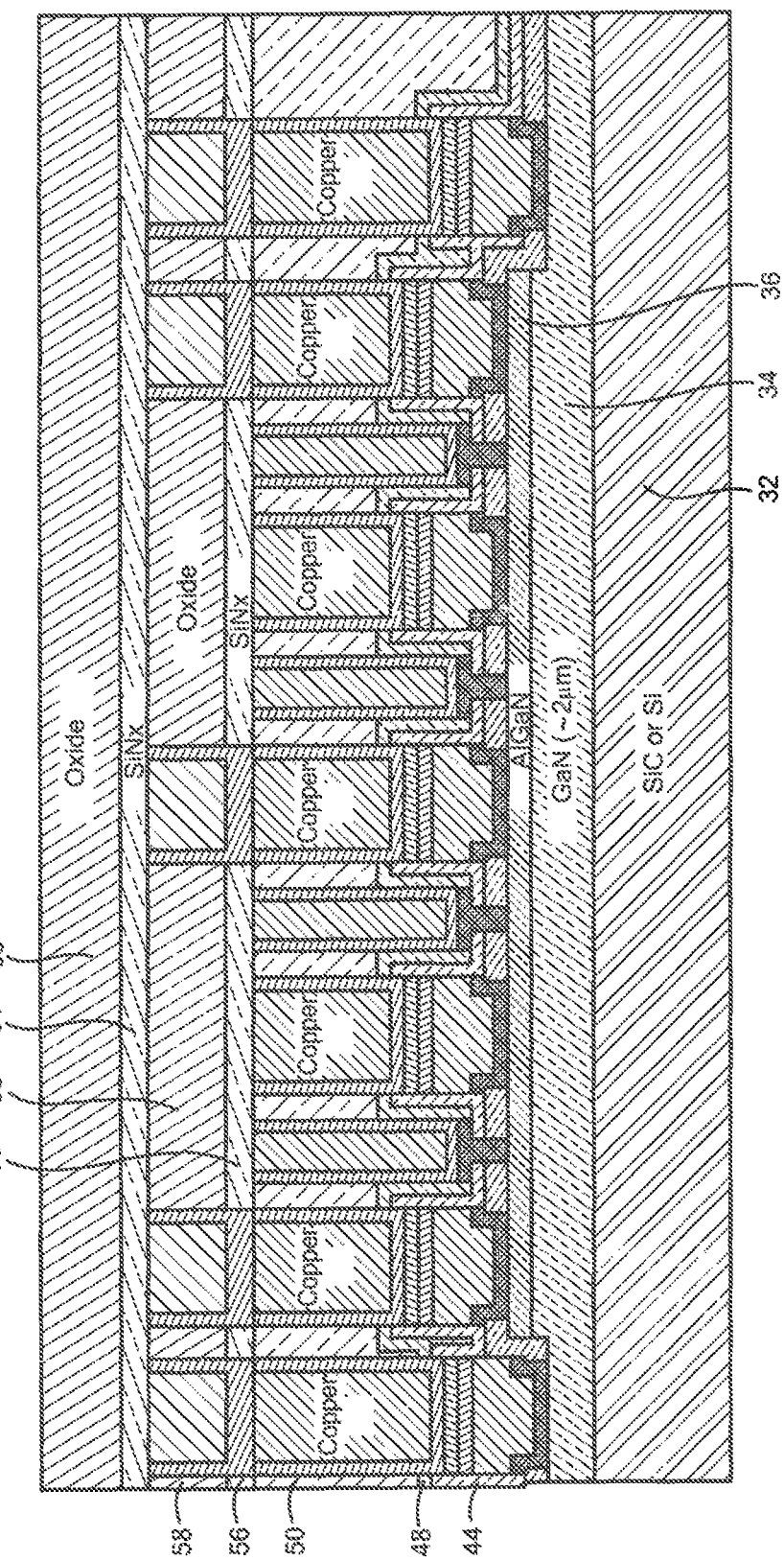

Referring now to FIG. 2N, upper electrical interconnects $62_1$-$62_5$ are formed in the windows $60_1$-$60_5$ respectively using conventional silicon foundry compatible processing techniques thereby making electrical connection to electrode contacts $54_1$-$54_{11}$ $54_1$, $54_2$, $54_6$, $54_{10}$ and $54_H$, respectively, and hence to the source electrode structures $22_1$-$22_3$ (FIG. 1B) and pads $26_1$ and $26_2$ (FIG. 1B). Each one of the upper electrical interconnects $62_1$-$62_5$ is constructed the same as each one of the electrode contacts $54_1$, $54_2$, $54_6$, $54_{10}$ and $54_{11}$ and includes an upper layer 62b of copper having the bottom and sides lined with an adhesion and copper diffusion barrier layer 62a, here for example, tantalum (Ta) or tantalum nitride (TaN) or a combination thereof.

Referring now to FIG. 2O, a dielectric layer 64, here SiNx is formed over the structure shown in FIG. 2M followed by a dielectric layer 66 of silicon dioxide.

Figure 2P:
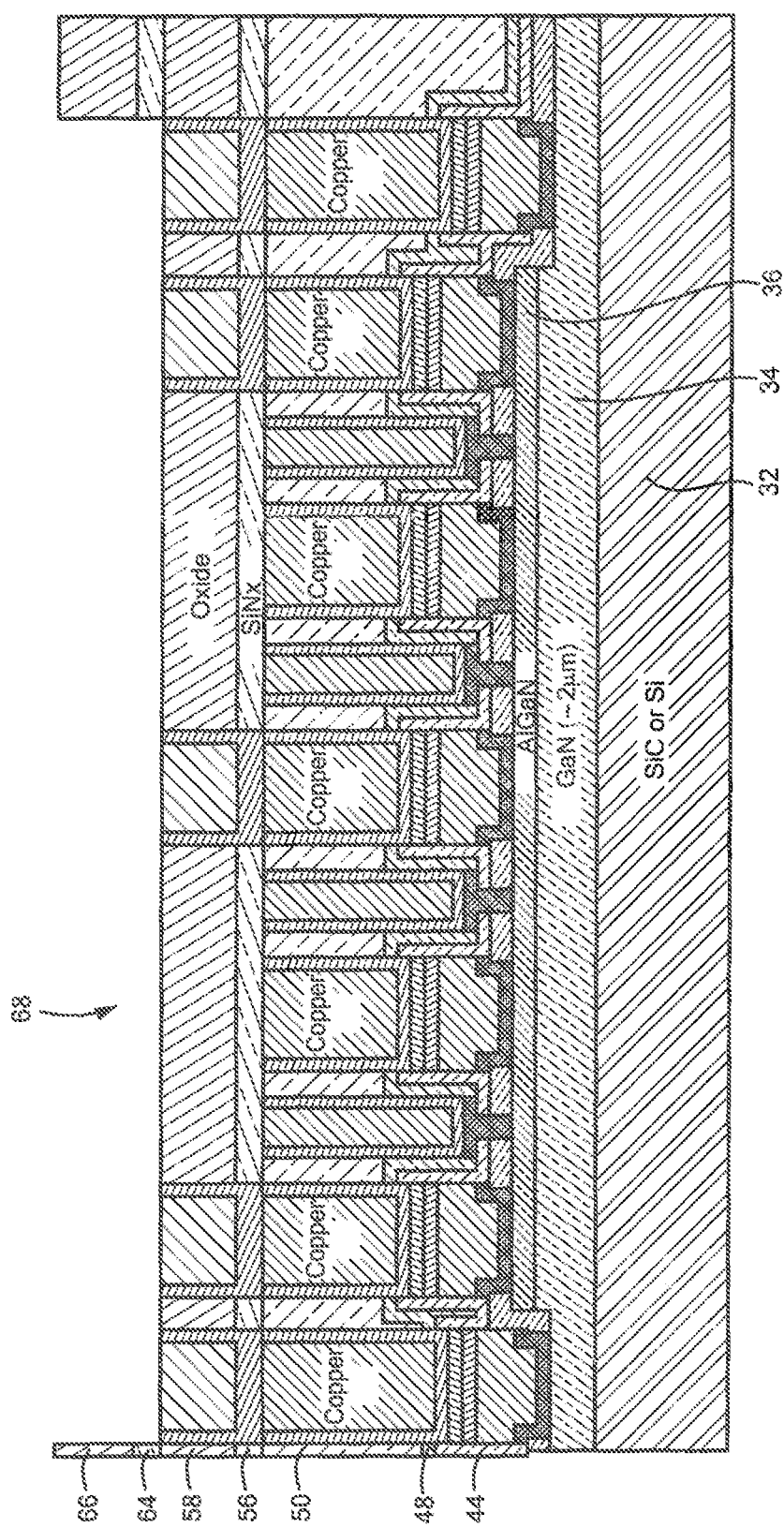

Referring to FIG. 2P, a window 68 is formed through a selected portion of the layers 64, 66 to expose the tops of upper electrical interconnects $62_1$-$62_5$.

Figure 2Q:
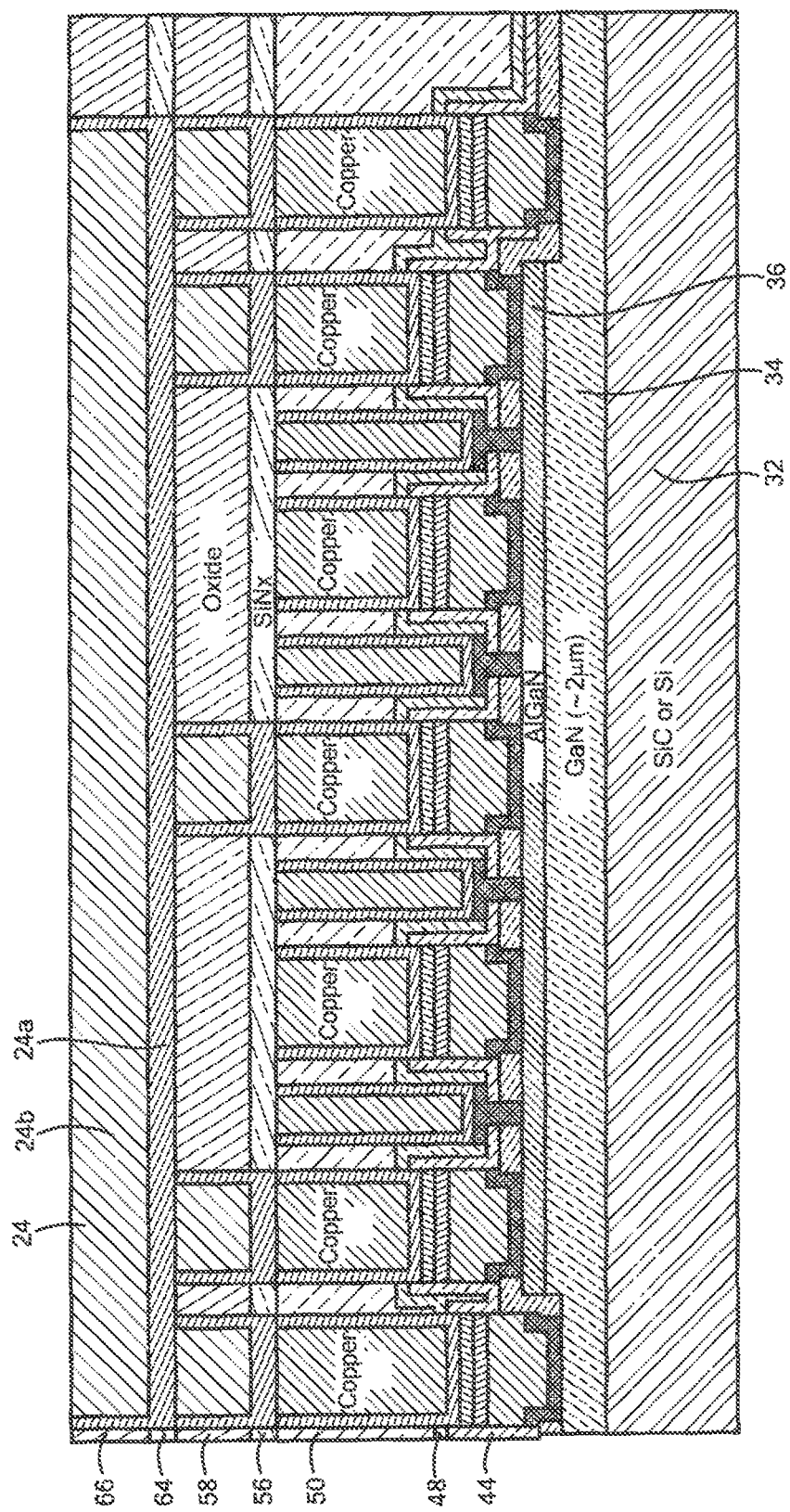
Figure 2K:
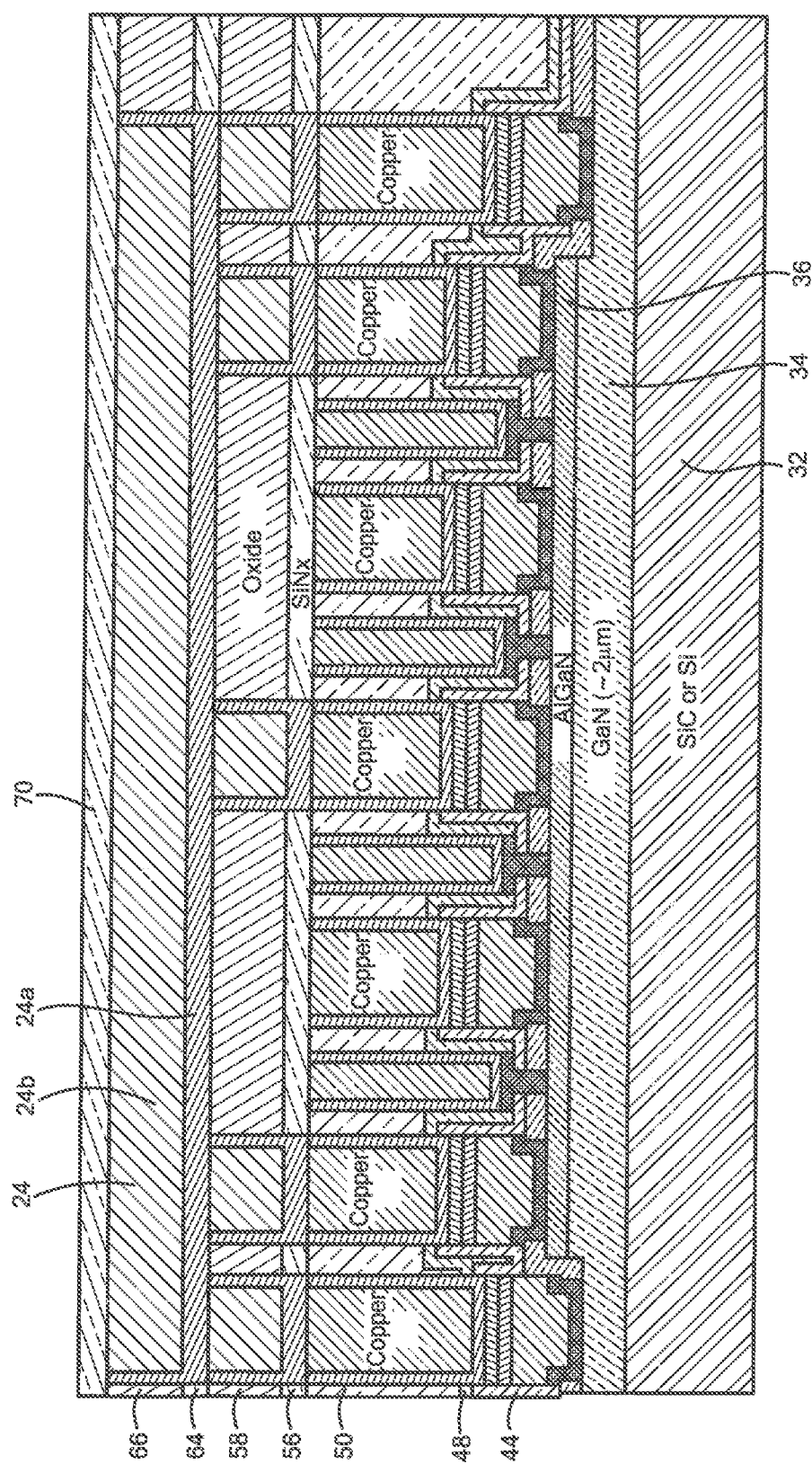

Referring now to FIG. 2Q, the conductive interconnect structure 24 (FIGS. 1A, 1B) is formed like the upper electrical interconnects $62_1$-$62_5$ includes an upper layer 24b of copper having the bottom and sides lined with an adhesion and copper diffusion barrier layer 24a, here for example, tantalum or tantalum nitride or a combination thereof.

Referring to FIG. 2R, a dielectric layer 70, here $SiN_x$ is formed over the surface of the structure shown in FIG. 2Q. It should be noted that additional Cu-based interconnect layers, if needed, may be added in a manner identical to the Cu interconnect layers described above. After the addition of the final interconnect layer, a test pad layer or Input/Output pads (not shown) may be added for facilitate final testing or connection to other circuits (not shown), respectively. At this point front-side processing is complete.

Figure 2S:
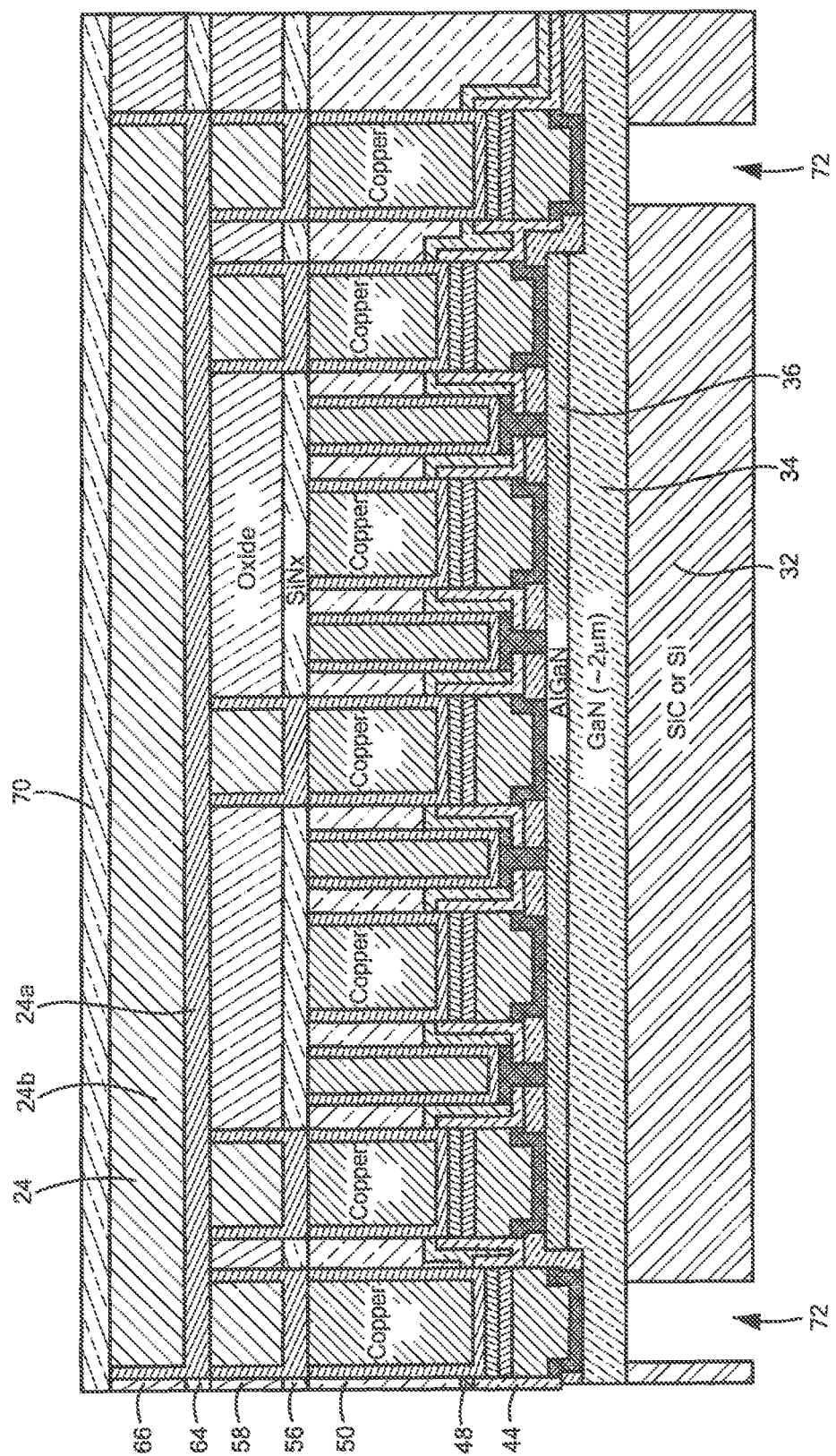

After the completion of front-side processing, and referring now to FIG. 2S, the back-side processing begins. More particularly the wafer is mounted face down on a temporary carrier, not shown, the wafer is then thinned, here for example to 50 or 100 microns. The exposed bottom surface of such structure is masked to expose portions of the bottom of the substrate 32 under the electrode contacts $54_1$ and $54_{11}$. Next, via holes 72 are formed in the exposed portions by etching from the bottom of the SiC or Si substrate 32 using a dry fluorine-based etch, here, for example sulfur hexafluoride ($SF_6$).

Figure 2T:
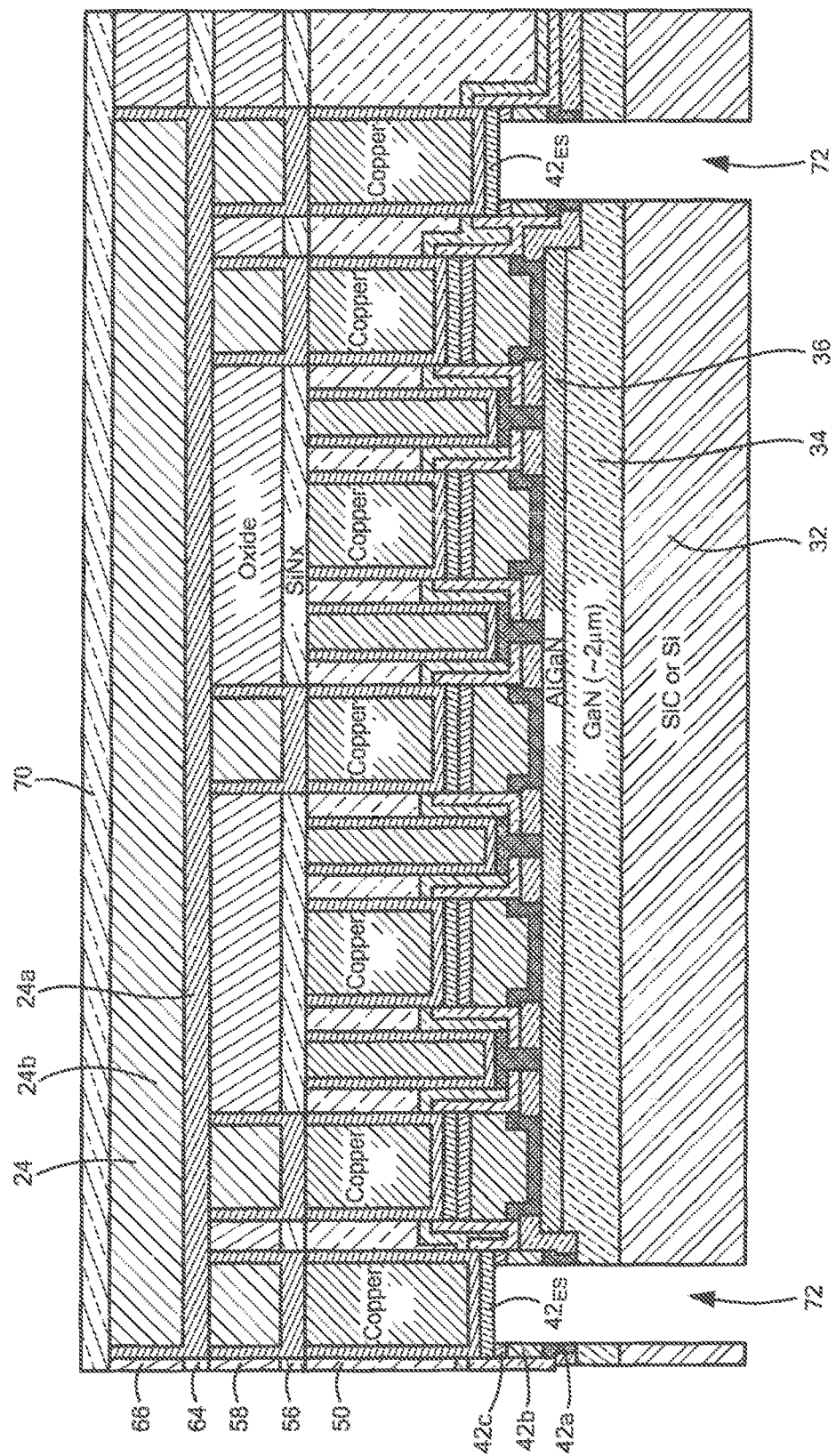

Referring now to FIG. 2T, the bottom surface of substrate 32 is exposed to a dry chlorine-based etch, here for example a combination of boron tri-chloride ($BCl_3$) and chlorine ($Cl_2$), to continue the depth of via holes 72 (as indicated by the arrows 74) by etching through the exposed portions of the Group III-N layer 34 and then through exposed inner portions of the Ti or Ta layer 42a, then through inner portions of the aluminum-based layer 42b, then through exposed inner portions of the metal nitride layer 42c of the Ohmic contact structures $42_{OC}$ of the electrode contacts $54_1$ and $54_{11}$; the etching then stopping at the etch stop layer $42_{ES}$ on the electrical contact structures 42 under the electrode contacts $54_1$ and $54_{11}$, as indicated.

Figure 2U:
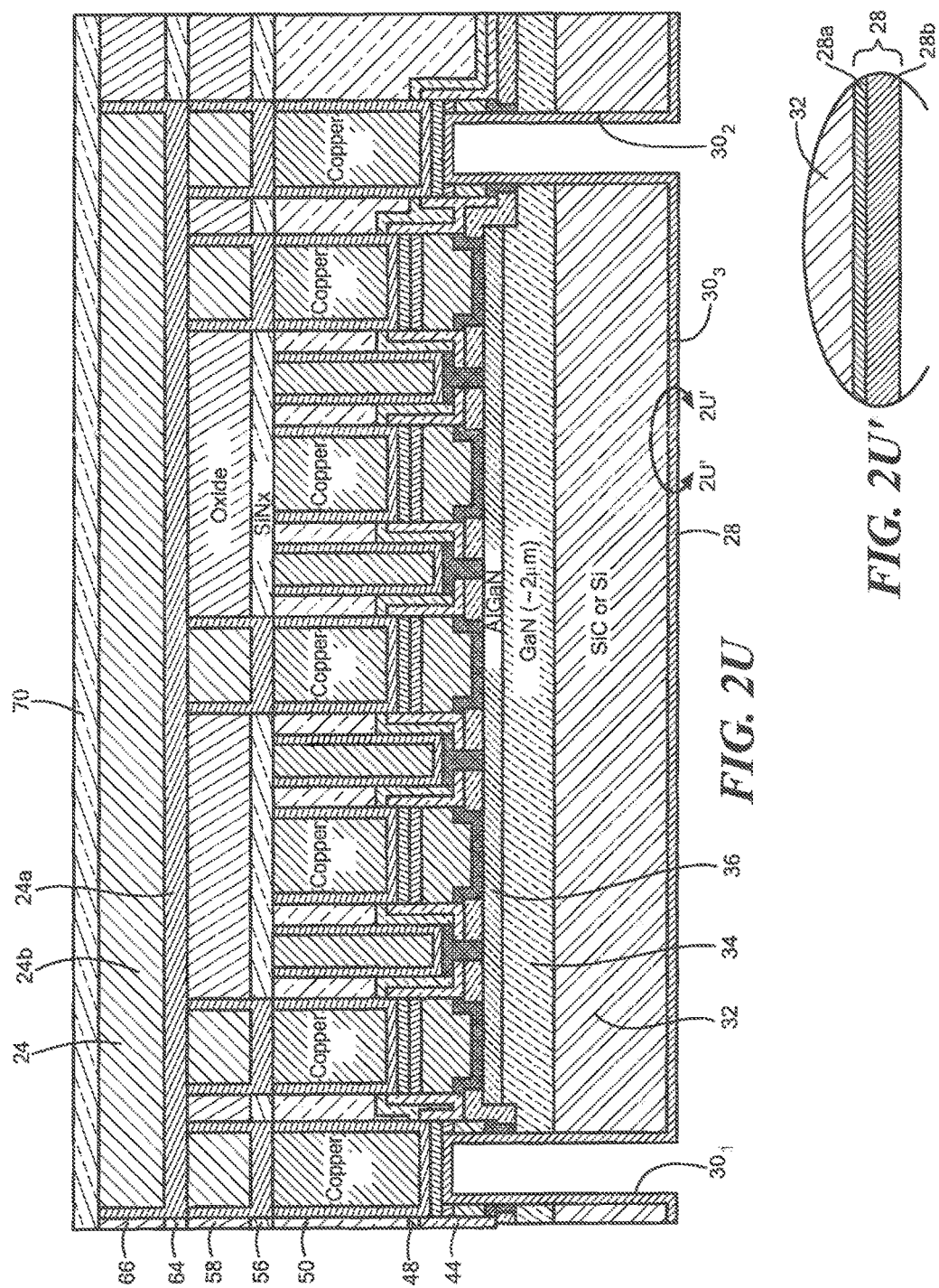

Next, referring to FIG. 2U, the bottom of the structure of FIG. 2T has the conductive layer 28 (FIG. 1A) disposed on the bottom of substrate 32 and into via hole, 72. Here, for example, the layer 28b is copper with an adhesion and copper diffusion barrier layer 28a, here for example, tantalum or tantalum nitride or a combination thereof (as shown in FIG. 2U') to form the conductive vias $30_1$ and $30_2$ (FIG. 1A) and a ground plane conductor $30_3$. The conductive vias $30_1$ and $30_2$ electrically interconnect the ground plane conductor $30_3$ to the front side metallization layers and ultimately to the interconnect source electrode structures $22_1$-$22_3$ through etch stop layer $42_{ES}$ to bottom of electrode contacts $54_1$ and $54_{11}$ (FIGS. 1A and 1B). It should be understood that the conductive vias $30_1$ and $30_2$ and ground plane $30_3$ can have layer 28 comprised of alternate metals here, for example a gold (Au) layer 28b, and a titanium (Ti) or titanium/platinum (Ti/Pt) layer 28a. In this case, the back-side processing would be performed in an area where gold would not present any contamination problems.

Thus, here, in the embodiment described above in connection with FIGS. 2A through 2U, after front-side processing and back-side wafer thinning, a back-side via hole 72 is formed using chemical dry etching with a two-step etch process that terminates on the electrically conductive etch stop layer $42_{ES}$. In the first step of the via hole etch process, via holes are formed in exposed portions of the bottom of the SiC or Si substrate layer 32 using a dry fluorine-based etch for example, sulfur hexafluoride ($SF_6$). This fluorine-based etch stops selectively on Group III-N layer 34 such as gallium nitride (GaN) and aluminum nitride (AlN). In the second step, the bottom surface of the exposed Group III-N layer in the via hole 72 is exposed to a dry chlorine-based etch, for example a combination of boron tri-chloride ($BCl_3$) and chlorine ($Cl_2$). This chlorine-based back-side via hole 72 dry etch continues the via hole etching through the Group III-N layers 34 and 36 (in the example shown in FIG. 2, "off" mesa etches only need to etch through Group III-N layer 34 after etching through substrate layer 32) and the metal to semiconductor electrical contact structure and terminates on the conductive etch stop layer $42_{ES}$ here for example nickel or molybdenum or platinum.

Figure 5A:
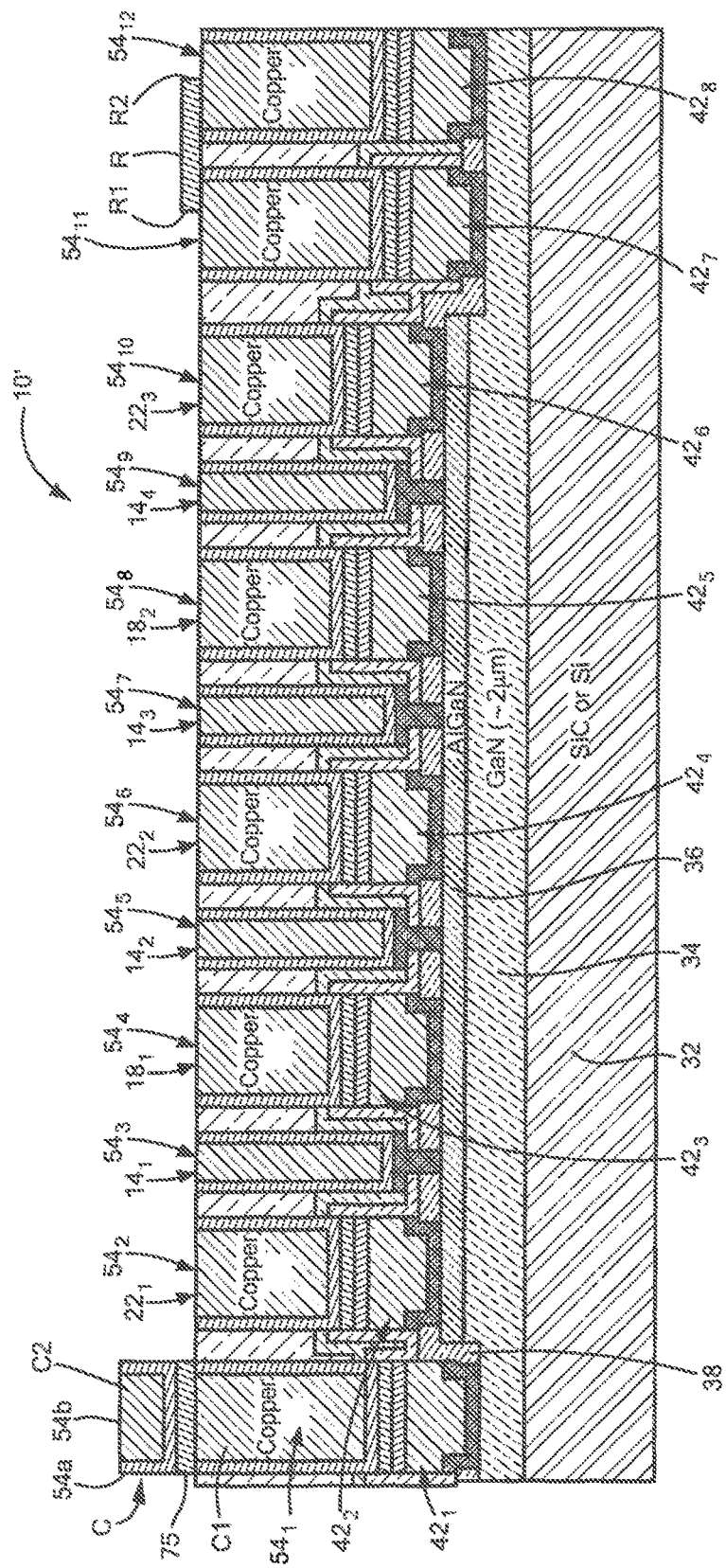
FIGS. 5A-5C are diagrammatical, cross-sectional sketches at various stages in the fabrication of a semiconductor structure according to another embodiment of the disclosure.
Figure 5A:
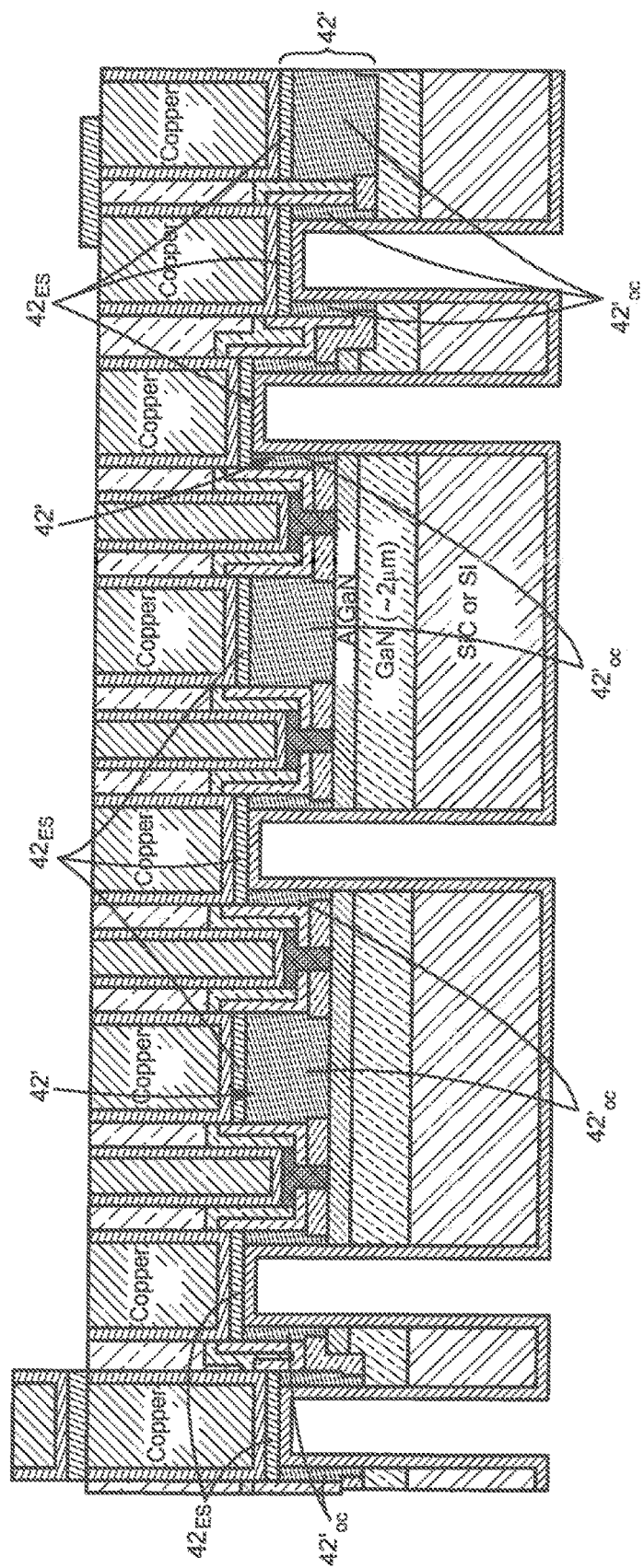
Figure 5B:
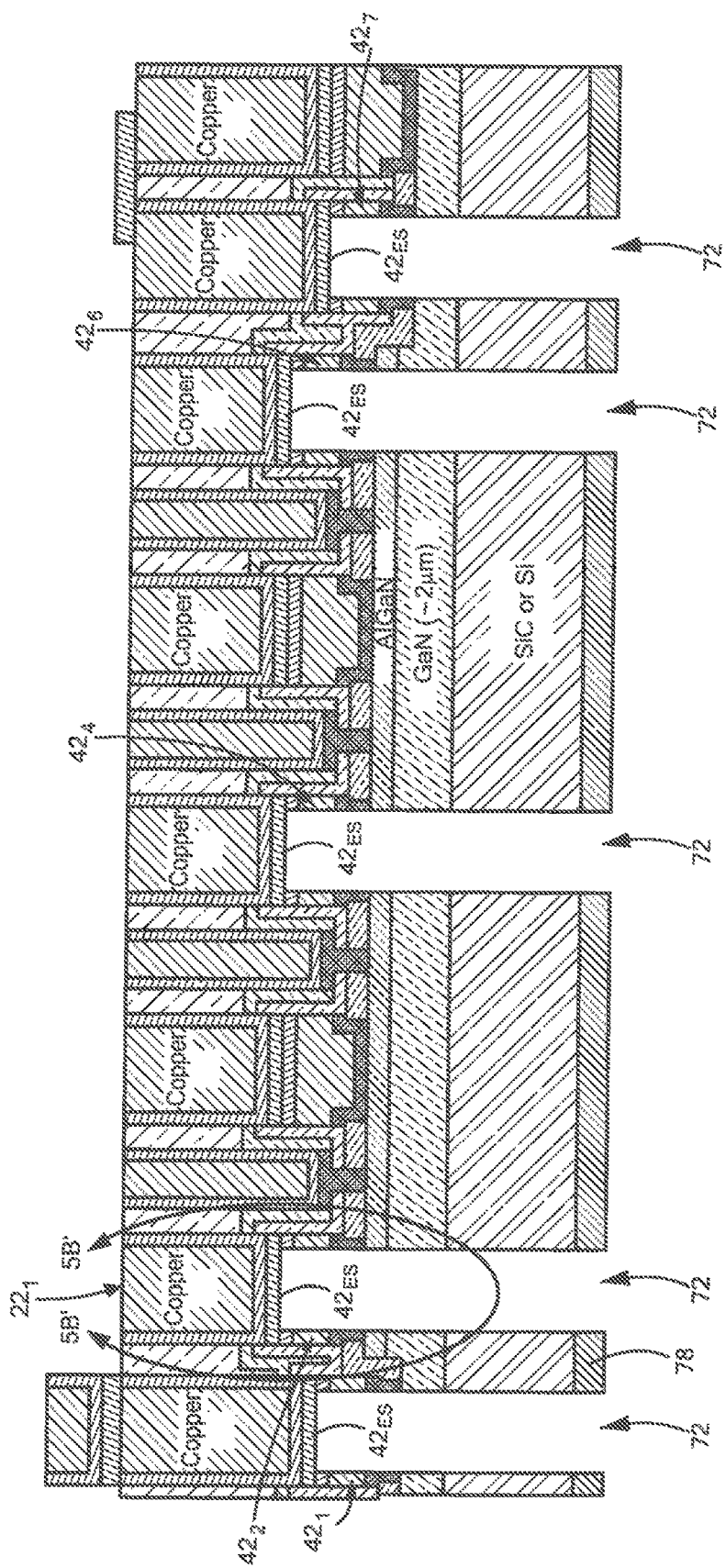
Figure 5B:
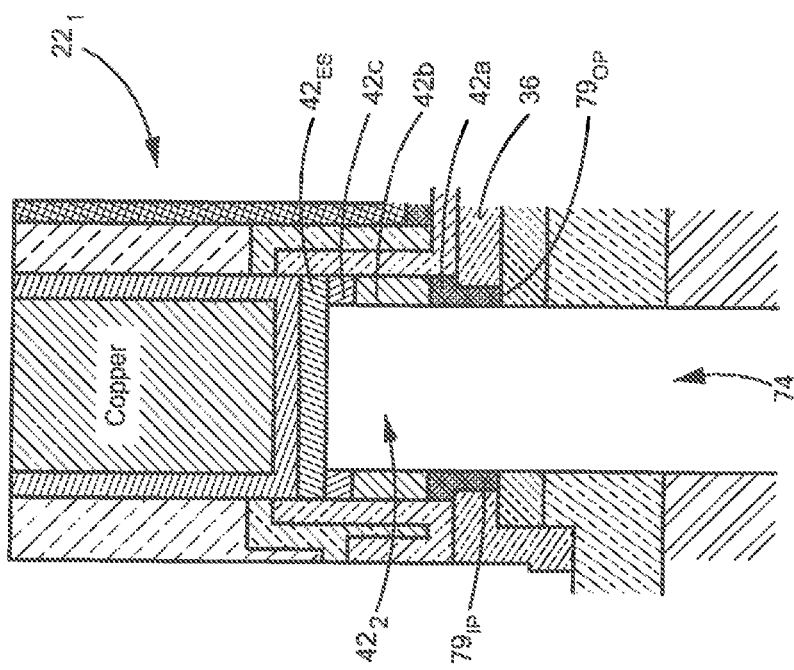
Figure 5C:
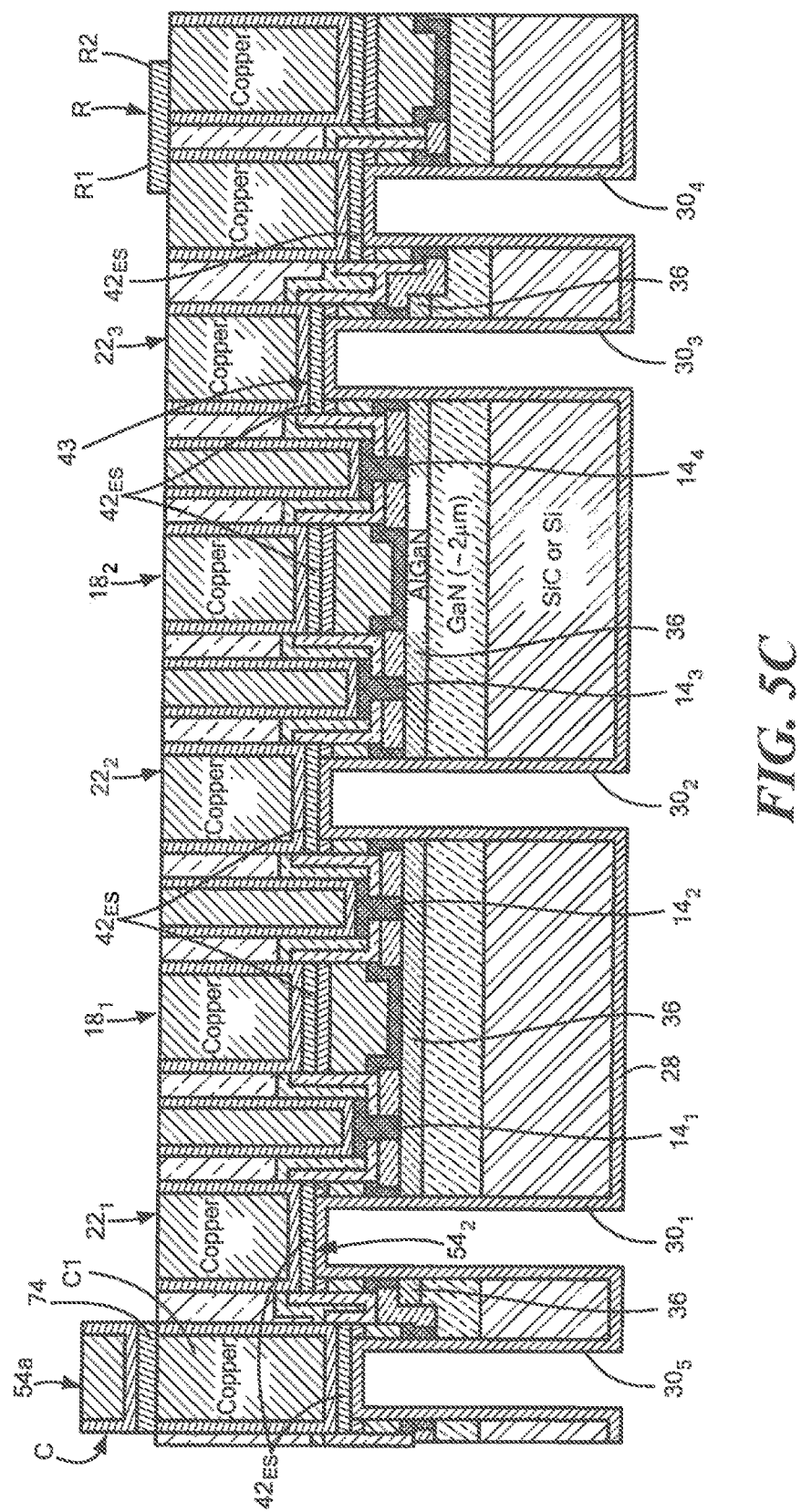

Referring now to FIG. 5A through 5C, here an embodiment is described of a portion of a MMIC structure 10', here for example having, as shown in more detail in FIG. 5A, a multi-gate HEMT FET, having: electrode contacts $54_2$, $54_6$ and $54_{10}$ disposed on electrical contact structures $42_2$, $42_4$ and $42_6$, respectively, as shown to provide gold-free source electrode structures $22_1$-$22_3$ in Ohmic contact with Group III-N semiconductor layer 36 and interconnected with gold-free conductive vias $30_1$-$30_3$ (FIG. 5C) passing through the substrate 32, the Group III-N layer 34, and the Group III-N semiconductor layer 36 to the conductive layer 28 formed on the bottom of the structure 10'; electrode contacts $54_4$, and $54_8$ disposed over electrical contact structures $42_3$, and $42_5$, respectively, as shown to provide gold-free drain electrodes structures $18_1$, $18_2$ in Ohmic contact with Group III-N semiconductor layer 36 and interconnected to the gold-free drain pad 20 (FIG. 1B) and electrode contacts $54_3$, $54_5$, $54_7$ and $54_9$ disposed over gold-free gate electrode structures $14_1$-$14_4$, respectively in Schottky contact with the Group III-N semiconductor layer 36 and connected to gate pad 16 (FIG. 1B). The structure 10' includes: a resistor R, here for example tantalum nitride (TaN), having a pair of electrodes (the opposing ends of the resistor R) R1 and R2; one of the electrodes, R1, being connected to electrode contact $54_{11}$, electrical contact $42_7$ and then to the conductive layer 28 by a conductive via $30_4$ (FIG. 5C) passing through passing through the substrate 32, and the Group III-N layer 34 to the gold-free conductive layer 28 formed on the bottom of the structure 10', and the other electrode R2 being disposed on electrode $54_{12}$, which is disposed on electrical contact $42_8$, which is disposed on Group III-N layer 34; and a capacitor C having a bottom plate C1 formed by electrode contact $54_1$ and electrical contact structure $42_1$ (FIG. 5A) and interconnected to a conductive via $30_5$ passing through the substrate 32, and the Group III-N layer 34 to the gold-free conductive layer 28 formed on the bottom of the structure 10'; an upper plate C2, here an electrical interconnect 54a having a copper layer 54b lined with layer 54a, here for example, tantalum or tantalum nitride or a combination thereof; and a dielectric 75, here for example silicon nitride, disposed between the upper plate C2 and the bottom plate C1, as shown. Finally, it should be noted that in many circuit designs, the capacitor C and resistor R need not be connected to conductive vias 30.

It is noted that the thickness of the copper forming the lower plate C1 of the capacitor C and used for the resistor R is thicker than that used for the source electrode structures $22_1$, $22_2$ and $22_3$ and drain electrode structures $18_1$ and $18_2$ for two reasons: First, the trenches formed during Damascene processing have to be deeper (unless ion implantation isolation instead a mesa as noted above, which is not shown, is used to enable planar structures) to enable "off" mesa 11 (FIGS. 1B and 2A) vertical interconnects to "on" mesa 11 electrical contact structures 42. Second, all contacts formed during metal layer deposition terminate at the same level on the upper surface of the layer due to the CMP process.

It is also noted that the electrical contact structures $42_1$-$42_8$, described above, are formed in the same manner described above in connection with FIGS. 2A-2T. Thus, the source electrode structures $22_1$, $22_2$ and $22_3$ and drain electrode structures $18_1$ and $18_2$ are in Ohmic contact with the Group III-N semiconductor layer 36 and the gate electrode structures $14_1$, $14_2$ and $14_3$ are in Schottky contact with the Group III-N semiconductor layer 36.

Next, the back-side processing proceeds as in FIGS. 2S and 2T. More particularly, the wafer is mounted face down on a temporary carrier, not shown, the wafer is thinned, here for example to 50 or 100 microns. The exposed bottom surface of such structure is masked with mask 78 and processed using conventional silicon compatible processing techniques to expose portions of the bottom of the substrate 32 disposed under the central or inner surface portions of the electrical contact structures $42_1$, $42_2$, $42_4$, $42_6$ and $42_7$, as shown, followed by, first a dry fluorine-based etch, here, for example $SF_6$, as described above in connection with FIG. 2S to etch via holes 72 through exposed portions of the substrate 32 and then a dry chlorine-based etch, here for example a combination of boron tri-chloride ($BCl_3$) and chlorine ($Cl_2$), to continue the depth of via holes 72 by etching through the exposed portions of Group III-N layers 34 and 36, then through the central or inner portions $79_{IP}$, as shown for an exemplary one of the electrical contact structures, here electrical contact structure $42_2$ (FIG. 5B') of the bottom surface of the electrical contact structures $42_1$, $42_2$, $42_4$, $42_6$ and $42_7$ and stopping at the etch stop layer $42_{ES}$ (here for example nickel or molybdenum or platinum) of structures, as described above in connection with FIG. 2T. It is noted that outer portions $79_{OP}$ of the bottom surface of the electrical contact structures $42_2$, $42_4$, $42_6$ remain un-etched and therefore remain in ohmic contact with the Group III-N layer 36.

Next, referring to FIG. 5C, the mask 78 is removed and the back-side process is performed as described in connection with FIG. 2U. Thus, the bottom of the structure of FIG. 5B has conductive layer 28 formed over it and over the sides and bottom surface of then extended via holes 72, as described above in connection with FIG. 2U' to form conductive vias $30_1$-$30_5$ over the exposed electrically conductive etch stop layers $42_{ES}$ to electrically interconnect the source electrode structures $22_1$-$22_3$, the bottom plate C1 of capacitor C and the electrode R1 of resistor, as shown.

It is noted that here the electrical contact structures 42' could be a single Ohmic contact layer $42'_{OC}$, here a silicide layer, here for example nickel silicide (NiSi) or cobalt silicide ($CoSi_2$), as shown in FIG. 5A'. Further, the silicide layer Ohmic contact structure $42'_{OC}$ may also be doped to further improve contact resistance. In the case of NiSi, for example it could be doped with phosphorus (P), arsenic (As), antimony (Sb) or a combination thereof. In order to form the Ohmic contact structure $42'_{OC}$, Si and Ni or Co is deposited, etched back and then alloyed. In the case of NiSi the alloy temp here for example is ~450° C. In the case of $CoSi_2$ a two-step anneal, here for example ~550° C. followed by ~700° C., is used. In order to facilitate better Ohmic contact to the Group III-N layer 36, the silicide layer, Ohmic contact structure $42'_{OC}$ may be recessed into the Group III-N semiconductor layer 36 so that the bottom surface of silicide layer Ohmic contact structure $42'_{OC}$ is 2-20 nm from the bottom surface of the Group III-N layer 36. It is noted that the etch stop layer $42_{ES}$ is disposed on the Ohmic contact structure $42'_{OC}$, as shown. Here the electrical contact structure includes an Ohmic contact structure $42'_{OC}$ having an etch stop layer $42_{ES}$ on the Ohmic contact structure $42'_{OC}$.

Figure 6C:
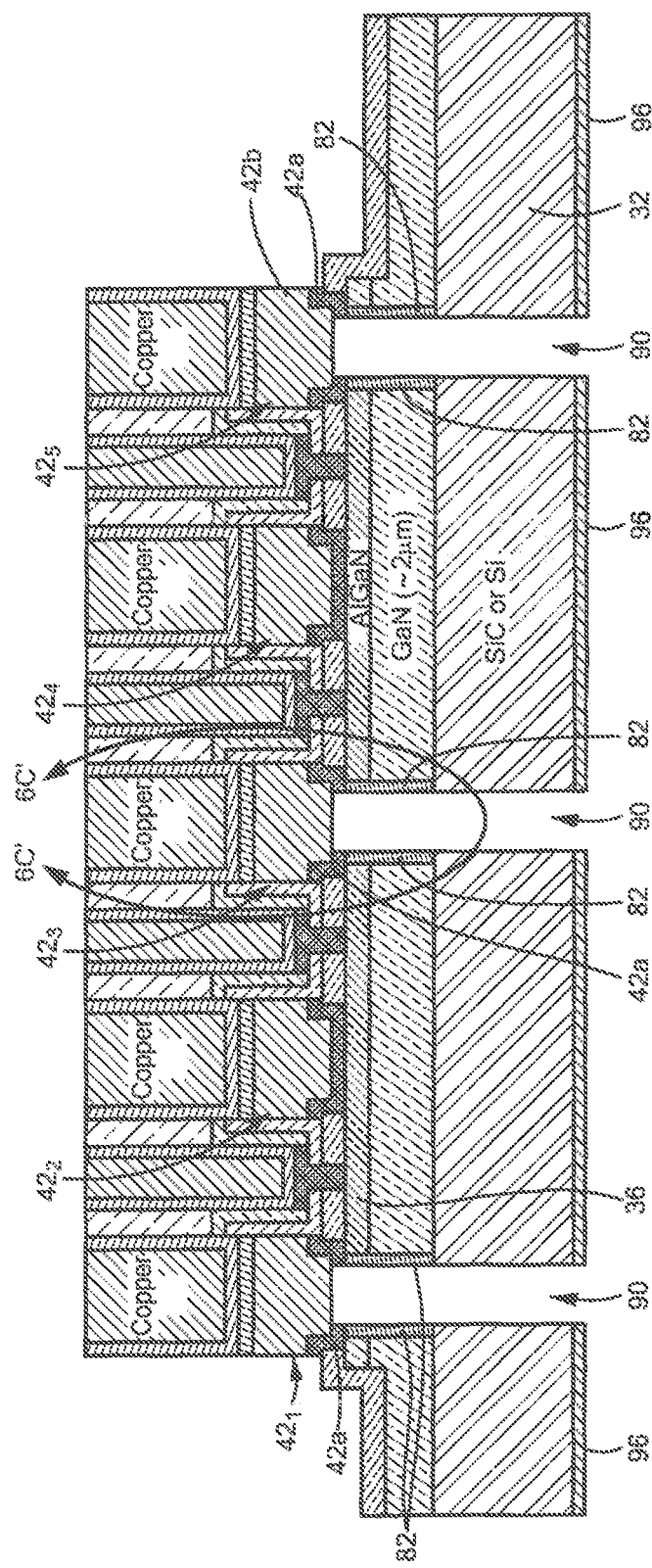

Referring now to FIGS. 6A-6D another embodiment is described. Here, again, as in FIG. 6A, a structure 10'' is shown having substrate 32 here for example, Si or SiC; a mesa shaped (defined by etching or implant isolation, as noted above), Group III-N semiconductor layer 34 on an upper portion of the substrate 32, here Group III-N layer 32 is, for example, a layer of gallium nitride (GaN) having a thickness of approximately 1-5 microns over the upper surface of the substrate 32, as shown, and a Group III-N semiconductor layer 36, here $Al_xGa_{1-x}N$, for example having a thickness of approximately 5-30 nm, on the upper surface of Group III-N layer 34. As will be described below, the structure 10'' will be processed to form a multi-gate HEMT. Here, however, apertures 80 are etched, using conventional silicon foundry compatible subtractive patterning (lithography and etching) techniques and here, for example a combination of boron tri-chloride ($BCl_3$) and chlorine ($Cl_2$) dry etching, in portions of the Group III-N layers 34 and 36 where electrically conductive vias 90, to be described in connection with FIGS. 6B and 6C, are to be formed to electrically interconnect the sources electrode structures $22_1$-$22_3$ (FIG. 1B).

Referring to FIG. 6B, the apertures 80 are filled with a semiconductor or dielectric or metal material 82 that can be dry etched in fluorine containing gasses, here for example SiNx, $SiO_2$, molybdenum or polysilicon or a combination thereof. The structure is processed as described above in connection with FIGS. 2B-2K to form electrical contact structures $42''_1$-$42''_5$; it being noted that here the electrical contact structures $42''_1$-$42''_5$ do not include a separate etch stop layer, such a etch stop layer $42_{ES}$ as described above in connection with FIGS. 2A-2U; rather, in this embodiment the aluminum or Si doped aluminum $Al_{1-x}Si_x$ layer 42b (where the Si doping, x, is typically ≤0.05) layer of the Ohmic contact structure $42''_{OC}$ of the electrical contact structures $42''_1$-$42''_5$ functions, as will be described in connection with FIG. 6B, as an etch stop layer. Electrode contacts $54_1$, $54_3$, $54_5$, $54_7$ and $54_9$, respectively are disposed on the top of Ohmic contact structures $42_{OC1}$-$42_{OC5}$, respectively, as indicated. Electrical contact structures $42''_1$, $42''_3$ and $42''_5$ are for the source electrode structures $22_1$-$22_3$ and electrical contact structures $42''_2$ and $42''_4$ are drain electrode structures $18_1$, $18_2$ (FIG. 1B). It is noted that the bottom surface of the electrical contact structures $42''_1$, $42''_3$ and $42''_5$ are larger in surface area than the surface area of the semiconductor or dielectric or metal material 82, with the outer surface portions of the electrical contact structures $42''_1$, $42''_3$ and $42''_5$ being in Ohmic contact with the Group III-N semiconductor layer 36, as shown. Gate electrode structures $14_1$-$14_4$ are in Schottky contact with the Group III-N semiconductor layer 36, as shown, and have thereon electrode contacts $54_2$, $54_4$, $54_6$, and $54_8$, as shown.

The Ohmic contact structure layers 42a, 42b, and 42c of the electrical contact structures $42''_1$-$42''_5$ and the electrode contacts have been described above in connection with FIG. 3B with the Ohmic contact structure $42_{OC1}$-$42_{OC5}$ having: a bottom layer 42a of Ti or Ta (which may be recessed into the upper surface portions of the Group III-N semiconductor layer 36); a middle layer 42b of an aluminum-based layer, here aluminum or Si doped aluminum $Al_{1-x}Si_x$ layer; and an upper layer 42c of tantalum or metal nitride layer, here for example tantalum (Ta), tantalum nitride (TaN) or titanium nitride (TIN) on the aluminum or Si doped aluminum $Al_{1-x}Si_x$ layer; and the electrode contacts $54_1$-$54_9$ having an electrically conductive metal interconnect contact, here for example copper having the sides and bottom lined with a diffusion barrier layer, here for example, tantalum or tantalum nitride or a combination thereof. Thus, as will be discussed more detail below, relating to the back-side processing, it is noted that in this embodiment, there is no separate etch stop layer $42_{ES}$ (described above in connection with FIGS. 2A-2U); rather, because of the fluorine chemical etchant used to form the vias 90 (FIG. 6C) in this embodiment, the etch stop layer is provided by layer 42b, here for example aluminum (or Si doped Aluminum $Al_{1-x}Si_x$), of electrical contact structures 42".

Next, the back-side processing proceeds as in FIG. 2U. More particularly the wafer is mounted face down on a temporary carrier, not shown, the wafer is thinned, here for example to 50 or 100 microns. The exposed bottom surface of such structure is masked by a mask 96 (FIG. 6C) to expose portions of the bottom of the substrate 32 under the source electrode structures $22_1$-$22_3$. It should be noted that outer peripheral portions of the semiconductor or dielectric or metal material 82 Are covered by the mask 96; and hence under the inner portions $81_{IP}$ (FIG. 6C') of the electrical contact structures 42 while the other portions $81_{OP}$ of the electrical contact structures 42 remain in Ohmic contact with layer 36. Next, vias 90 are etched using a dry fluorine-based etch, here for example $SF_6$ to etch the vias 90 through the substrate layer 32 and through the inner portions of the material 82 (here for example SiNx, SiO2, molybdenum or poly silicon in FIG. 6C'), inner portions $81_{IP}$ of the bottom layer 42a of Ti or Ta (which may be recessed into the upper surface portions of the Group III-N semiconductor layer 36) and then stopping at inner portions of the Aluminum-based layer 42b whose fluorine-based etch byproducts are non-volatile. Thus, here there is no additional (separate) etch stop layer $42_{ES}$; rather layer 42b functions as an etch stop layer.

Figure 6D:
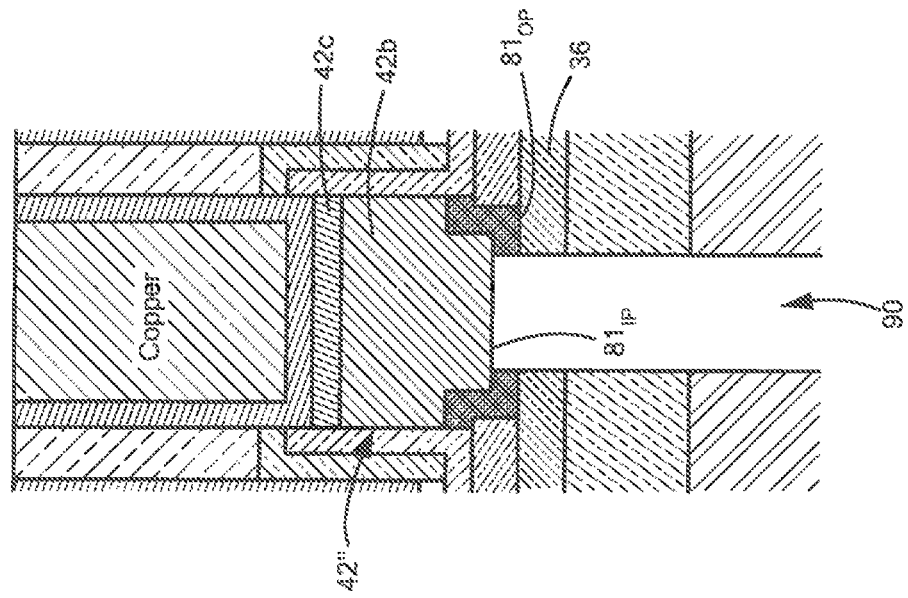
Figure 6C:
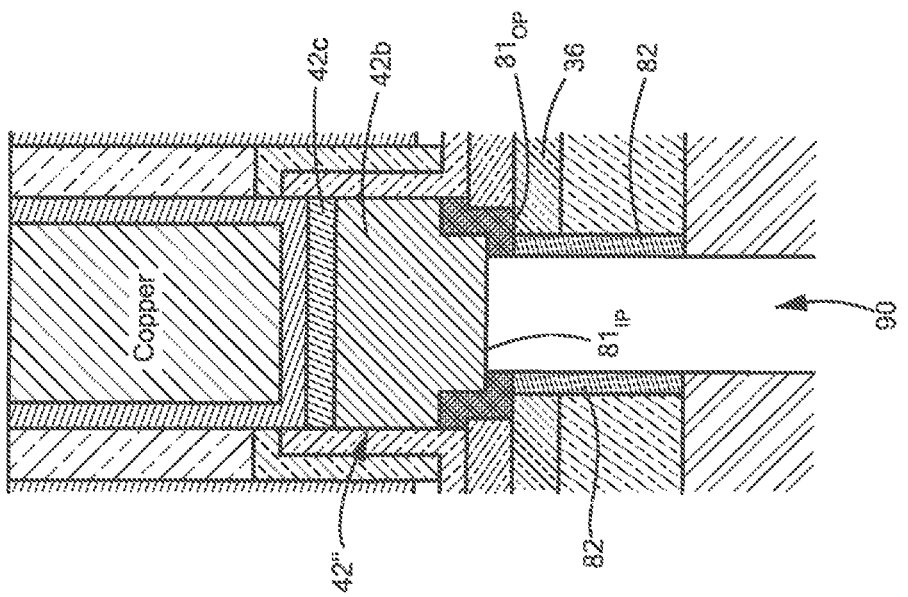
Figure 6D:
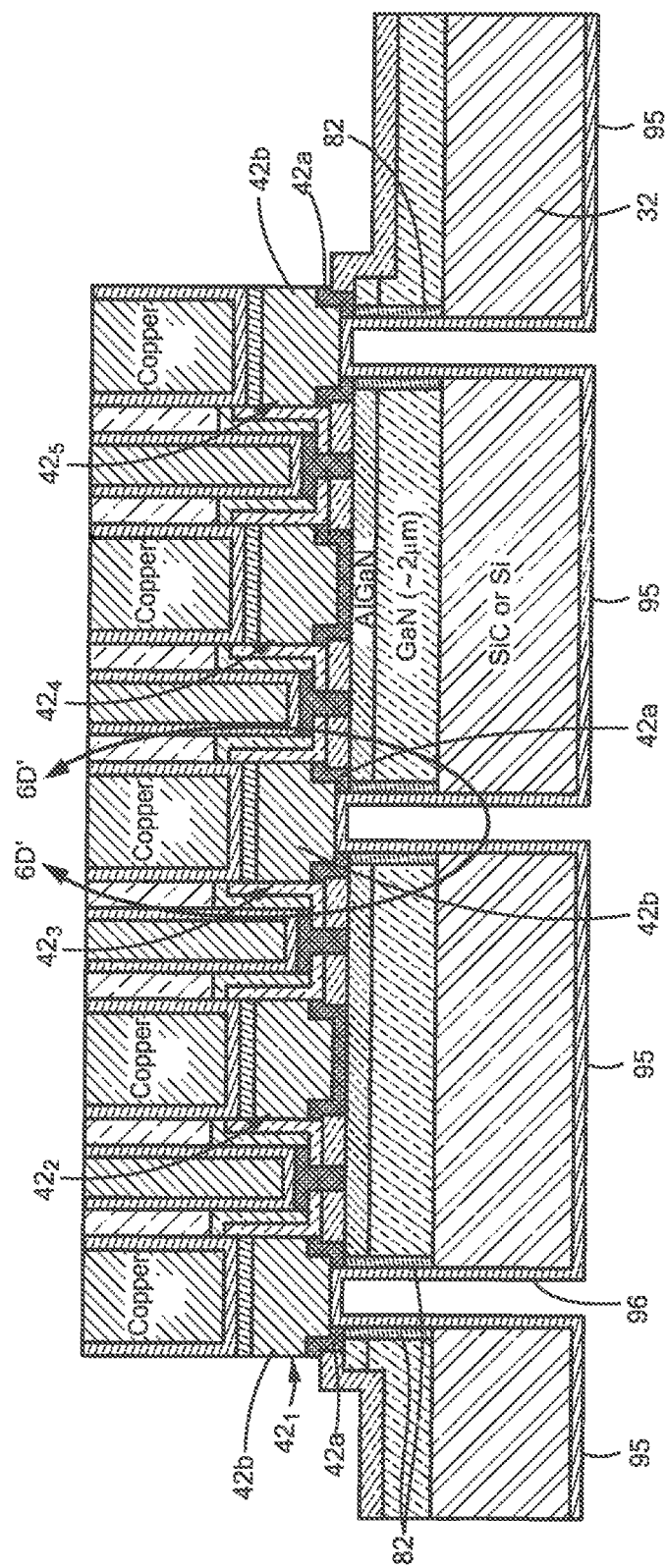

Next, referring to FIG. 6D, the bottom of the structure of FIG. 6C has a conductive layer 28, here for example copper-based, is formed over it and over the sides and bottom surface of then extended via holes 90 to form conductive vias 96 and a ground plane conductor 95, as described above in connection with FIG. 2U, for the structure to electrically interconnect the inner or central portions of the electrical contact structures 42" as shown, and therefore interconnect the source electrode structures $22_1$-$22_3$. In this embodiment, the Group III-N material is etched from the front-side of the wafer, as described above in connection with FIG. 6A prior to back-side processing and via 90 formation. The apertures 80 (FIG. 6A) are then filled with a material layer 82 (here for example SiNx, $SiO_2$, molybdenum or polysilicon) that can be etched with fluorine-based dry etch chemistries. Assuming that all the layers that need to be etched to form the via 90 are now the substrate 32 (silicon, silicon carbide (SiC), silicon dioxide ($SiO_2$), silicon nitride ($SiN_x$) or a combination thereof) and the aperture semiconductor or dielectric or metal material 82 (here for example SiNx, SiO2, molybdenum or polysilicon), those layers can now all be etched using the fluorine-based etchants. As a result, a fluorine-based etch is then used for the entire via etch process.

Referring now FIG. 6D' another embodiment is described. In this embodiment the via 96 is etched wider than in FIG. 6D; however, here again the etching stops at the inner portions of the Aluminum based layer 42b. Thus again there is no additional (separate) etch stop layer $42_{ES}$; rather layer 42b functions as an etch stop layer. In this case (FIG. 6D') there is no remaining dielectric layer 82 in the via 90 (as shown in FIG. 6C').

Referring now to FIGS. 7A-7G, another embodiment is shown. Here the structure 10"' shown in FIG. 2B is processed as described in connection with FIG. 2C except only windows $40_2$-$40_6$ are formed, as shown. After forming windows $40_2$-$40_6$, an etch stop layers $42_{ES}$', here for example, silicon dioxide or $SiN_x$, are formed using conventional silicon (Si) foundry compatible (subtractive) lithography and etch processing techniques, on the inner surface portions of layer 36 exposed by the windows $40_2$, $40_4$, $40_6$; it being noted in FIG. 7B that outer surface portions of the exposed surface of layer 36 are void of the etch stop layers $42_{ES}$'. Alternately, but not shown, etch stop layers $42_{ES}$' could be formed on the inner surface portions of layer 36 exposed by all windows 40.

Figure 7A:
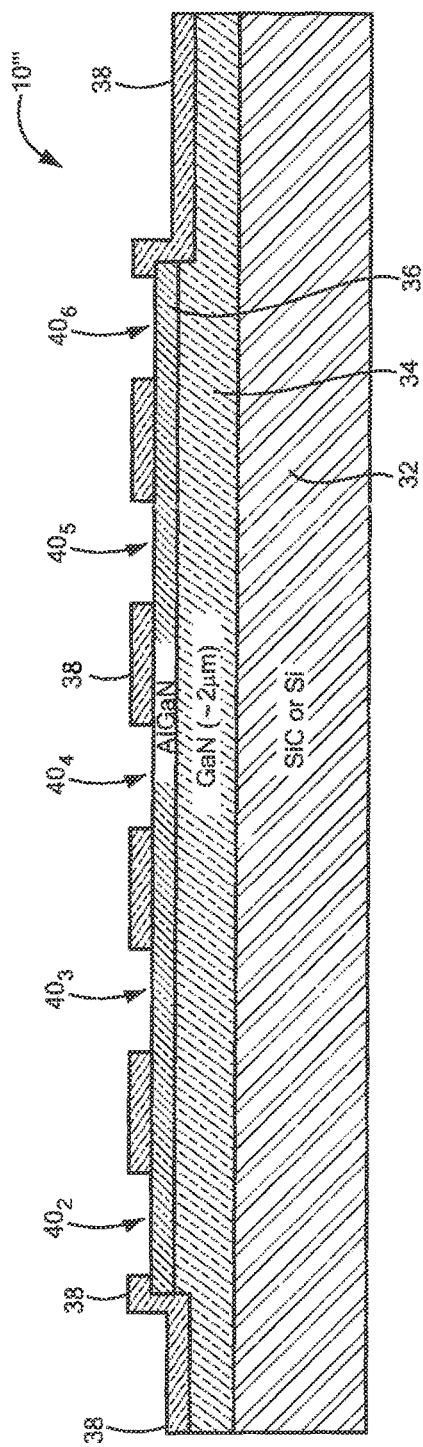
FIGS. 7A-7G are diagrammatical, cross-sectional sketches at various stages in the fabrication of a semiconductor structure according to another embodiment of the disclosure.
Figure 7B:
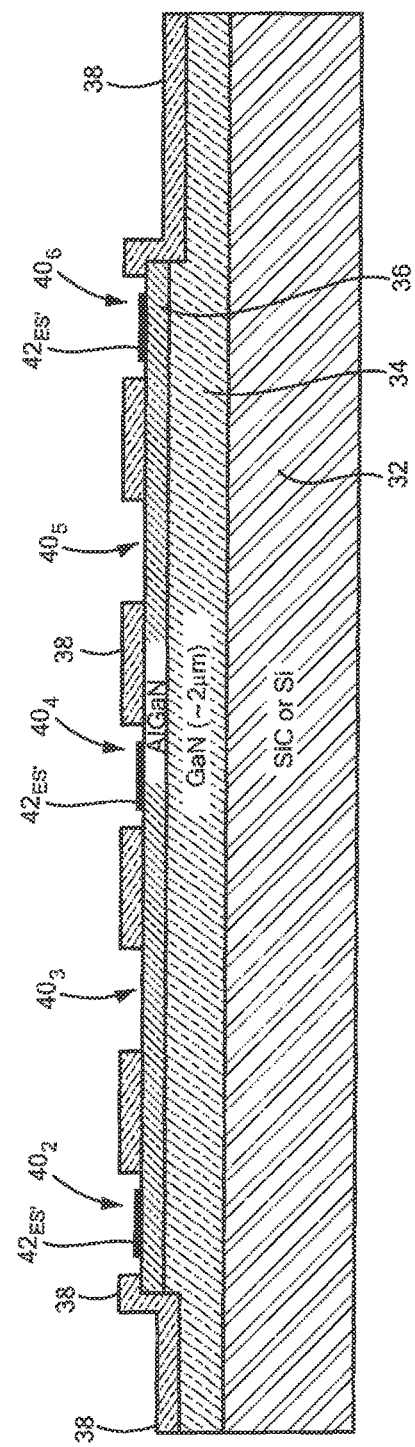
Figure 7C:
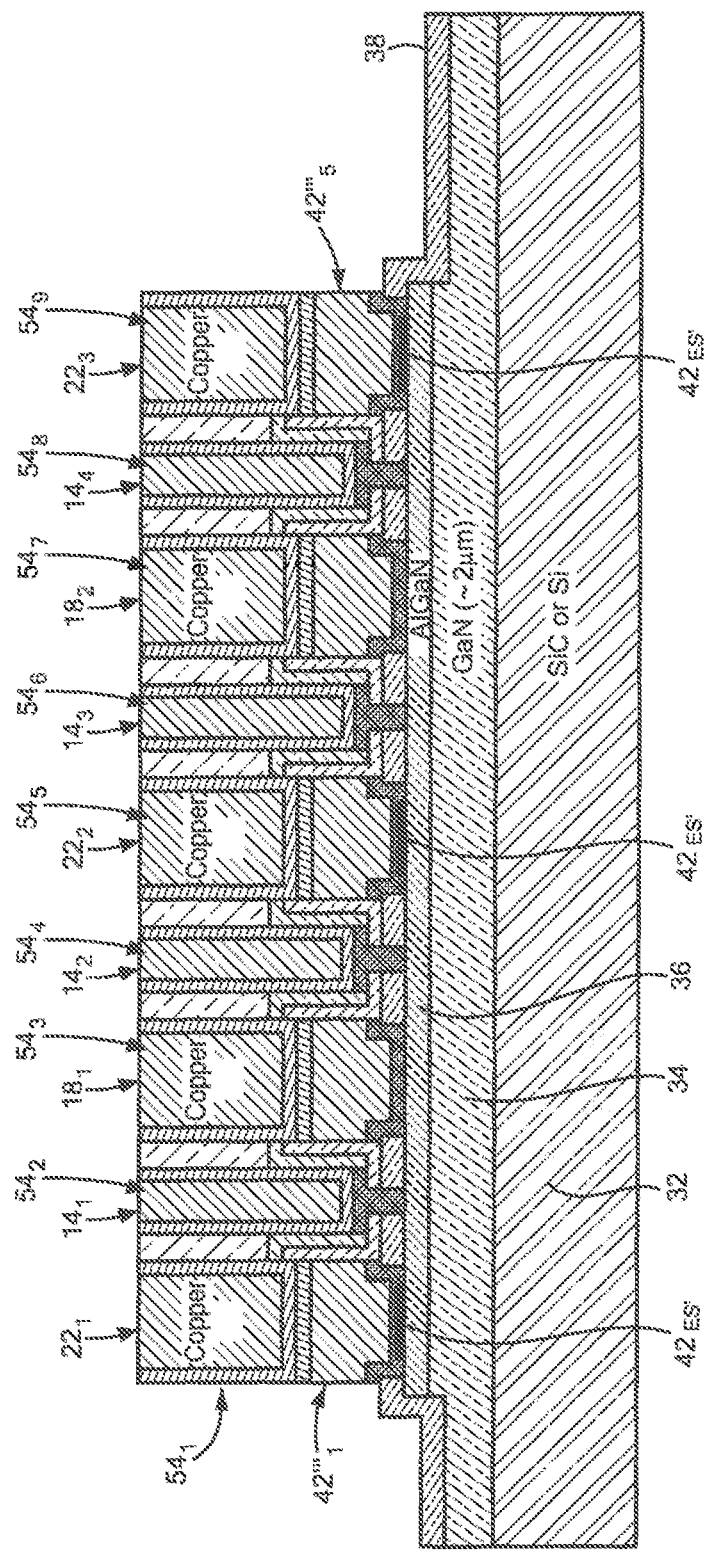

Referring now to FIG. 7C, layers 42a, 42b and 42c are now formed over the etch stop layers $42_{ES}$'; it being noted that outer peripheral portions of the layers 42a, 42b and 42c are in direct contact with layer 36. Thus, after an anneal process described above in connection with FIGS. 4A, 4A' and 4B, 4B', Ohmic contact is formed between the outer peripheral portions of layers 42a, 42b and 42c and Group III-N layer 36. It should be noted that here the electrical contact structures $42'''_1$, $42'''_3$, and $42'''_5$ include an etch stop layer, here etch stop layer $42_{ES}$', that is under the inner portions of layers 42a, 42b and 42c; rather than on top of layers 42a, 42b, and 42c. Thus, while, as noted above in connection with FIG. 3B where the electrical contact structure 42"' included etch stop layer $42_{ES}$ on top of layer 42c (on top of the electrical contact structure 42); here, as shown in FIG. 3B', the etch stop layer $42_{ES}$' of the electrical contact structure 42' used in FIGS. 7A-7F is under the inner or central portion of layer 42a of the electrical contact structure 42''').

It is also noted in FIG. 7C that electrode contacts $54_1$-$54_9$ simultaneously form the upper layers of the source electrode structures $22_1$-$22_3$, drain electrode structures $18_1$, $18_2$, and gate electrode structures $14_1$-$14_4$, as shown.

Figure 7D:
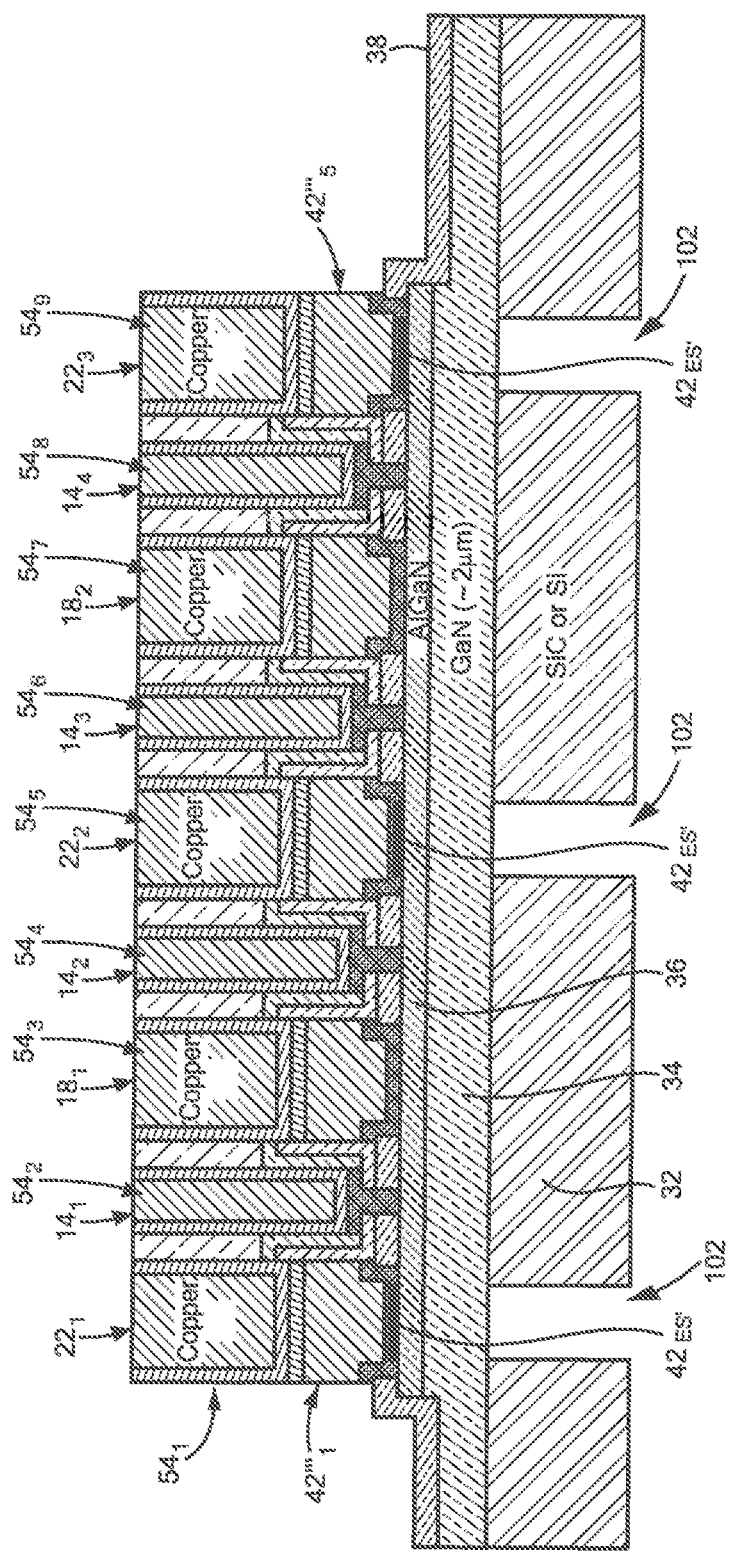

Referring now to FIG. 7D, after the completion of front-side processing, and referring now to FIG. 2S, the back-side processing begins. More particularly the wafer is mounted face down on a temporary carrier, not shown, the wafer is then thinned, here for example to 50 or 100 microns. The bottom surface of the structure is masked with windows therein disposed under the etch stop layers $42_{ES}$'. An etchant, here for example, fluorine, is used to etch via 102 through the substrate 32, as shown.

Figure 7E:
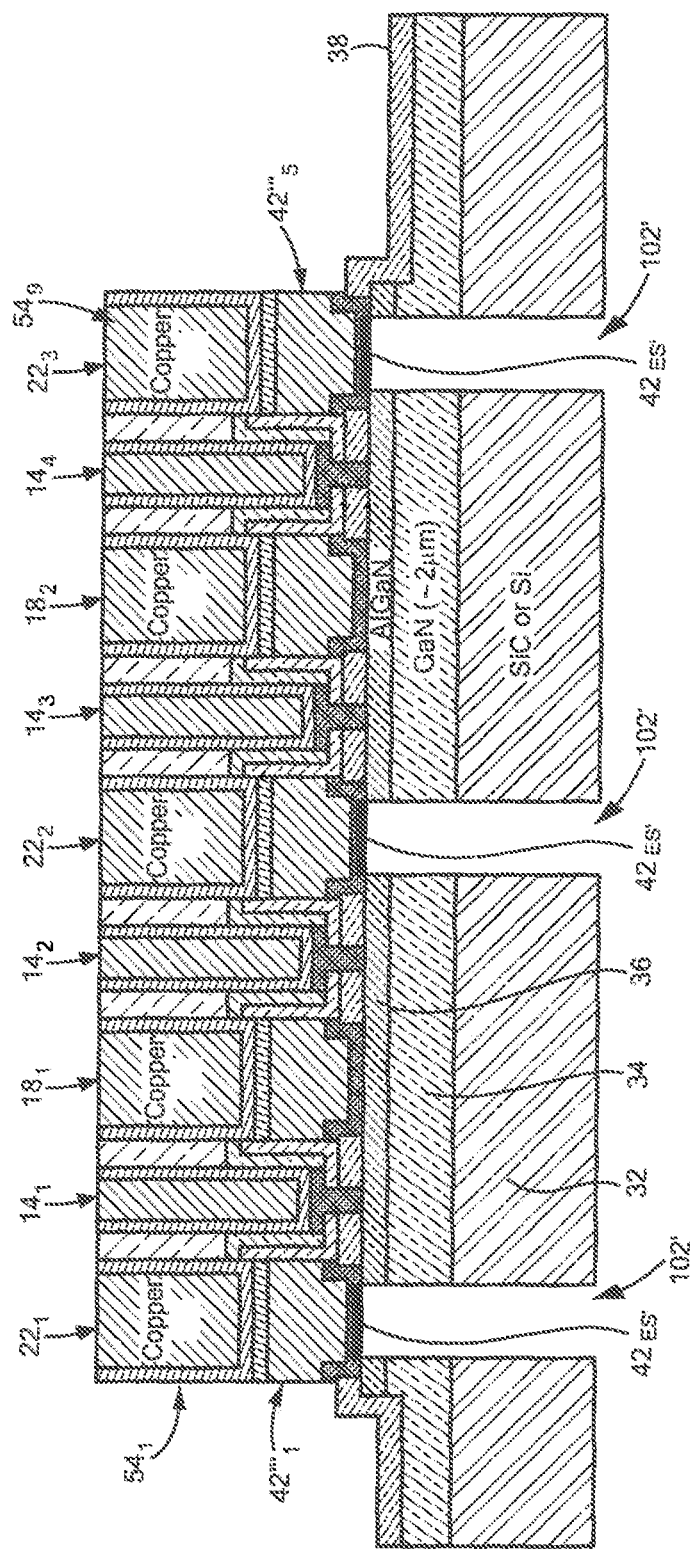
Figure 7F:
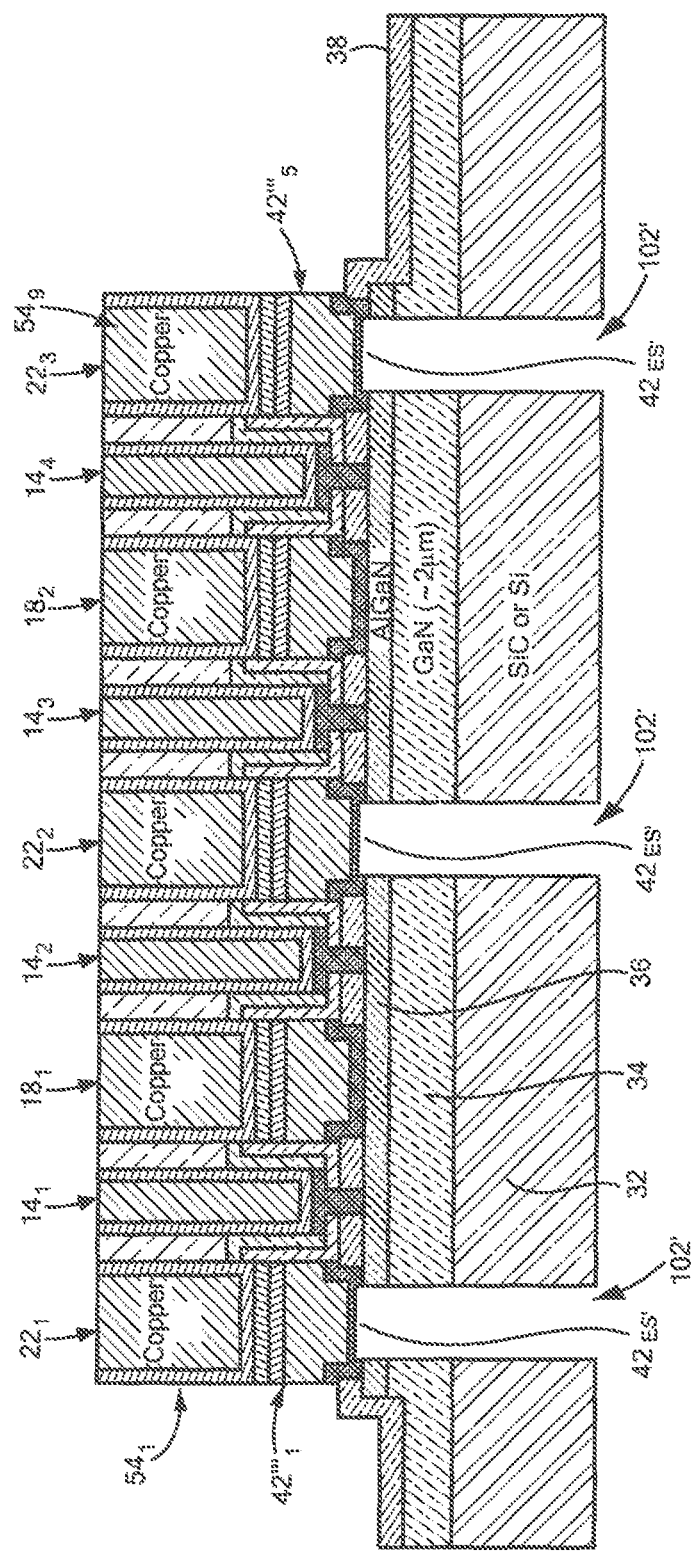

Referring now to FIG. 7E, a chlorine-based etchant such as $BCl_3$ and $Cl_2$ are used to extend the vias 102 to via 102'; as shown, such etching stopping at the etch stop layers $42_{ES}$', as shown. Next, the etch stop layer $42_{ES}$' is removed from the bottom of the via hole 102' using dry etch chemistries that are fluorine-based when either $SiO_2$ or $SiN_x$ is used as a layer $42_{ES}$' etch stop. Fluorine-based wet etches are suitable for removing $SiO_2$ and $Al_2O_3$ layer $42_{ES}$' etch stops, and some $SiN_x$ layer $42_{ES}$' etch stops, as shown in FIG. 7F.

Figure 7G:
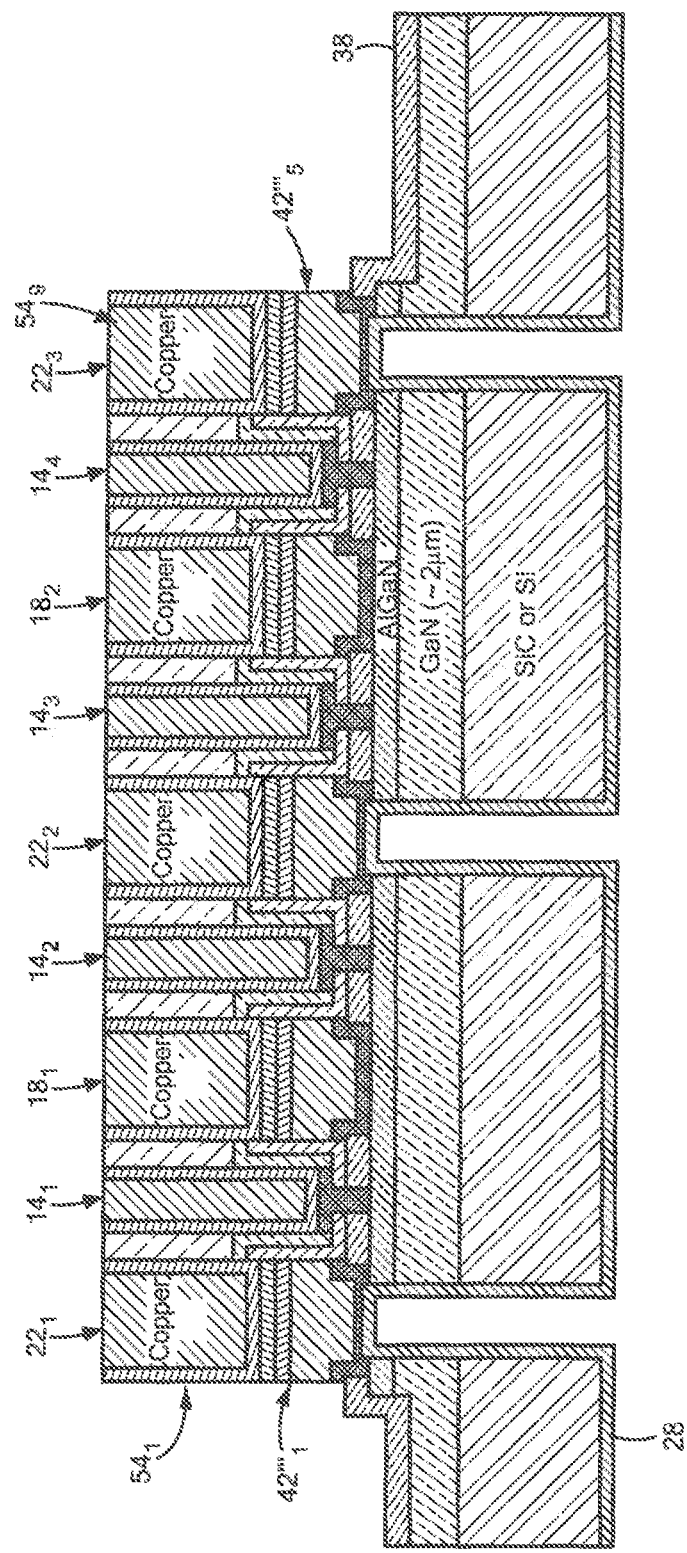

Referring now to FIG. 7G, a conductive layer 28 is formed over the bottom of the structure as described above in connection with FIG. 2U to electrically interconnect the source electrode structures $22_1$-$22_3$.

Figure 8A:
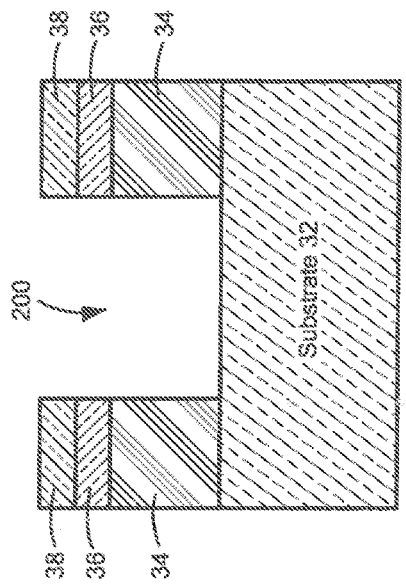
FIGS. 8A-8H are diagrammatical, cross-sectional sketches at various stages in the fabrication of a semiconductor structure according to another embodiment of the disclosure.
Figure 8B:
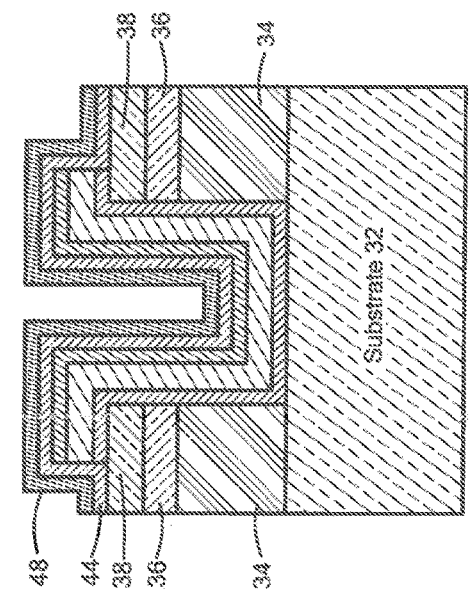

Referring now to FIGS. 8A-8F another embodiment is shown for forming an Ohmic contact to one of the source electrode structures and the connection of the source electrode structure to back-side metallization conductive layer 28. Thus, after forming the dielectric layer 38 on the upper surface of the AlGaN layer 36, as shown in FIG. 8A, a window 200 is formed through the dielectric layer 38, underlying portions of AlGaN layer 36, and GaN layer 34 to the surface of the substrate 32, as shown in FIG. 8B, here using conventional lithography and dry etch processes, here for example the chlorine-based etchants $BCl_3$ and $Cl_2$.

Figure 8C:
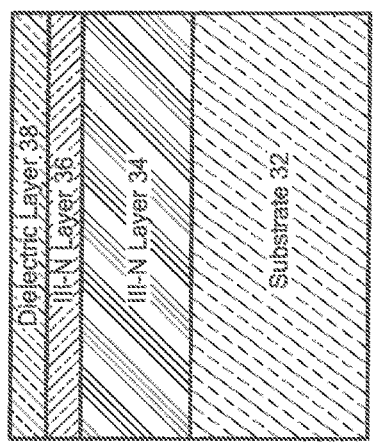
Figure 8D:
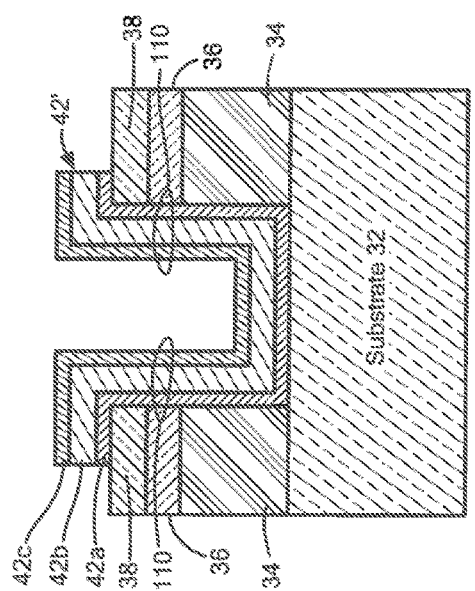

Next, referring to FIG. 8C, the electrical contact structure 42' having layers 42a, 42b and 42c of the Ohmic contact structure $42_{OC}$ are sequentially deposited and patterned as shown using conventional lithographic-etching process as described above in connection with FIG. 2D, the Ohmic contact structure $42_{OC}$ having: a bottom layer 42a of titanium (Ti) or tantalum (Ta); a layer 42b for example, aluminum or Si doped aluminum $Al_{1-x}Si_x$ (where the Si doping, x, is typically ≤0.05) on the layer 42a; and a layer 42c, for example tantalum (Ta) or a metal nitride, here for example titanium nitride (TiN). Next, the anneal processes described above is used to form Ohmic contact regions 110 (FIG. 8C between the Ohmic contact structure $42_{OC}$ and sidewalls of the AlGaN layer 36. Next, the dielectric layers 44 and 48 are formed as shown in FIG. 8D, as described above in connection with FIGS. 2F through 2H.

Figure 8E:
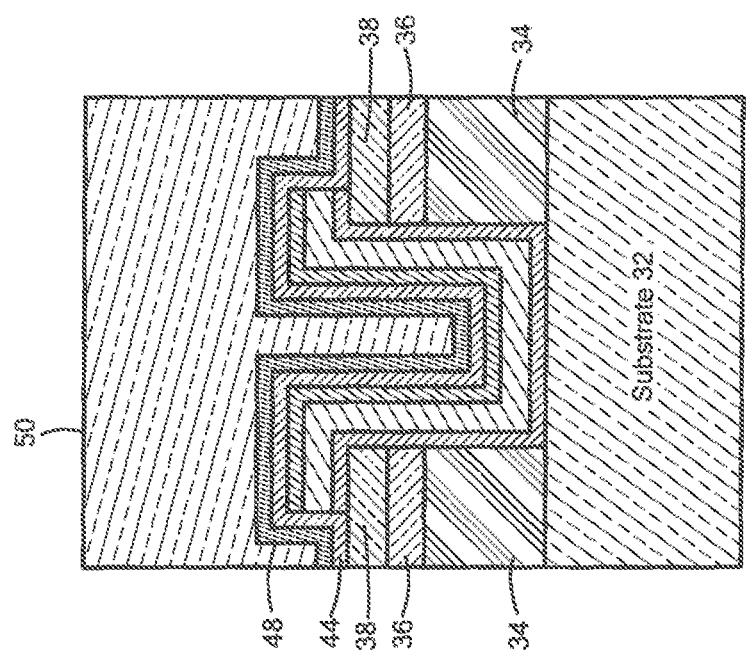
Figure 8F:
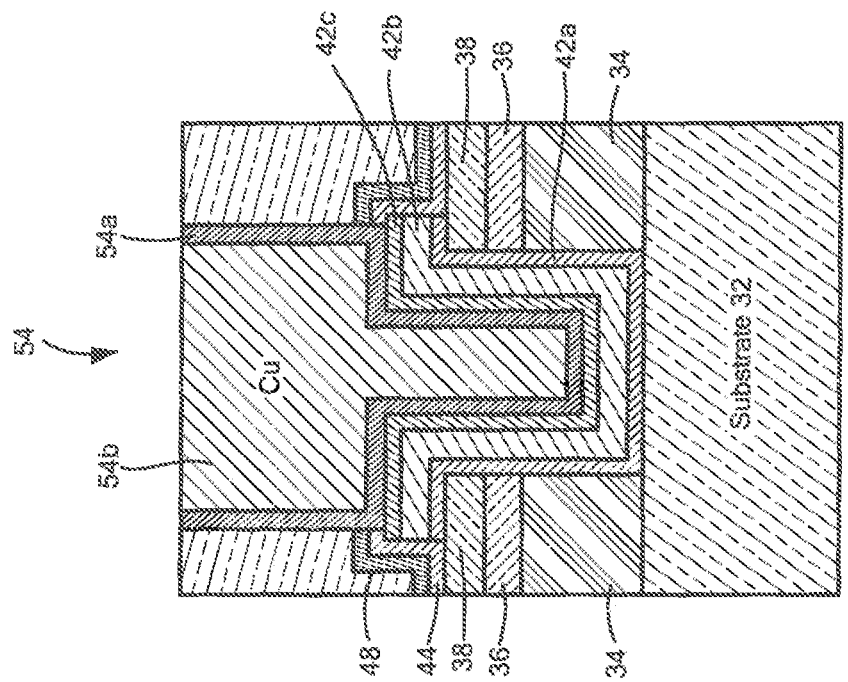

Next, the Damascene process begins by depositing the dielectric layer 50 as described above in connection with FIG. 2I, as shown in FIG. 8E, followed by the formation of the electrical interconnect including, in this example the upper layer 54b of copper having the bottom and sides lined with an adhesion and copper diffusion barrier layer 54a, here for example, tantalum or tantalum nitride or a combination thereof as described above in connection with FIGS. 2I-2L, resulting in an exemplary one of the above described Damascene electrode contacts $54_1$-$54_{11}$, here indicated without a subscript as 54, as shown in FIG. 8F.

The processing continues as described above in connection with FIGS. 2M-2R after which the back-side processing begins as described above in connection with FIGS. 6A-6D. More particularly, the wafer is mounted face down on a temporary carrier, not shown, the wafer is thinned, here for example to 50 or 100 microns. The exposed bottom surface of such structure is masked to expose portions of the bottom of the substrate 32 under the source electrode structure. Next, vias 90 are etched using a dry fluorine-based etch, here for example SF6 to etch the vias 90 through the substrate layer 32 and through the bottom layer 42a of Ti or Ta and then stopping at the aluminum-based layer 42b whose fluorine-based etch byproducts are non-volatile. Thus, here there is no additional (separate) etch stop layer $42_{ES}$; rather layer 42b functions as an etch stop layer, as shown in FIG. 8G.

Figure 8H:
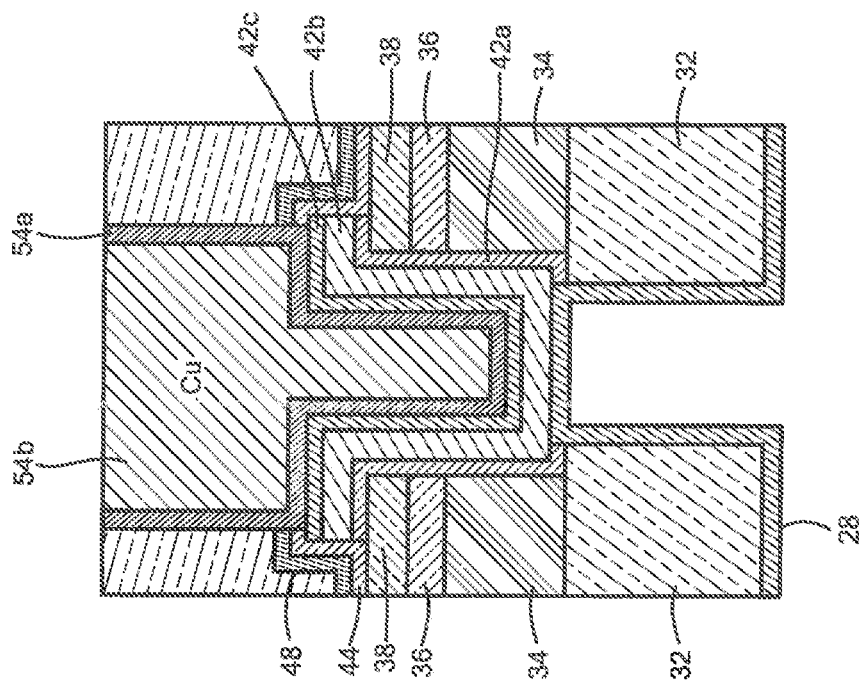
Figure 8G:
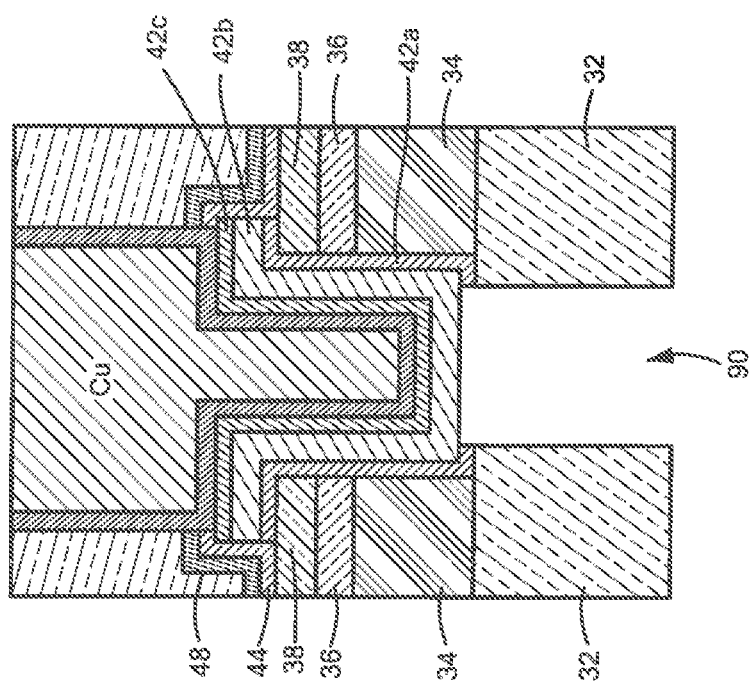

Next, referring to FIG. 8H, the bottom of the structure of FIG. 8G has a conductive layer 28 in electrical connection with the layer 42b of the electrical contact structure 42', as described above in connection with FIGS. 2S-2U.

Referring now to FIGS. 9A-9E, another embodiment is shown. Here, after forming the dielectric layer 38 on the upper surface of the AlGaN layer 36, as shown in FIG. 9A, the window 200 is formed through the dielectric layer 38, underlying portions of AlGaN layer 36, and GaN layer 34 to the surface of the substrate 32, as shown in FIG. 9B, here using conventional lithography and dry etch processes, here for example the chlorine-based etchants $BCl_3$ and $Cl_2$.

Next, the window 202 is etched with a fluorine-based dry etchant that laterally etches dielectric layer 38 (as shown in FIG. 9C) to expose a surface portion of Group III-N semiconductor layer 36 around the edge of the window 200 (as shown in FIG. 9B).

Next, as shown in FIGS. 9D and 9E, layers 42a, 42b, 44 and 48 are formed as described in connection with FIGS. 8C and 8D after which the process continues as described above in connection with FIGS. 8E and 8F.

A number of embodiments of the disclosure have been described. Nevertheless, it will be understood that various modifications may be made without departing from the spirit and scope of the disclosure. For example, the metal to semiconductor Ohmic contact structure $42_{OC}'$ may comprise a two or more layer stack of Al with Ta, Ti, TiN, Pt, Ni, Si, AlSi, W, or Mo such as Ta/Al, Ti/Al, Ta/Al/Ta, Ta/$Al_{1-x}Si_x$/Ta, Ta/Al/TiN Ta/Al/Ni, Ta/Al/Ni, Ta/Al, Ti/Al, Ti/Al/W, Ti/Al/Mo, Ti/Al/Pt. Furthermore, the structure shown in FIG. 2J may be removed from gold-free fabrication area prior to forming the electrode contacts 54 in which case the electrode contacts 54 may be gold.

Accordingly, other embodiments are within the scope of the following claims.

What is claimed is:

1. A semiconductor structure, comprising:
   a substrate;
   a Group III-N semiconductor structure disposed on the substrate;
   a multi-layer, electrical contact structure in contact with the Group III-N semiconductor structure, the electrical contact structure comprising:
      a gold-free contact layer in contact with the Group III-N semiconductor structure;
      a gold-free electrically conductive etch stop layer disposed on with the gold-free contact layer and electrically connected to the gold-free contact layer; and,
      a gold-free electrode contact in electrical contact with the gold-free electrically conductive etch stop layer;
   an electrically conductive via passing through the substrate to gold-free electrically conductive etch stop layer, the gold-free electrically conductive etch stop layer having: a bottom surface in direct contact with an upper surface of the electrically conductive via; and an upper surface in direct contact with the gold-free electrode contact.

2. The semiconductor structure recited in claim 1 wherein an inner portion of the bottom surface of the gold-free electrically conductive etch stop layer is in contact with the electrically conductive via and an outer portion of the bottom surface of the gold-free electrically conductive etch stop is in contact with an outer portion of the gold-free contact layer.

3. The semiconductor structure recited in claim 1 wherein the gold-free contact layer comprises a metal silicide, the metal silicide being in Ohmic contact with the Group III-N semiconductor layer; and wherein the metal silicide is doped.

4. The semiconductor structure recited in claim 3 where the metal silicide is with Phosphorus (P), Arsenic (As), Antimony (Sb) or a combination thereof.

* * * * *